(12) United States Patent
Tokutomi et al.

(10) Patent No.: US 10,204,680 B2
(45) Date of Patent: Feb. 12, 2019

(54) SEMICONDUCTOR STORAGE DEVICE AND MEMORY SYSTEM

(71) Applicant: Toshiba Memory Corporation, Minato-ku (JP)

(72) Inventors: Tsukasa Tokutomi, Kamakura (JP); Masanobu Shirakawa, Chigasaki (JP); Marie Takada, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/697,737

(22) Filed: Sep. 7, 2017

(65) Prior Publication Data

US 2018/0190348 A1 Jul. 5, 2018

(30) Foreign Application Priority Data

Jan. 5, 2017 (JP) .................................. 2017-000697

(51) Int. Cl.
| | |
|---|---|
| *G11C 16/04* | (2006.01) |
| *G11C 11/56* | (2006.01) |
| *G11C 16/26* | (2006.01) |
| *H01L 27/11582* | (2017.01) |
| *G11C 16/30* | (2006.01) |
| *H01L 27/1157* | (2017.01) |
| *G11C 16/08* | (2006.01) |

(52) U.S. Cl.
CPC ...... *G11C 11/5642* (2013.01); *G11C 16/0483* (2013.01); *G11C 16/26* (2013.01); *G11C 16/08* (2013.01); *G11C 16/30* (2013.01); *H01L 27/1157* (2013.01); *H01L 27/11582* (2013.01)

(58) Field of Classification Search
CPC . G11C 16/0483; G11C 11/5642; G11C 16/08; G11C 16/26; H01L 27/11578; H01L 27/11582
USPC ............. 365/185.17, 185.03, 185.23, 185.24
See application file for complete search history.

(56) References Cited

U.S. PATENT DOCUMENTS

| | | | |
|---|---|---|---|
| 2009/0267128 A1 | 10/2009 | Maejima | |
| 2009/0268522 A1 | 10/2009 | Maejima | |
| 2010/0207195 A1* | 8/2010 | Fukuzumi | .......... G11C 16/0483 257/326 |
| 2011/0284946 A1 | 11/2011 | Kiyotoshi | |

(Continued)

FOREIGN PATENT DOCUMENTS

| | | |
|---|---|---|
| JP | 2012-203957 | 10/2012 |
| JP | 2013-122804 | 6/2013 |
| JP | 2014-157650 | 8/2014 |

*Primary Examiner* — Gene Auduong
(74) *Attorney, Agent, or Firm* — Oblon, McClelland, Maier & Neustadt, L.L.P.

(57) ABSTRACT

According to an embodiment, a control circuitry performing: a first operation of reading data out of a memory cell with a first voltage applied to a word line while changing the first voltage by a first shift amount within a first range, and a second operation of reading data out of the memory cell with a second voltage applied to the word line while changing the second voltage by a second shift amount within a second range, wherein the second shift amount is smaller than the first shift amount, and wherein the control circuitry performs the second operation to apply the second voltage to the word line subsequently to application of the first voltage to the word line in the first operation.

19 Claims, 54 Drawing Sheets

(56) References Cited

U.S. PATENT DOCUMENTS

2013/0148436 A1* 6/2013 Kurosawa ............ G11C 16/26
                                                        365/185.24
2014/0233309 A1   8/2014 Shibata

* cited by examiner

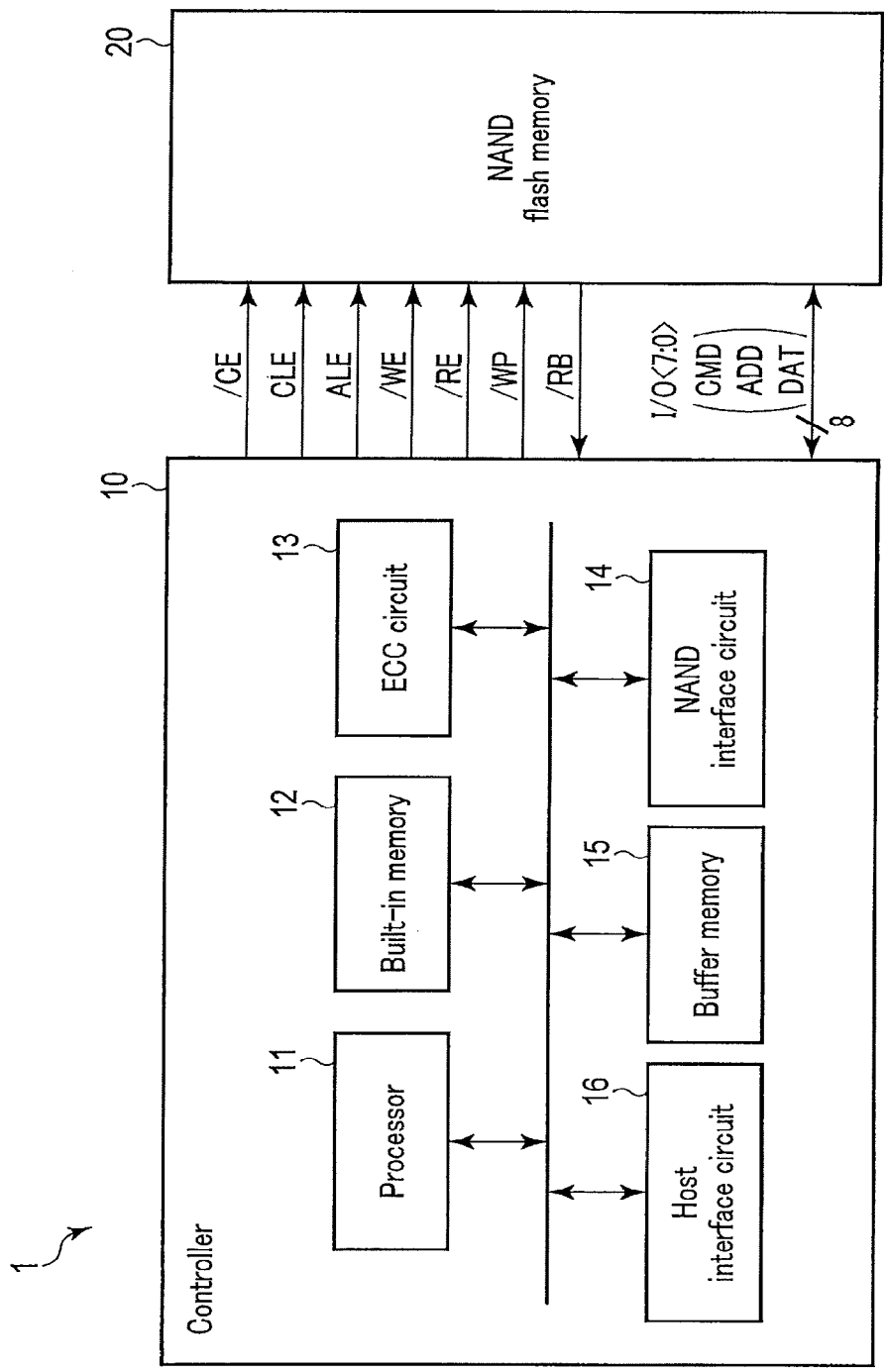
F I G. 1

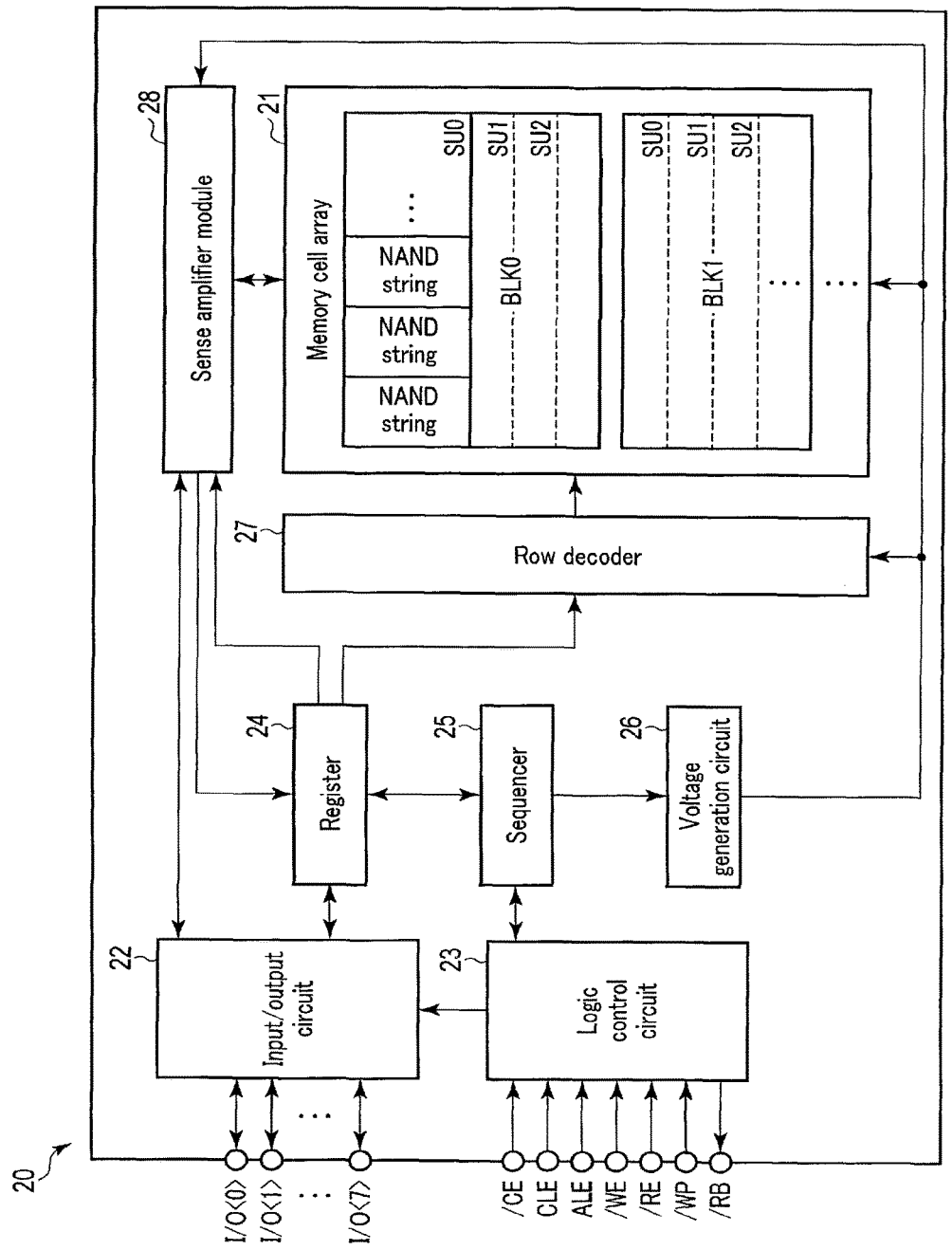
F I G. 2

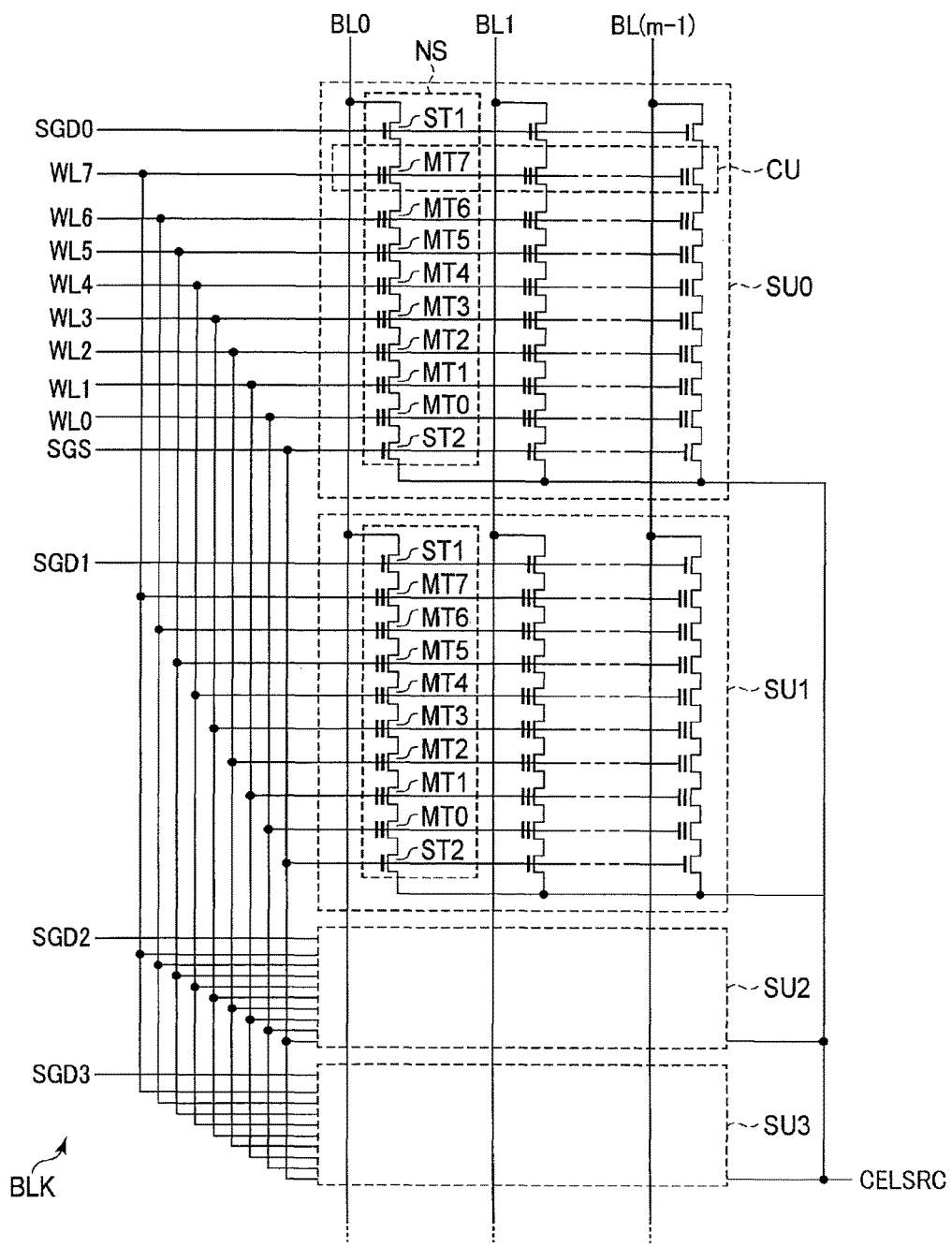
F I G. 3

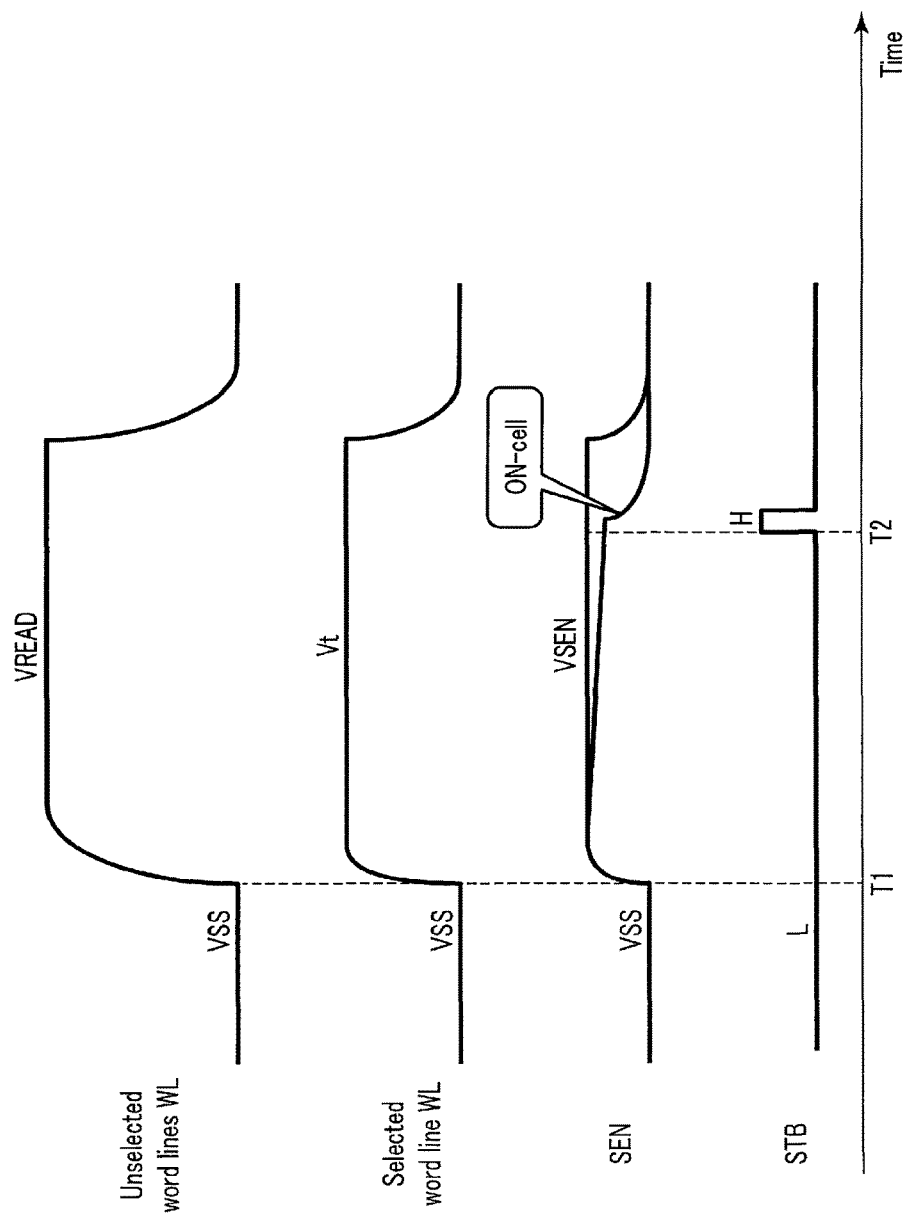
F I G. 7

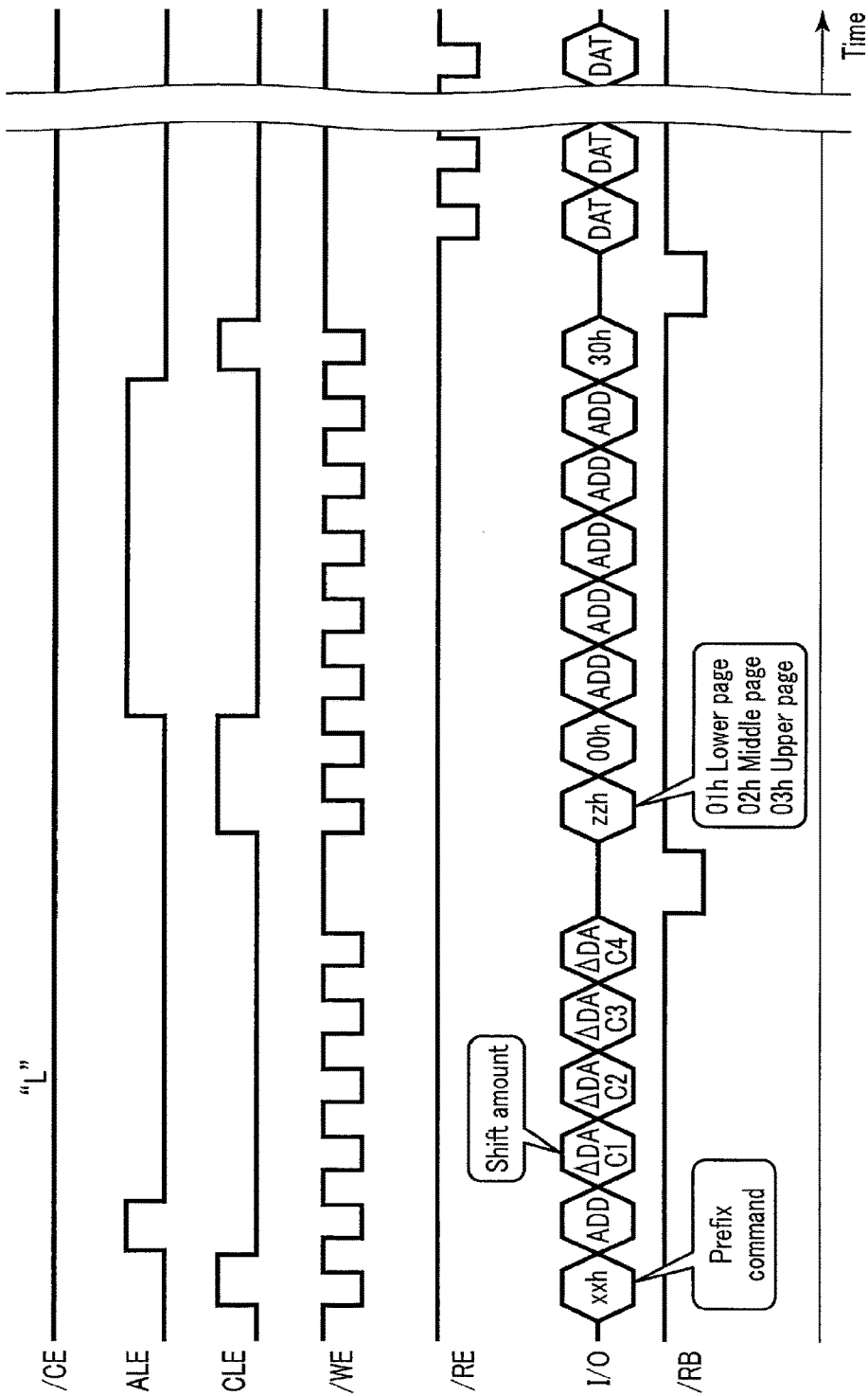
F I G. 10

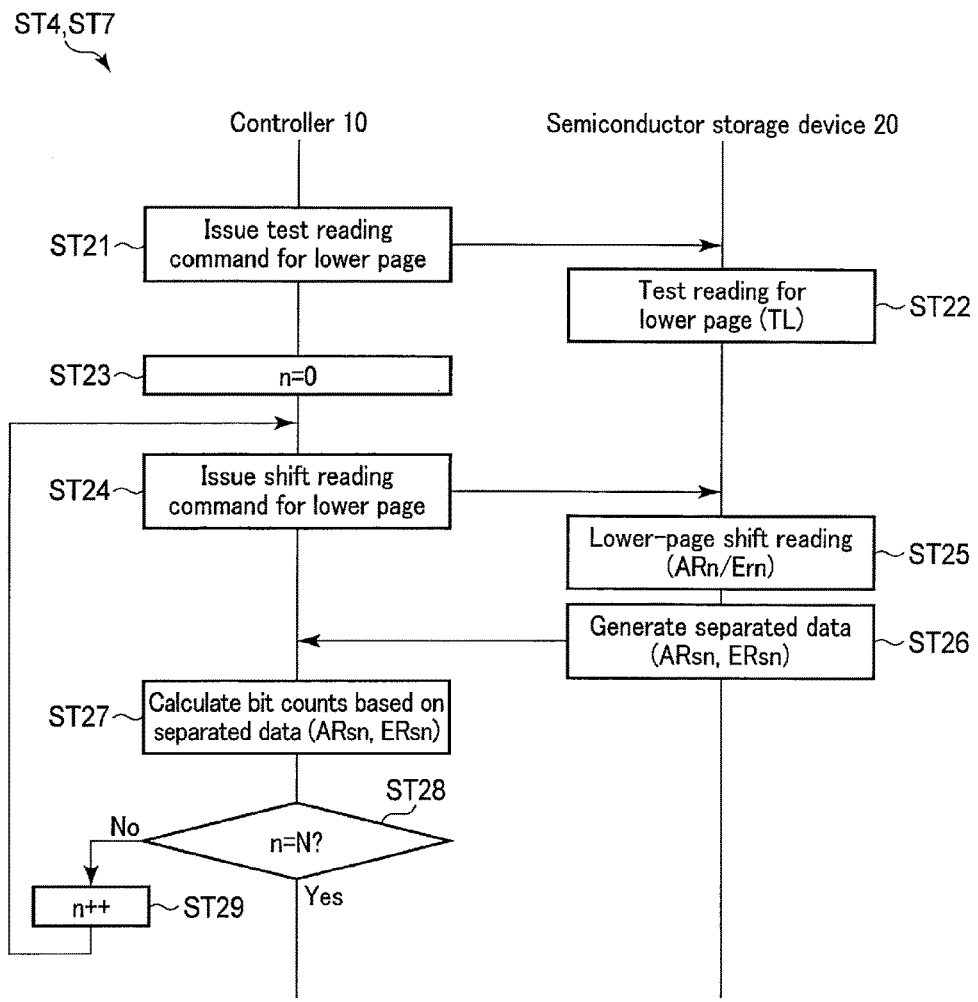
F I G. 13

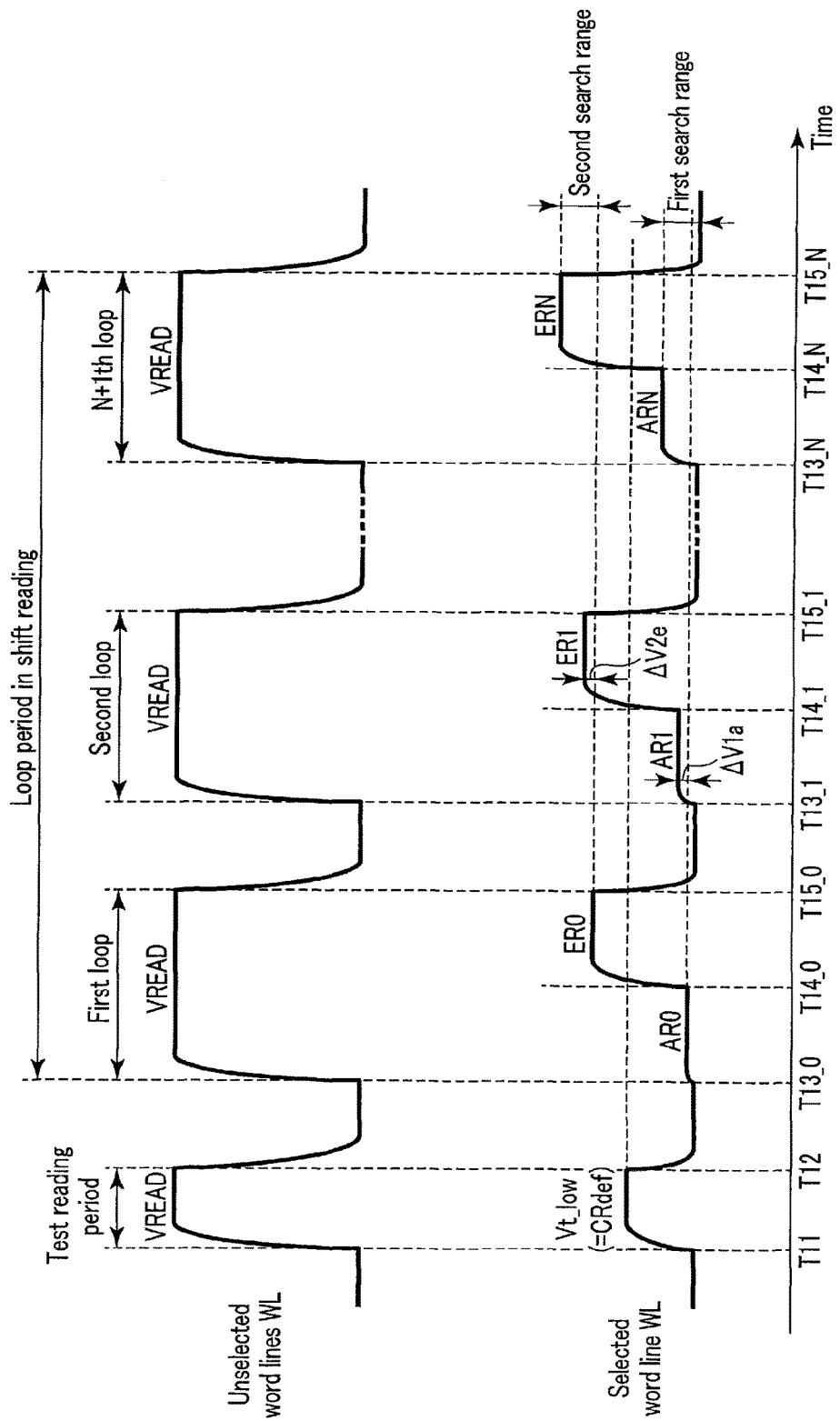
F I G. 14

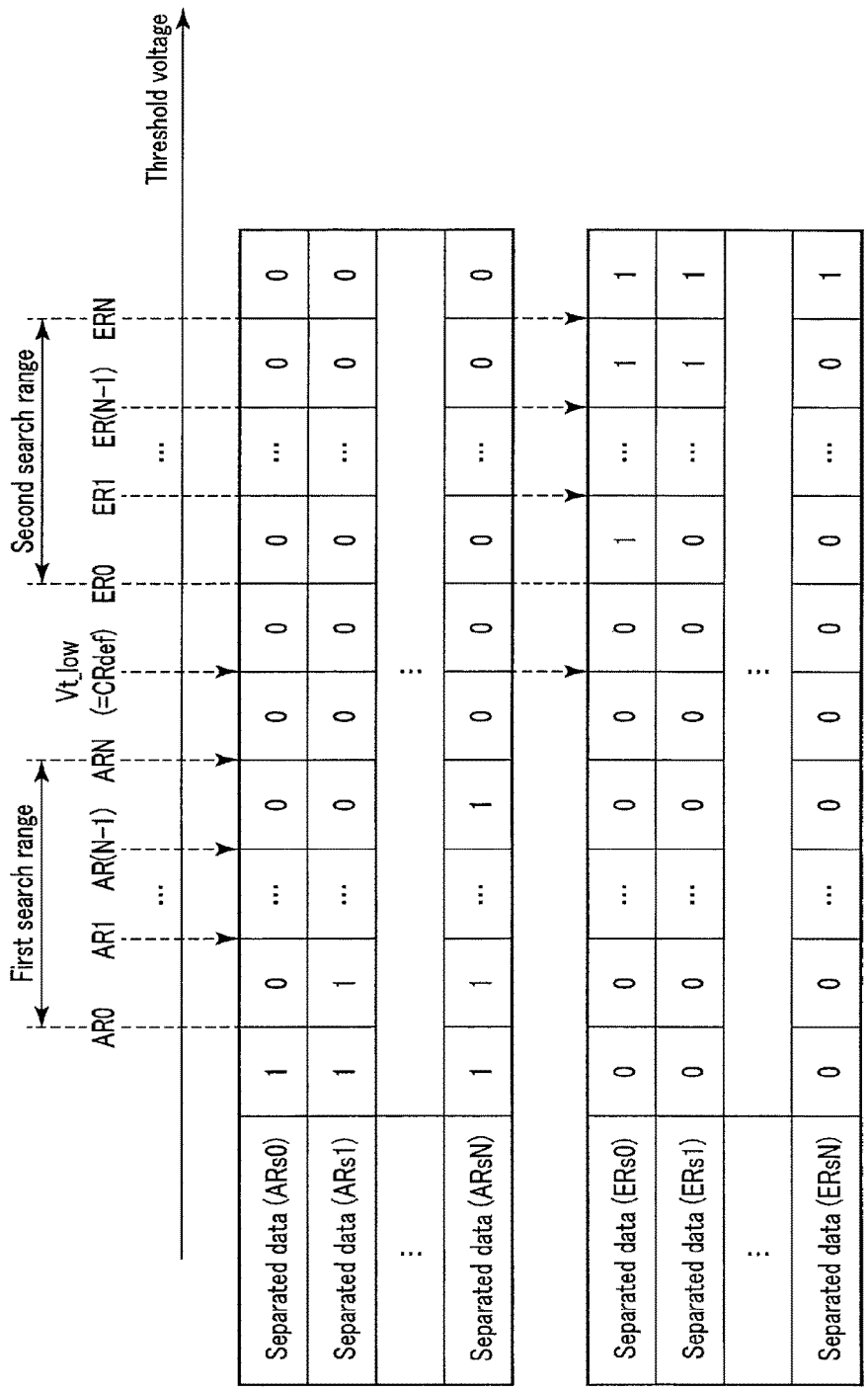
F I G. 16

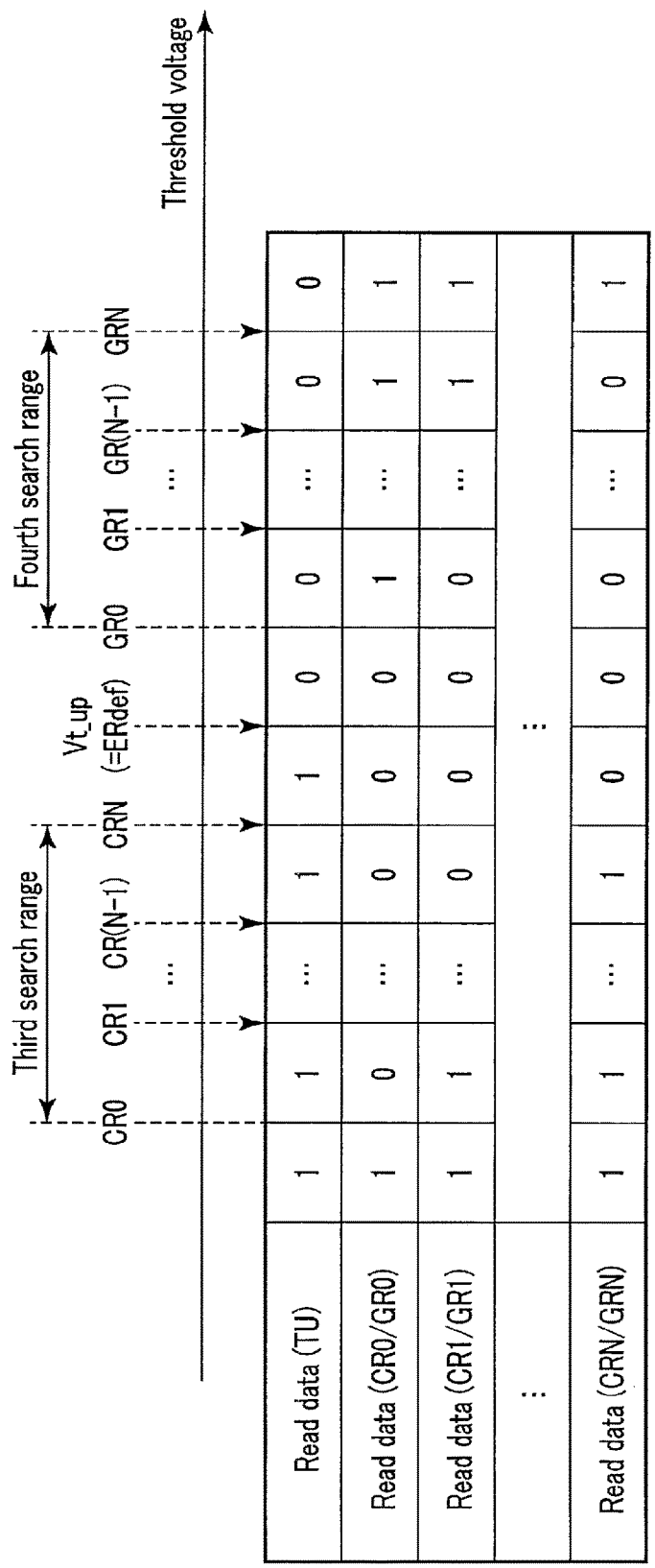
F I G. 19

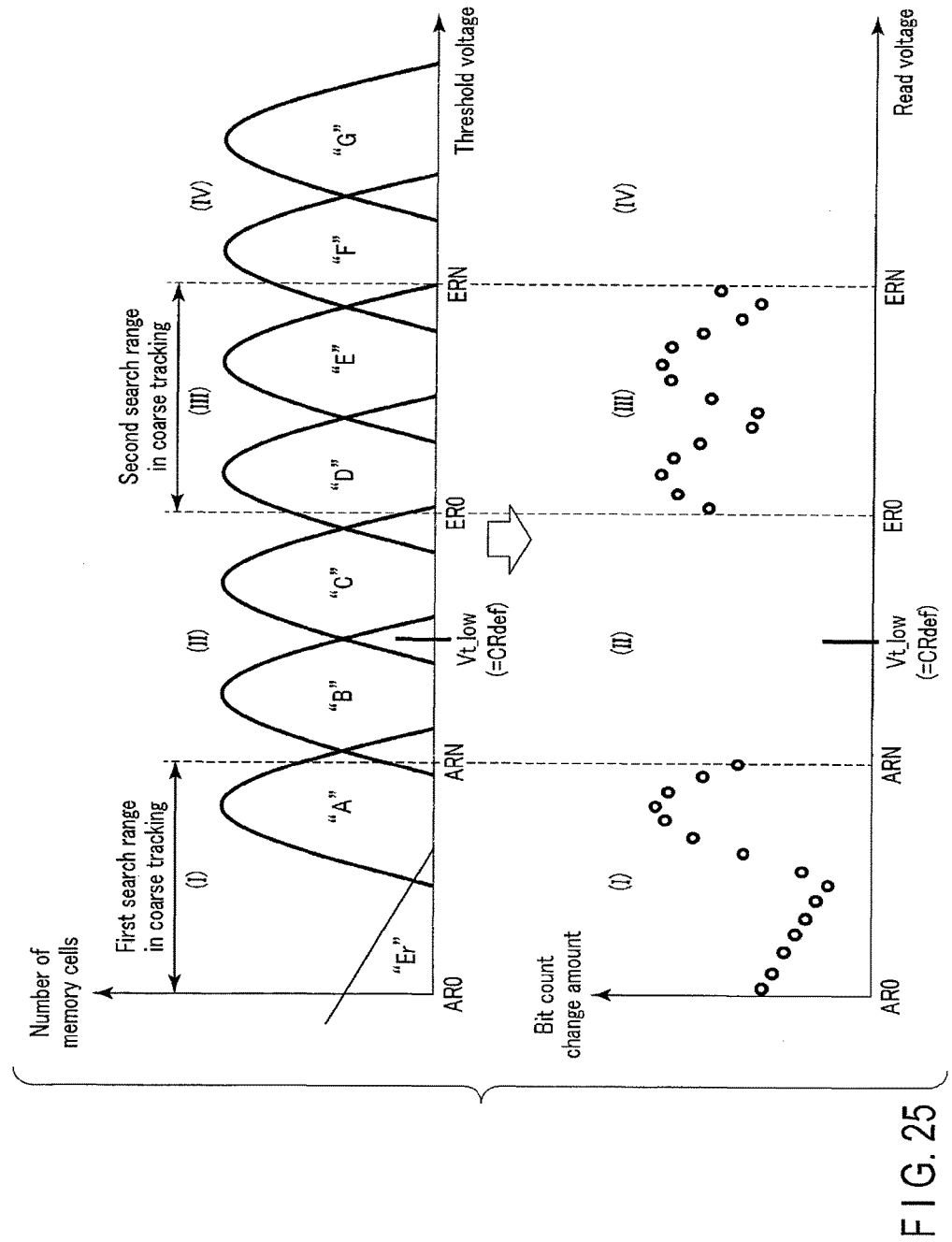
F I G. 25

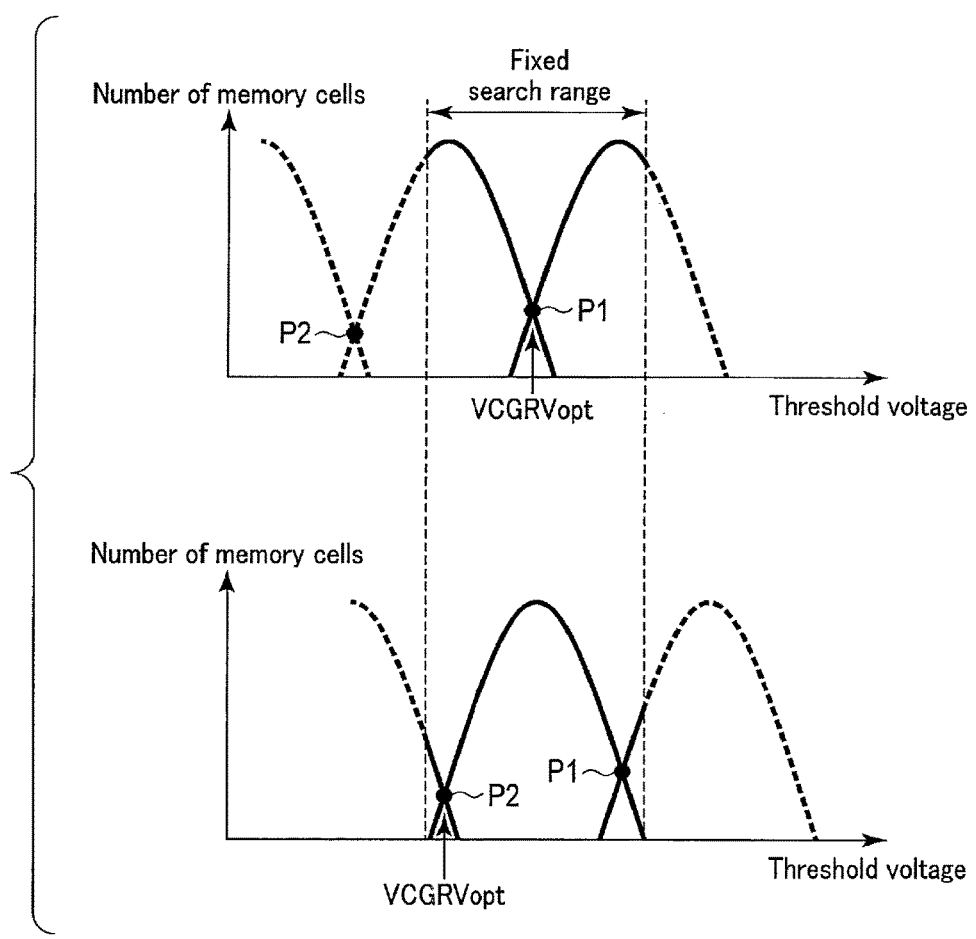
F I G. 29

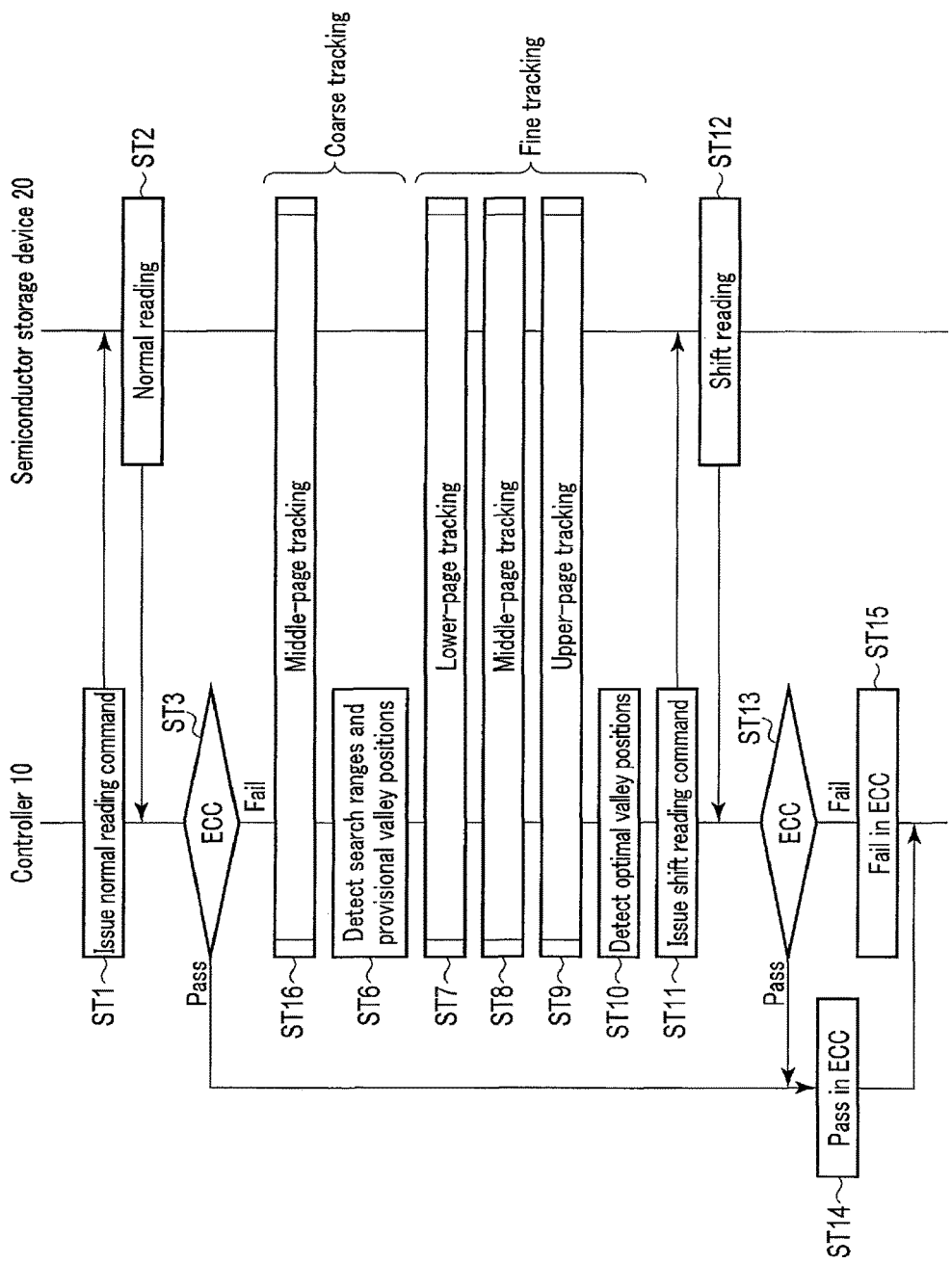
F I G. 30

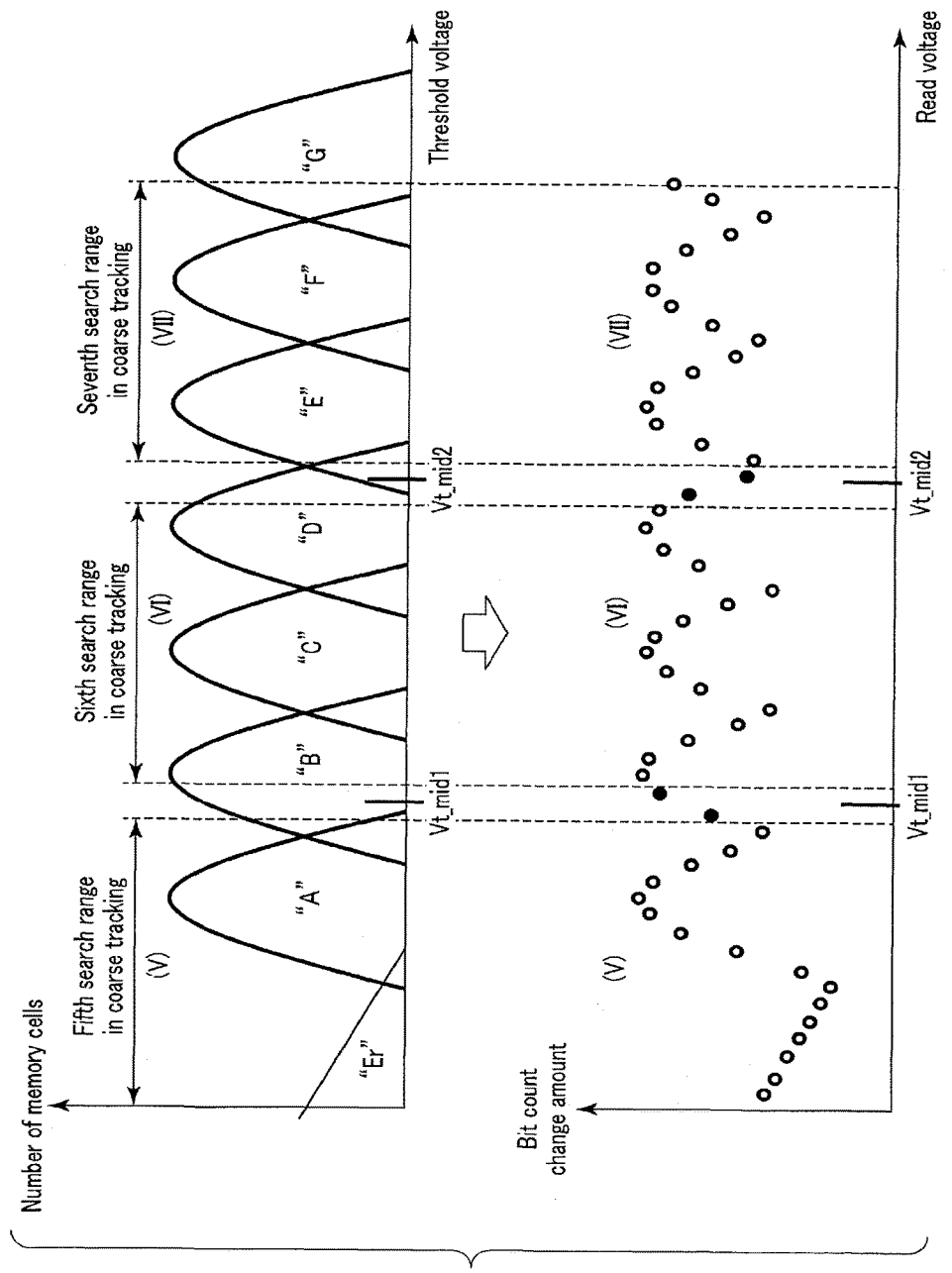
F I G. 33

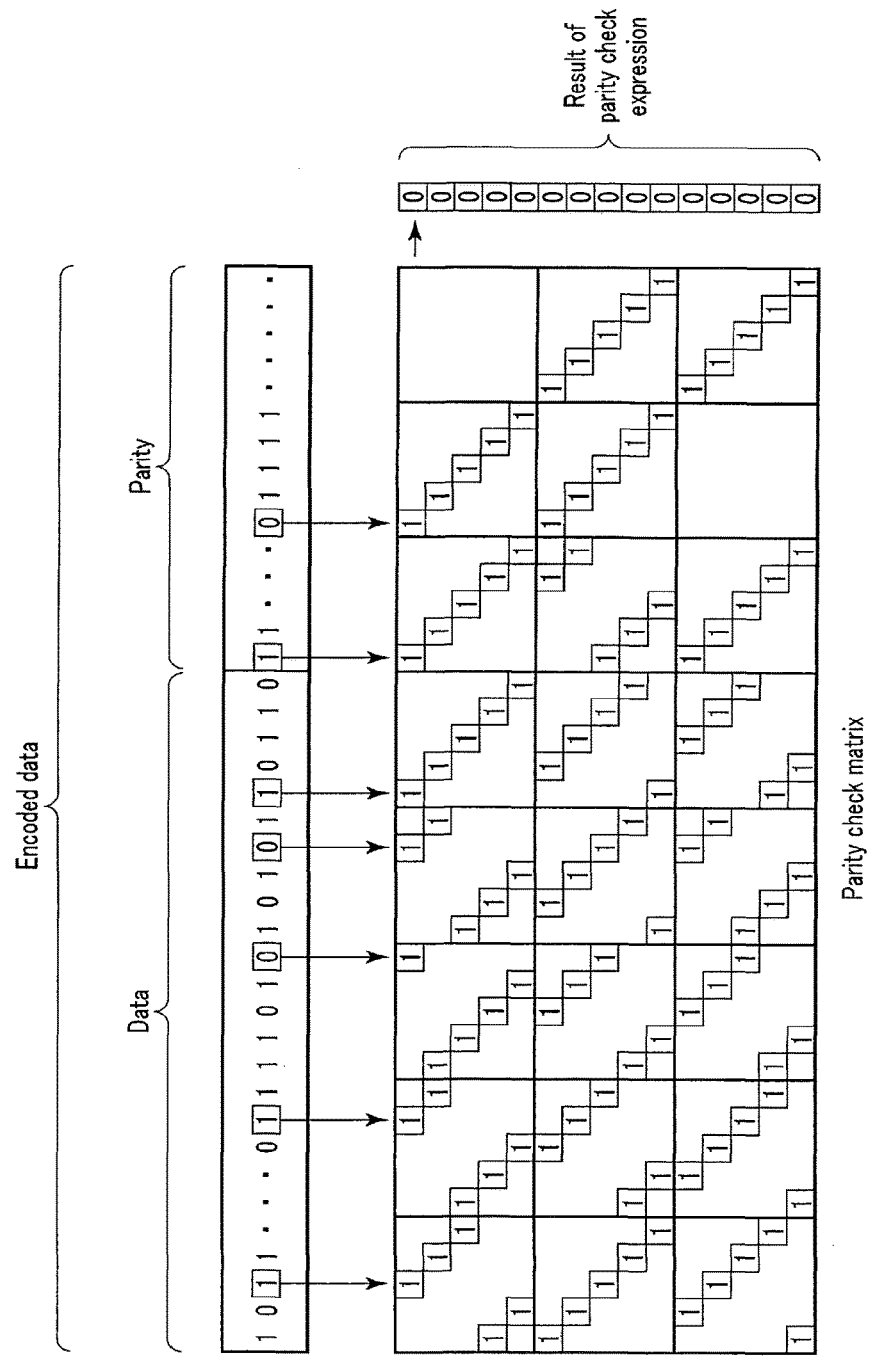
F I G. 34

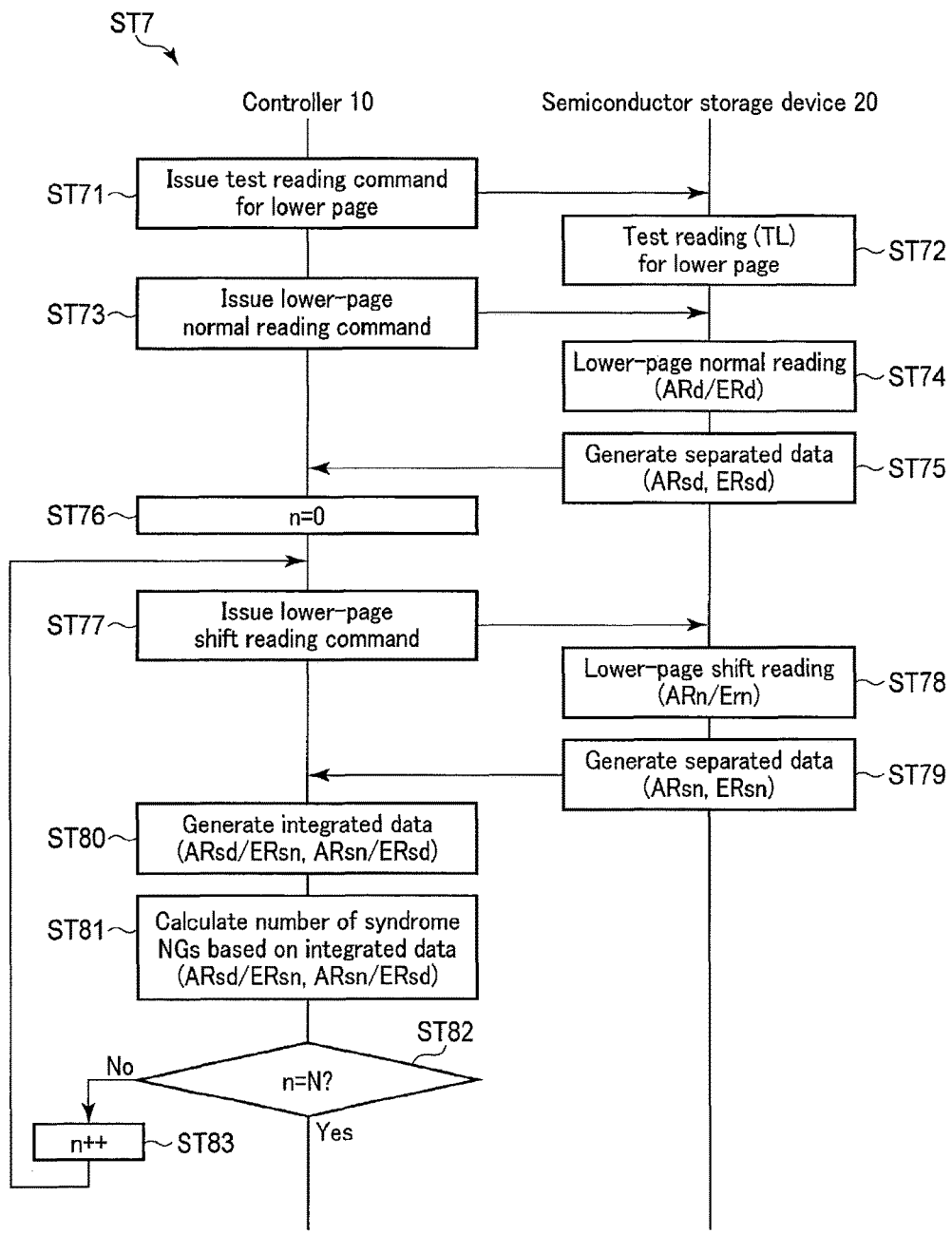
F I G. 35

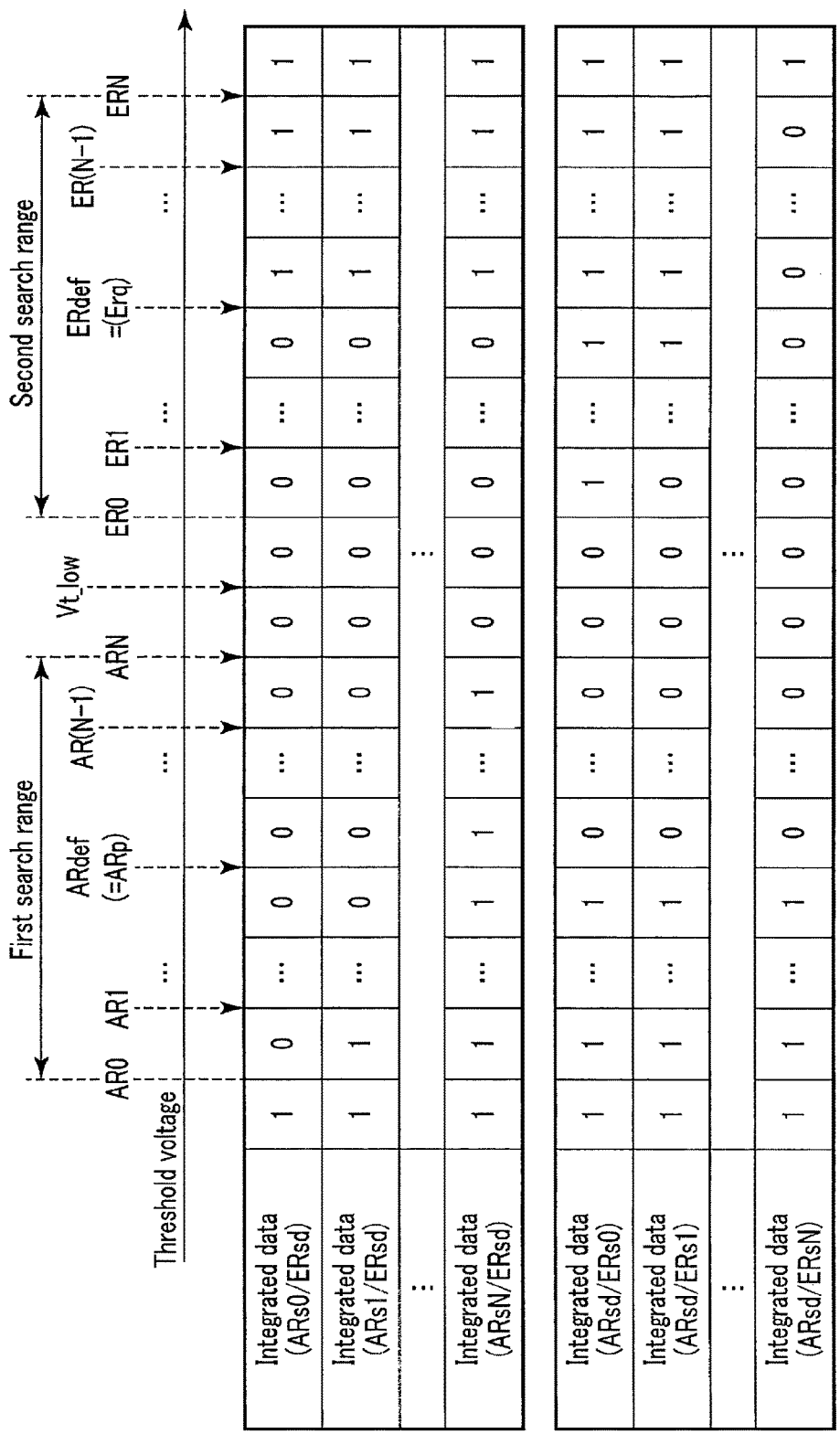
F I G. 38

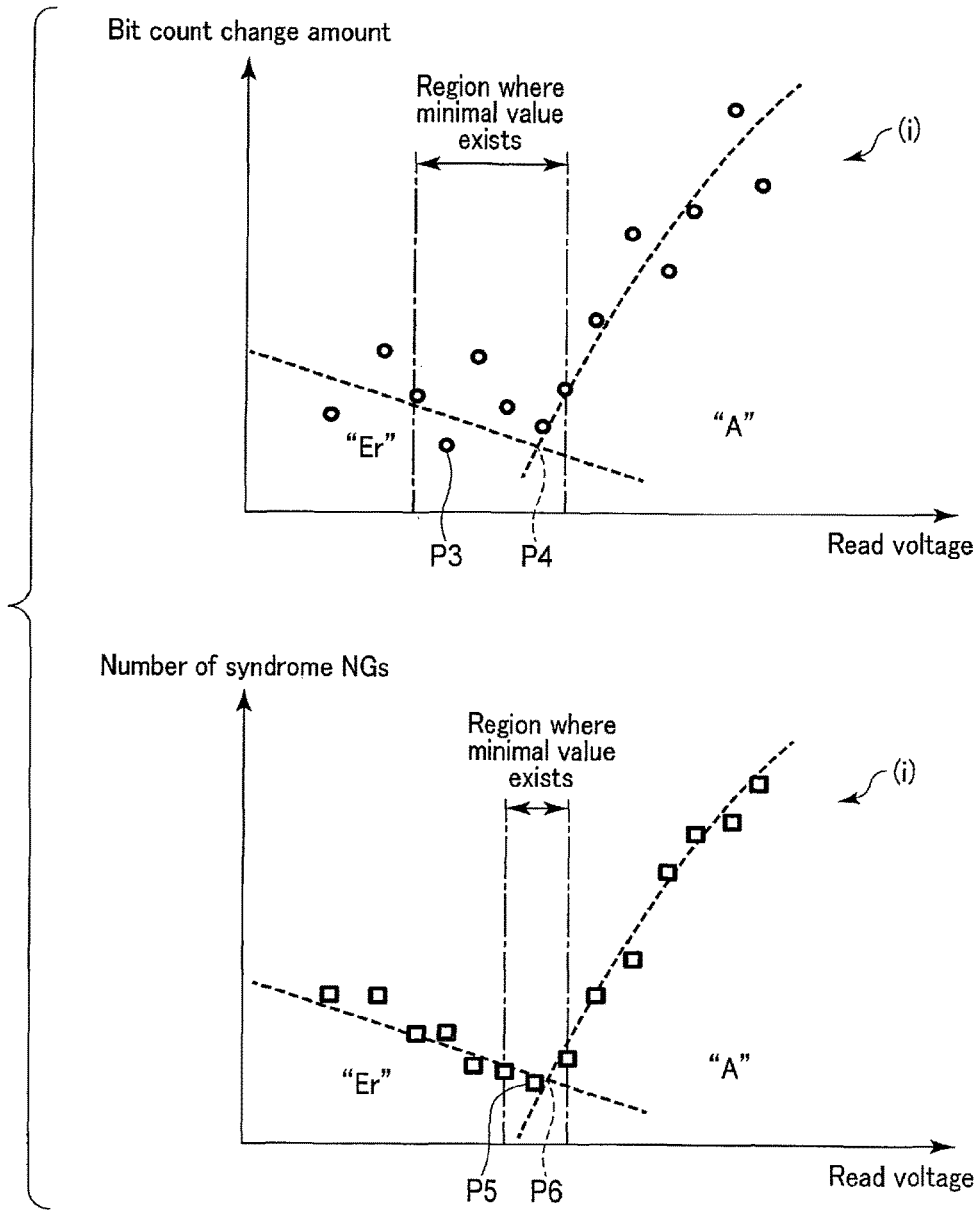
F I G. 39

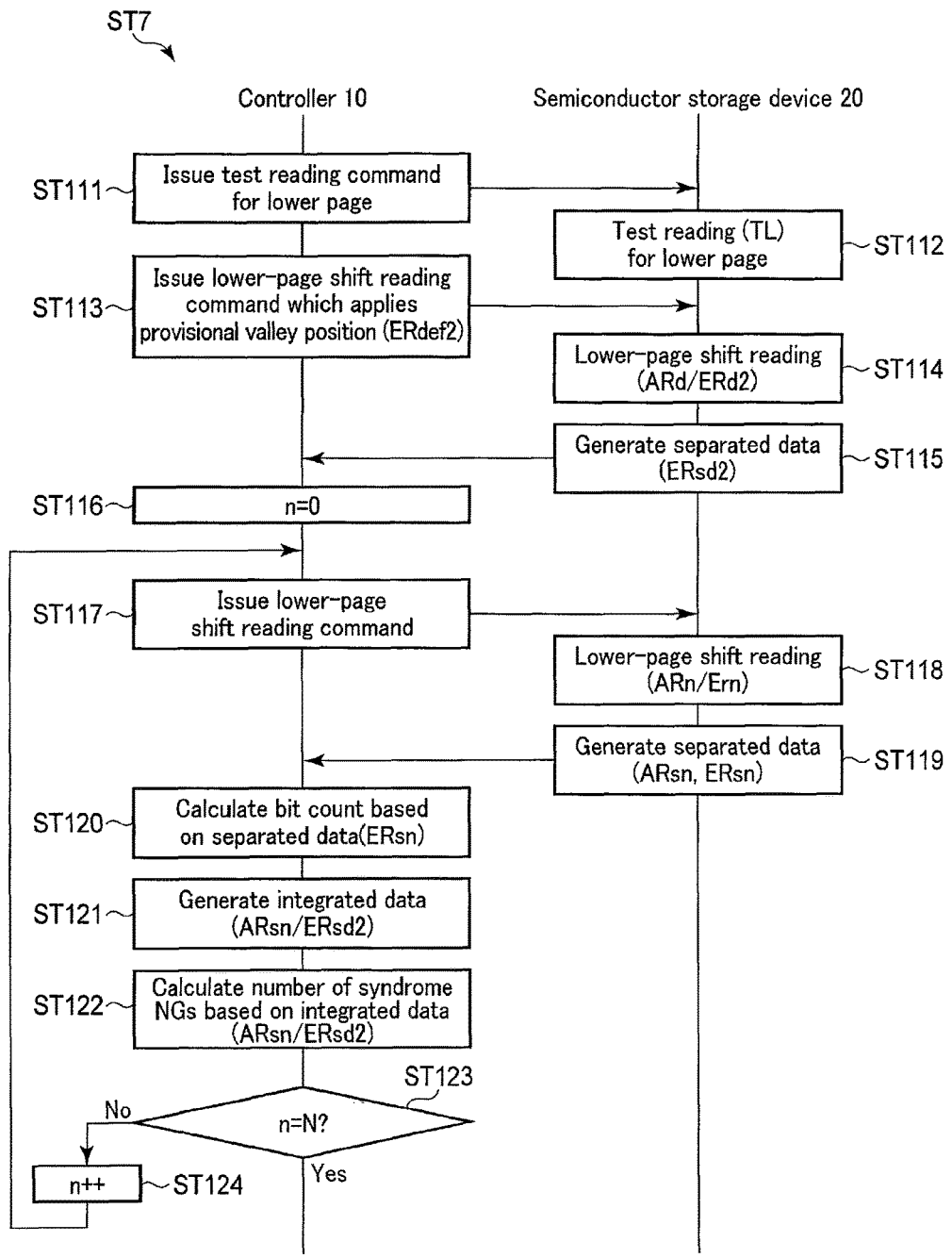
F I G. 42

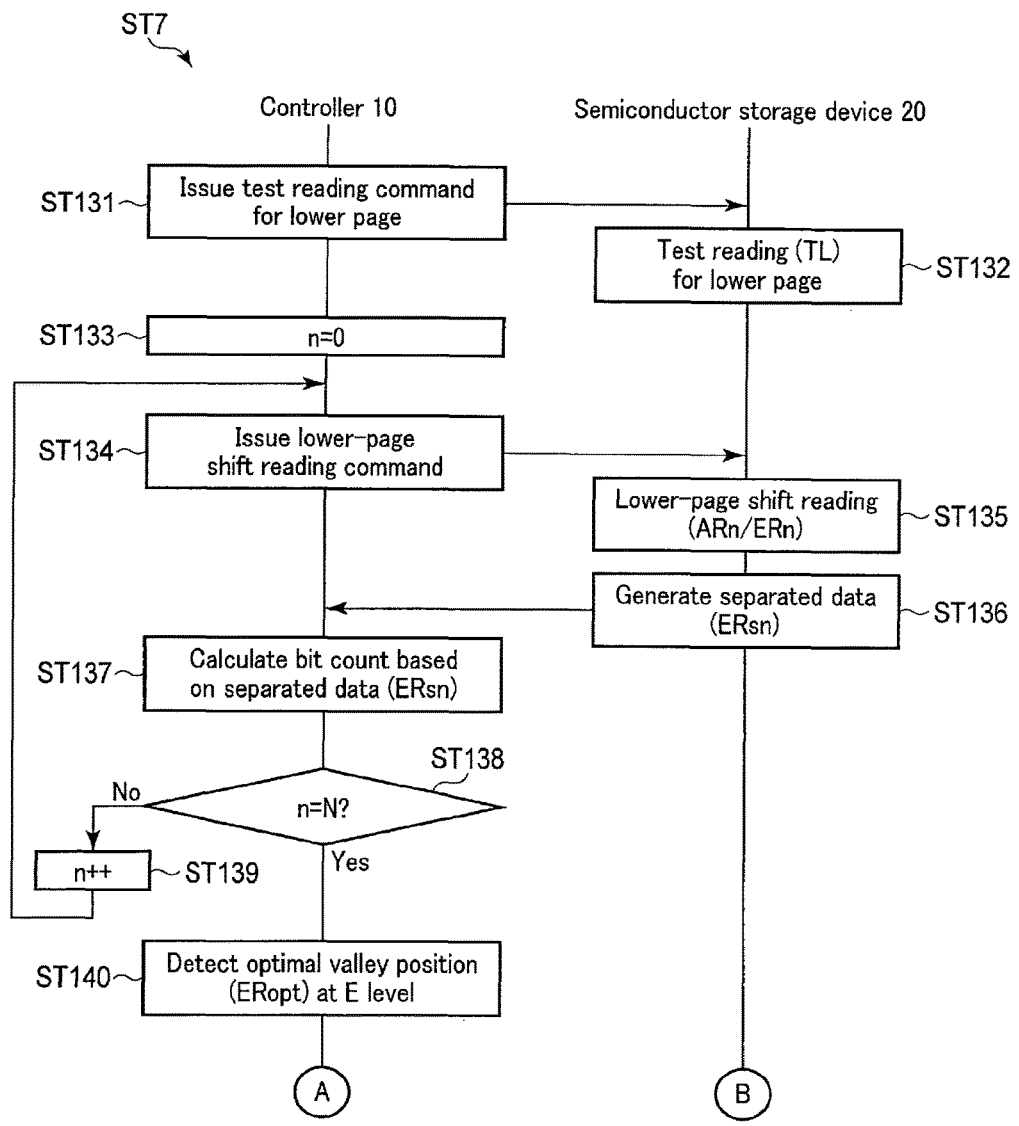
F I G. 44

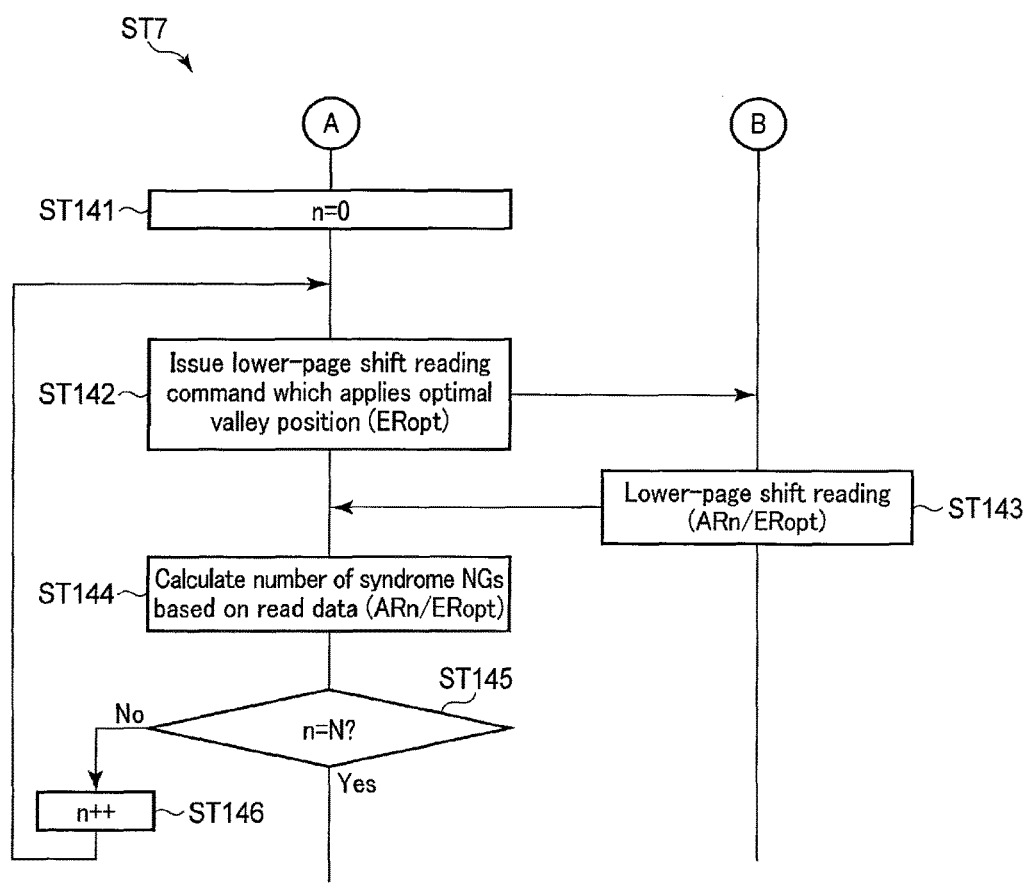
F I G. 45

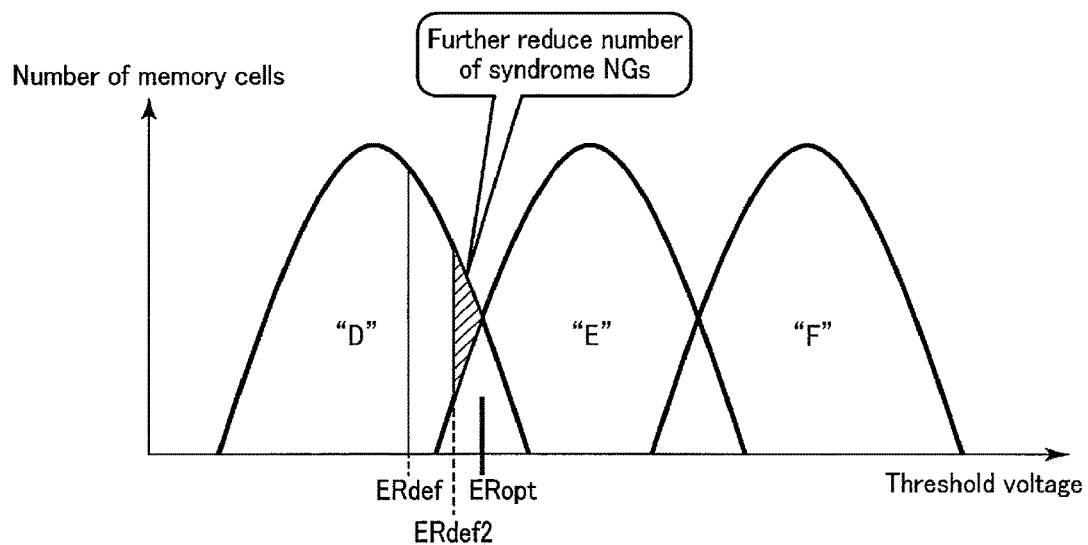
F I G. 46

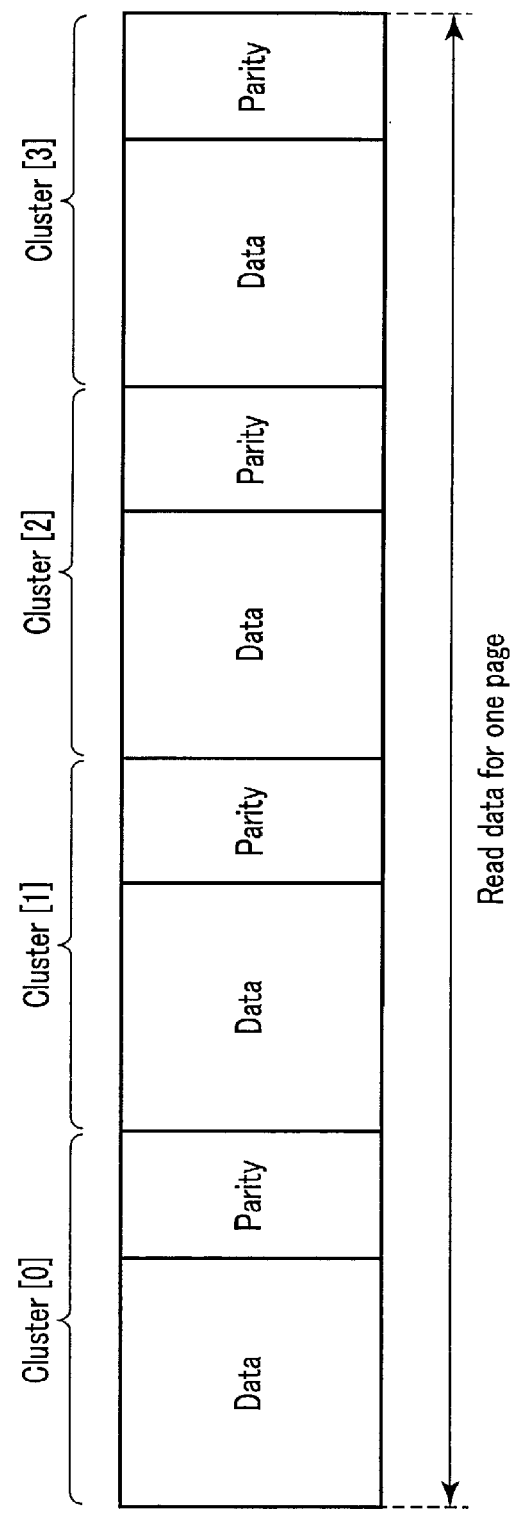
F I G. 49

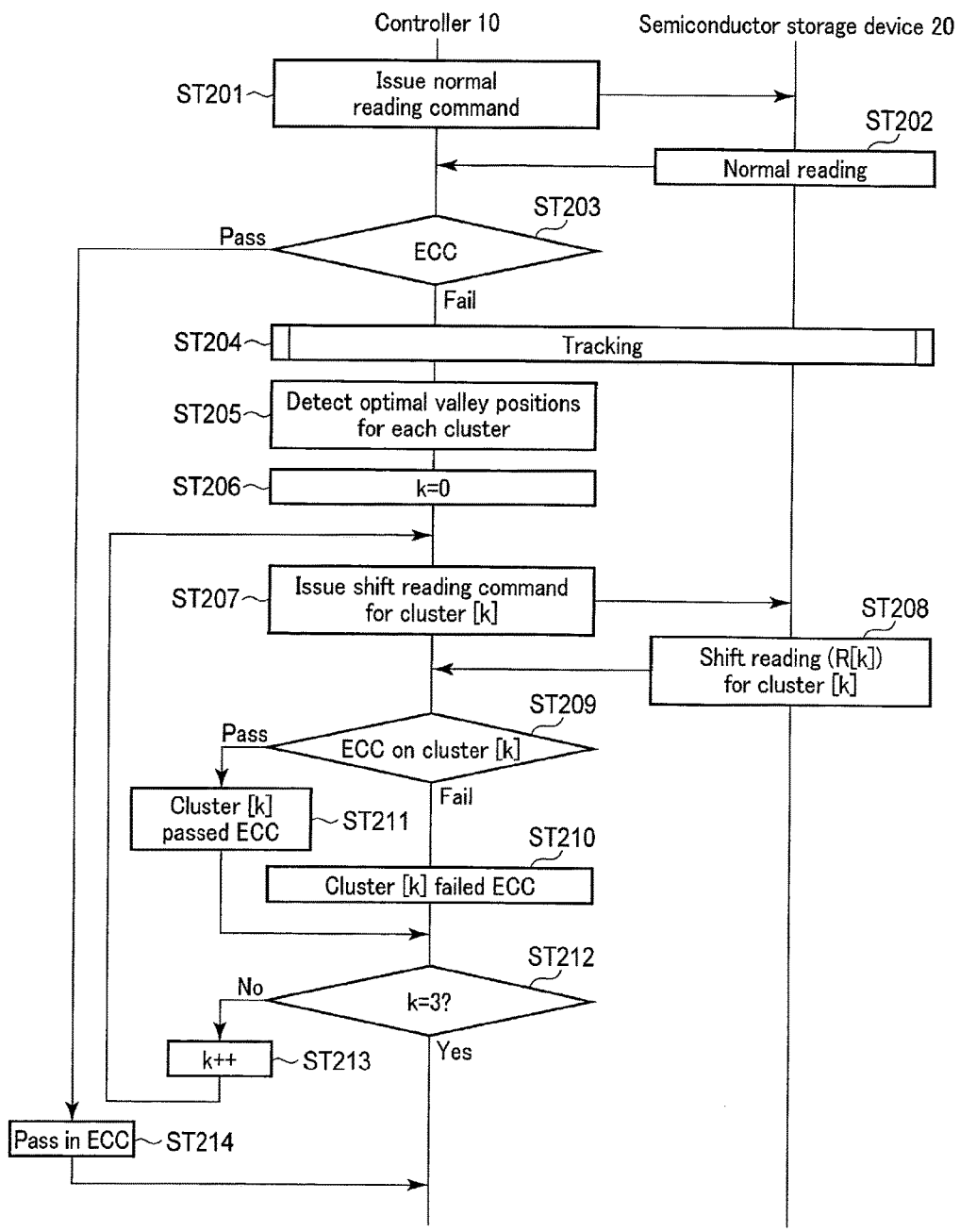
F I G. 50

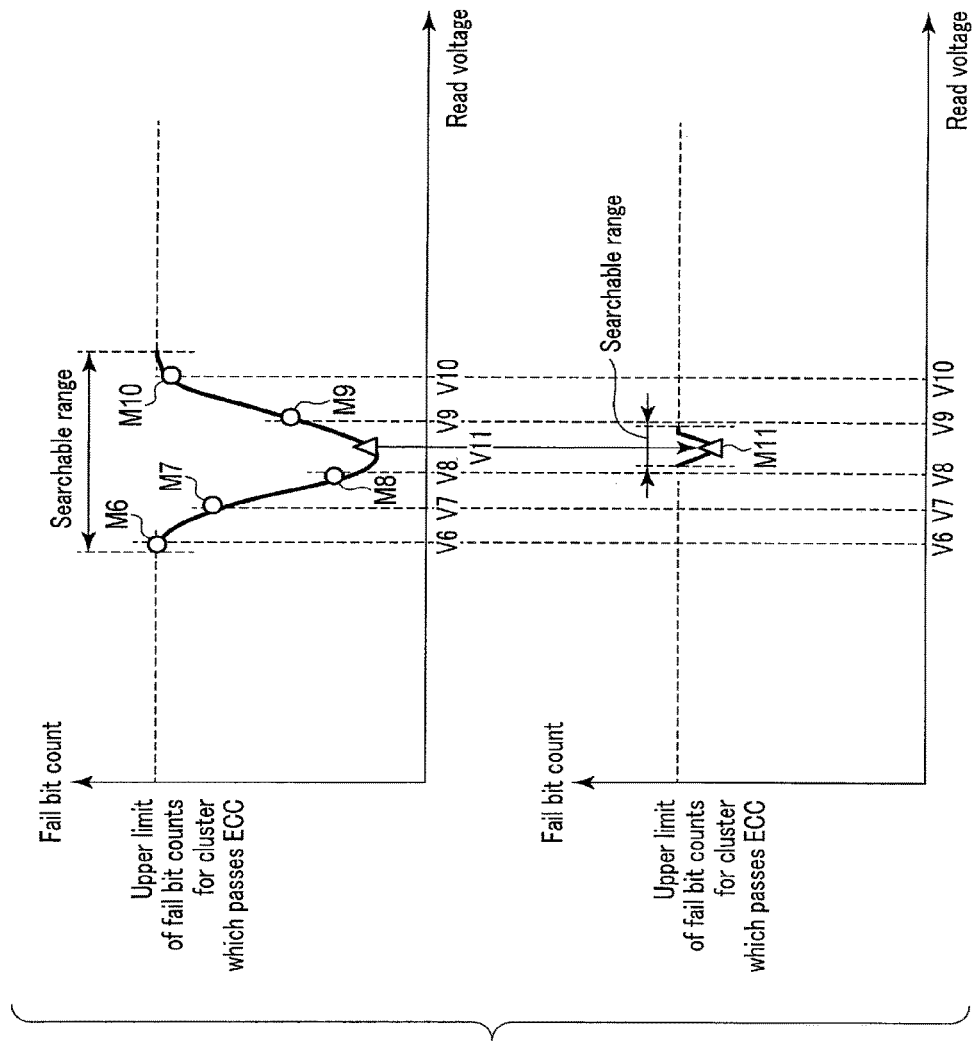
F I G. 52

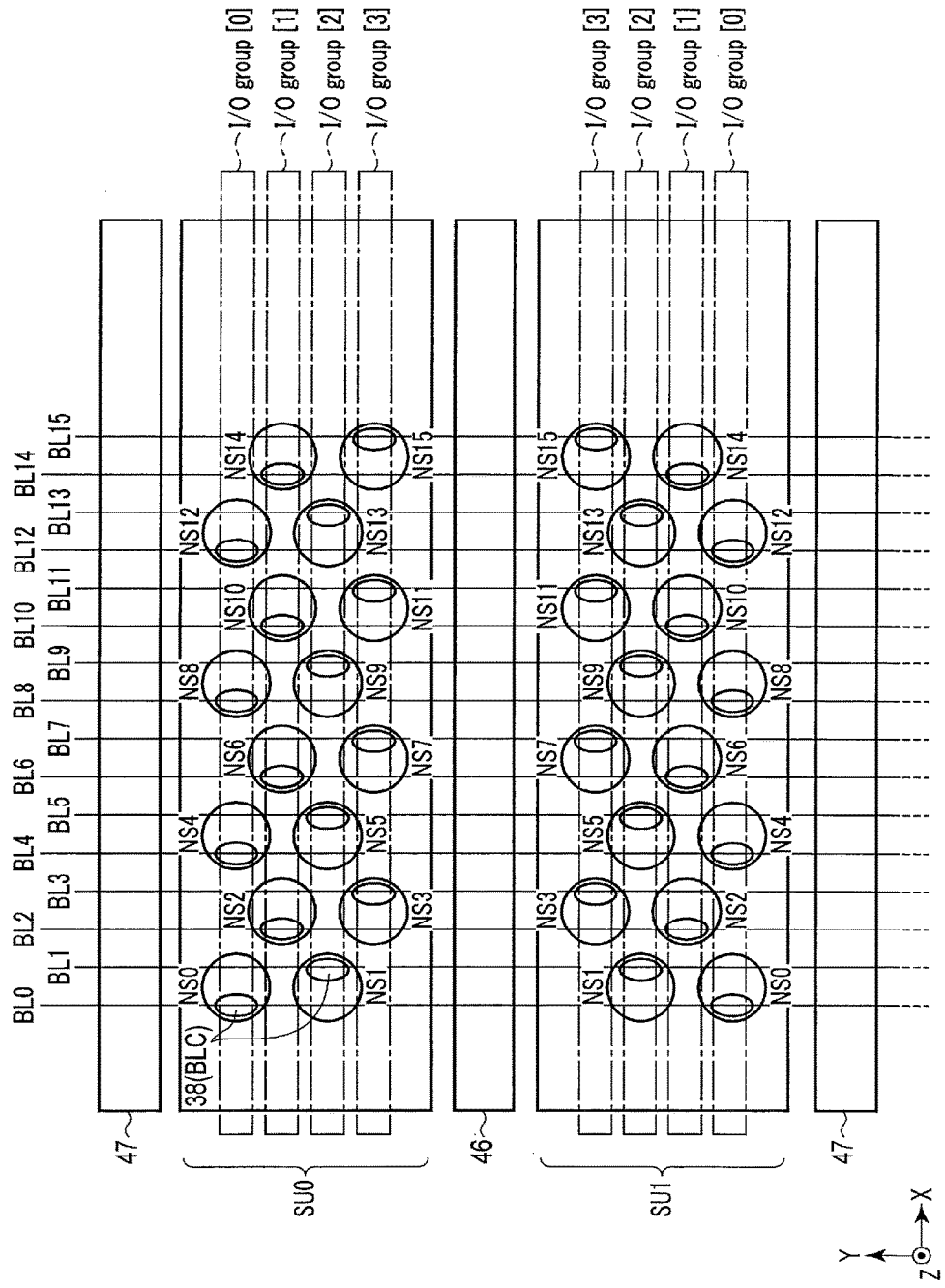
F I G. 53

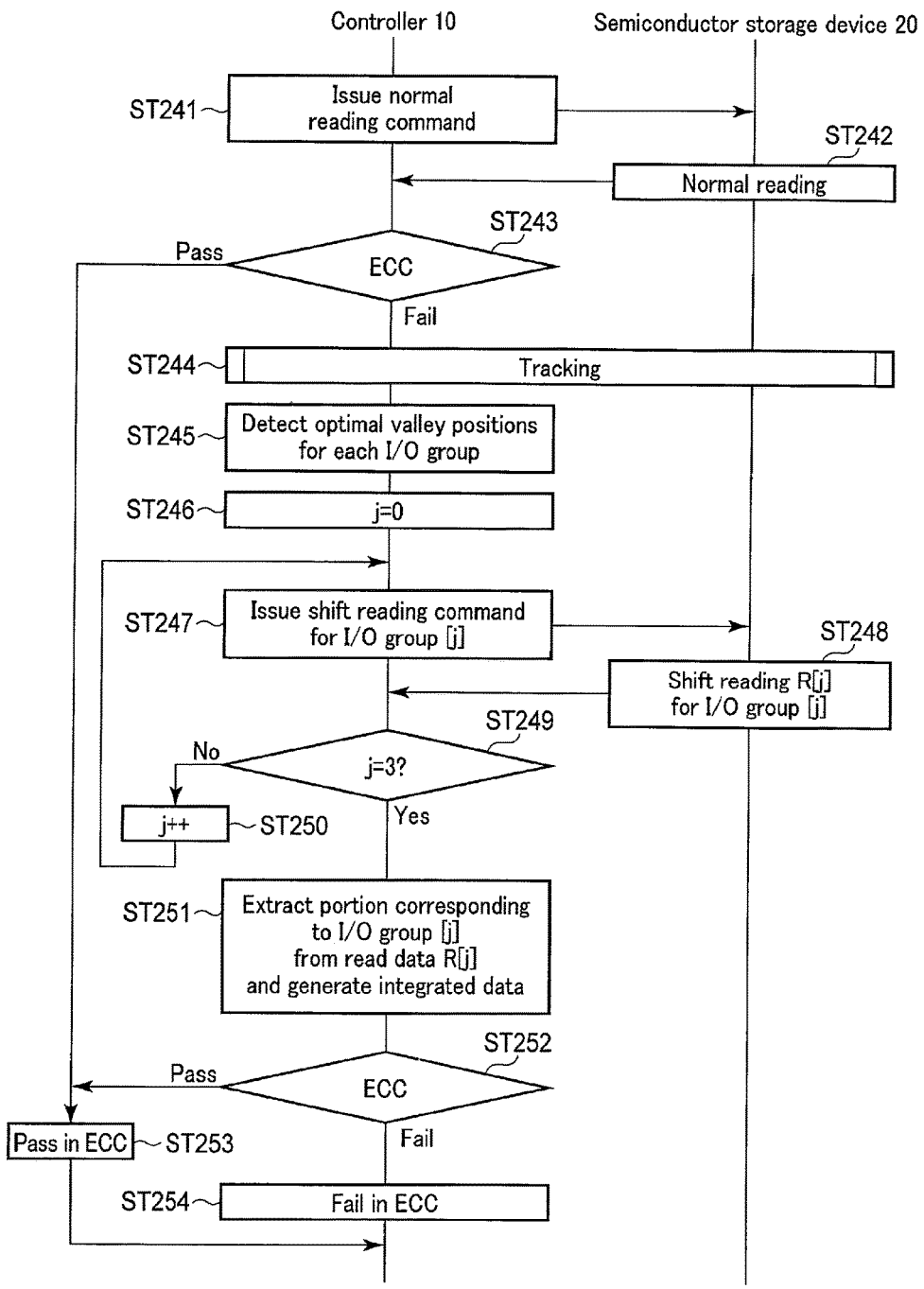
F I G. 54

SEMICONDUCTOR STORAGE DEVICE AND MEMORY SYSTEM

CROSS-REFERENCE TO RELATED APPLICATION

This application is based upon and claims the benefit of priority from Japanese Patent Application No. 2017-000697, filed Jan. 5, 2017, the entire contents of which are incorporated herein by reference.

FIELD

Embodiments described herein relate generally to a semiconductor storage device and a memory system.

BACKGROUND

A memory system is known which includes a NAND type flash memory serving as a semiconductor storage device and a controller that controls the NAND type flash memory.

BRIEF DESCRIPTION OF THE DRAWINGS

FIG. 1 is a block diagram illustrating a configuration of a memory system according to a first embodiment;

FIG. 2 is a block diagram illustrating a configuration of a semiconductor storage device according to the first embodiment;

FIG. 3 is a circuit diagram illustrating a configuration of a memory cell array of the semiconductor storage device according to the first embodiment;

FIG. 7 is a timing chart showing a test read operation of the semiconductor storage device according to the first embodiment;

FIG. 10 illustrates a command sequence in a shift read operation in the semiconductor storage device according to the first embodiment;

FIG. 13 is a flowchart of a lower-page tracking operation in the semiconductor storage device according to the first embodiment;

FIG. 14 is a timing chart of the lower-page tracking operation in the semiconductor storage device according to the first embodiment;

FIG. 16 is a table that shows data separated by the lower-page tracking operation in the semiconductor storage device according to the first embodiment;

FIG. 19 is a table that shows data read by the upper-page tracking operation in the semiconductor storage device according to the first embodiment;

FIG. 25 schematically shows a lower-page tracking operation in coarse tracking of the semiconductor storage device according to the first embodiment;

FIG. 29 shows characteristics of the semiconductor storage device according to the first embodiment;

FIG. 30 is a flowchart of an entire operation of a semiconductor storage device according to a modification example of the first embodiment;

FIG. 33 schematically shows the middle-page tracking operation in the coarse tracking of the semiconductor storage device according to a modification example of the first embodiment;

FIG. 34 is schematically shows a syndrome tracking operation of the semiconductor storage device according to a second embodiment;

FIG. 35 is a flowchart of a lower-page tracking operation in fine tracking of the semiconductor storage device according to the second embodiment;

FIG. 38 is a table that shows data integrated by the lower-page tracking operation in the fine tracking of the semiconductor storage device according to the second embodiment;

FIG. 39 shows characteristics of the semiconductor storage device according to the second embodiment;

FIG. 42 is a flowchart of a lower-page tracking operation in fine tracking of a semiconductor storage device according to a second modification example of the second embodiment;

FIG. 44 is a flowchart of a lower-page tracking operation in fine tracking of a semiconductor storage device according to a third modification example of the second embodiment;

FIG. 45 is a flowchart of a lower-page tracking operation in fine tracking of the semiconductor storage device according to the third modification example of the second embodiment;

FIG. 46 shows characteristics of the semiconductor storage device according to the third modification example of the second embodiment;

FIG. 49 is a schematic diagram illustrating clusters of a semiconductor storage device according to a third embodiment;

FIG. 50 is a flowchart of an entire operation of the semiconductor storage device according to the third embodiment;

FIG. 52 shows characteristics of the semiconductor storage device according to the modification example of the third embodiment;

FIG. 53 illustrates in a top view a configuration of a memory cell array of a semiconductor storage device according to a fourth embodiment; and FIG. 54 is a flowchart of an entire operation of the semiconductor storage device according to the fourth embodiment.

DETAILED DESCRIPTION

Figure 4:
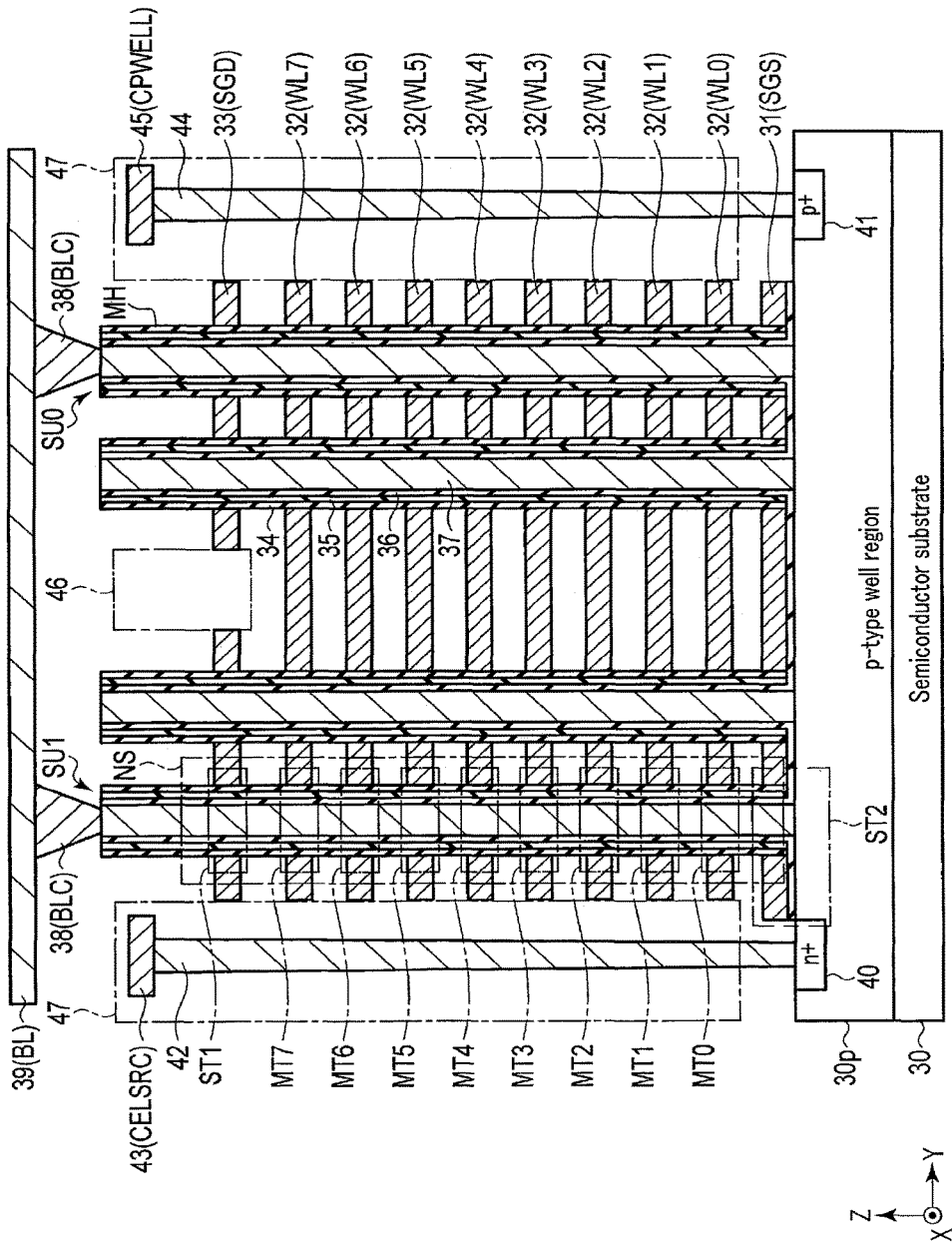
FIG. 4 is a cross-sectional view illustrating the configuration of the memory cell array of the semiconductor storage device according to the first embodiment.

In general, according to one embodiment, a semiconductor memory device includes: a memory cell; a word line which is coupled to the memory cell; and a control circuitry. The control circuitry performing: a first operation of reading data out of the memory cell with a first voltage applied to the word line while changing the first voltage by a first shift amount within a first range, and a second operation of reading data out of the memory cell with a second voltage applied to the word line while changing the second voltage by a second shift amount within a second range. The second shift amount is smaller than the first shift amount. The control circuitry performs the second operation to apply the second voltage to the word line subsequently to application of the first voltage to the word line in the first operation.

Embodiments will be described below with reference to the accompanying drawings. Note that in the following description, common reference numerals denote components having the same functions and configurations. To discriminate between a plurality of components having a common reference numeral, subscripts are added to the common reference numeral. Note that if it is not necessary to specifically discriminate between the plurality of components, the common reference numeral without any subscripts denotes the plurality of components.

Note that in the following description, a signal X<i:0> (i is a natural number) is a signal of (i+1) bits, and indicates a set of signals X<0>, X<1>, ..., and X<i> each of which is a 1-bit signal. In addition, a component Y<i:0> indicates a set of components Y<0>, Y<1>, ..., and Y<i> having one-to-one correspondences to input or output of the signal set X<i:0> respectively.

1. First Embodiment

A semiconductor storage device according to a first embodiment will be described.

1.1 Configuration

First, a configuration of the semiconductor storage device according to the first embodiment will be described.

1.1.1 Entire Configuration of Memory System

A configuration example of a memory system according to the first embodiment will be described with reference to FIG. 1. FIG. 1 is a block diagram illustrating an example of a configuration of the memory system according to the first embodiment. A memory system 1 communicates with, for example, an external host device, not illustrated in FIG. 1. The memory system 1 stores data from the host device (not illustrated), and reads data out of the memory system 1 into the host device.

As illustrated in FIG. 1, the memory system 1 includes a controller 10 and a semiconductor storage device (NAND flash memory) 20. The controller 10 receives commands from the host device and controls the semiconductor storage device 20 based on the received commands. Specifically, the controller 10 writes in the semiconductor storage device 20 data that the host device commands the controller 10 to write. The controller 10 reads from the semiconductor storage device 20 data that the host device commands the controller 10 to read, and transmits the data to the host device. The controller 10 is connected to the semiconductor storage device 20 via a NAND bus. The semiconductor storage device 20 includes a plurality of memory cells and stores data in a nonvolatile manner.

The NAND bus transmits and receives signals /CE, CLE, ALE, /WE, /RE, /WP, /RB, and I/O <7:0> corresponding to a NAND interface via individual signal lines (note that the symbol "/**" denotes a negative or low active). The signal /CE is a signal for enabling the semiconductor storage device 20. The signal CLE, when the signal CLE is at an "H (High)" level, notifies the semiconductor storage device 20 that the signals I/O <7:0> passed to the semiconductor storage device 20 are commands. The signal ALE, when the signal ALE is at an "H (High)" level, notifies the semiconductor storage device 20 that the signals I/O <7:0> passed to the semiconductor storage device 20 are addresses. The signal /WE, when the signal /WE is at an "L (Low)" level, commands the semiconductor storage device 20 to fetch the signals I/O <7:0> passed to the semiconductor storage device 20. The signal /RE commands the semiconductor storage device 20 to output the signals I/O <7:0>. The signal /WP commands the semiconductor storage device 20 to prohibit writing data or erasing data in the semiconductor storage device 20. The signal /RB indicates whether the semiconductor storage device 20 is in a ready state (a state where the semiconductor storage device 20 is ready to receive commands from the outside) or a busy state (a state where the semiconductor storage device 20 cannot receive commands from the outside). The signal I/O <7:0> may be, for example, an 8-bit signal. The signal I/O <7:0> denotes the substance of data transmitted and received between the semiconductor storage device 20 and the controller 10, and may include a command CMD, an address ADD, and data DAT. The data DAT includes data to be written and data read out.

1.1.2 Configuration of Controller

Turning back to FIG. 1, the controller of the memory system according to the first embodiment will be explained. The controller 10 includes a processor (a central processing unit: CPU) 11, a built-in memory (a random access memory: RAM) 12, an error check and correction (ECC) circuit 13, a NAND interface circuit 14, a buffer memory 15, and a host interface circuit 16.

The processor 11 controls entirely the operations of the controller 10. For example, the processor 11 issues a read command in compliance with the NAND interface to the semiconductor storage device 20 in response to a data read command received from the host device. This operation also applies to the cases of data writing and data erasing in the semiconductor storage device 20. In addition, the processor 11 may perform various operations on data read from the semiconductor storage device 20.

The built-in memory 12 is, for example, a semiconductor memory such as a dynamic RAM (DRAM), and is used as a work space for the processor 11. The built-in memory 12 stores firmware for managing the semiconductor storage device 20, various management tables, and the like.

The ECC circuit 13 performs error detection and error correction processes. More specifically, in data writing, the ECC circuit 13 generates an ECC code for each set of a predetermined number of data based on data received from the host device. In addition, in data reading, the ECC circuit 13 performs ECC decoding based on the ECC code and detects presence or absence of an error(s). When an error is detected, the ECC circuit 13 locates the bit position of the error in the data and corrects the error at the bit position. Various techniques such as low density parity check (LDPC) and Bose-Chaudhuri-Hocquenghem (BCH) may be applied to the ECC circuit 13.

The NAND interface circuit 14 is connected to the semiconductor storage device 20 via the NAND bus, and operates for communication with the semiconductor storage device 20. According to an instruction from the processor 11, the NAND interface circuit 14 transmits commands CMD, addresses ADD, and write data in the semiconductor storage device 20. In addition, the NAND interface circuit 14 receives data read out of the semiconductor storage device 20.

The buffer memory 15 temporarily stores data and the like that the controller 10 receives from the semiconductor storage device 20 and the host device. The buffer memory 15 is also used as a storage space for temporarily storing, for example, data read out of the semiconductor storage device 20, operation results on read data, and the like.

The host interface circuit 16 is connected to the host device and operates for communication with the host device. The host interface circuit 16 transfers, for example, commands and data received from the host device to the processor 11 and the buffer memory 15.

1.1.3 Configuration of Semiconductor Storage Device

Next, a configuration example of the semiconductor storage device according to the first embodiment will be described with reference to FIG. 2. FIG. 2 is a block diagram illustrating an example of a configuration of the semiconductor storage device according to the first embodiment.

The semiconductor storage device 20 includes a memory cell array 21, an input/output circuit 22, a logic control circuit 23, a register 24, a sequencer 25, a voltage generation circuit 26, a row decoder 27, and a sense amplifier module 28.

The memory cell array 21 includes a plurality of blocks BLK (BLK0, BLK1, . . . ). The blocks BLK include a plurality of nonvolatile memory cell transistors, not illustrated, each associated with a word line and a bit line. The respective blocks BLK are, for example, units of data erasure, and data stored in one block BLK are erased concurrently. Each block BLK includes a plurality of string units SU (SU0, SU1, SU2, . . . ). Each string unit SU is a set of NAND strings NS. The NAND string NS includes a plurality of memory cell transistors. Note that the number of blocks in the memory cell array 21, the number of string units in one block BLK, and the number of NAND strings in one string unit SU may be set to any number respectively.

The input/output circuit 22 transmits and receives signals I/O (I/O0 to I/O7) to and from the controller 10. The input/output circuit 22 transfers commands CMD and addresses ADD as signals I/O to the register 24. The input/output circuit 22 transmits and receives write data and read data to and from the sense amplifier module 28.

The logic control circuit 23 receives the signals /CE, CLE, ALE, /WE, /RE, and /WP from the controller 10. In addition, the logic control circuit 23 transfers the signal /RB to the controller 10 and notifies the outside of the state of the semiconductor storage device 20.

The register 24 stores the command CMD and the address ADD. The register 24 transfers the address ADD to the row decoder 27 and the sense amplifier module 28, and transfers the command CMD to the sequencer 25.

The sequencer 25 receives the command CMD and controls the semiconductor storage device 20 in its entirety according to a sequence based on the received command CMD.

The voltage generation circuit 26 generates a voltage necessary for operations such as writing, reading, or erasing of data based on requests from the sequencer 25. The voltage generation circuit 26 supplies the generated voltages to the row decoder 27 and the sense amplifier module 28.

The row decoder 27 receives a row address in the address ADD from the register 24, and selects a block BLK based on the row address. Then, voltages are transferred from the voltage generation circuit 26 to the selected block BLK via the row decoder 27.

In data reading, the sense amplifier module 28 senses data read from the memory cell transistor to the bit line, and transfers the sensed read data to the input/output circuit 22. In data writing, the sense amplifier module 28 transfers write data written through the bit line to the memory cell transistor. In addition, the sense amplifier module 28 receives a column address in the address ADD from the register 24, and outputs column data based on the column address.

1.1.4 Configuration of Memory Cell Array

Next, a configuration of the memory cell array of the semiconductor storage device according to the first embodiment will be described with reference to FIG. 3. FIG. 3 is an example of a circuit diagram illustrating the configuration of the memory cell array of the semiconductor storage device according to the first embodiment.

As illustrated in FIG. 3, each of the NAND strings NS includes, for example, eight memory cell transistors MT (MT0 to MT7), a selection transistor ST1, and a selection transistor ST2. Note that the number of memory cell transistors MT is not limited to eight, and may be 16, 32, 64, 128 or the like. The number of memory cell transistors MT may be any number. The memory cell transistors MT include a stacked gate including a control gate and a charge accumulation layer. Each memory cell transistor MT is connected in series between the selection transistors ST1 and ST2. Note that in the following description, the term "connect" also includes a case where another electrically conductive element is interposed between connected elements.

In any of the blocks BLK, gates of the selection transistors ST1 of the string units SU0 to SU3 are connected to selection gate lines SGD0 to SGD3, respectively. In addition, gates of the selection transistors ST2 of all the string units SU in the block BLK are connected to a common selection gate line SGS. Control gates of the memory cell transistors MT0 to MT7 in one block BLK are connected to word lines WL0 to WL7, respectively. That is, each of the word lines WL corresponding to the same address line is connected commonly to all the string units SU in the one block BLK, and the selection gate line SGS is connected commonly to all the string units SU in the one block BLK. In contrast, each of the selection gate lines SGD is connected to only corresponding one of the string units SU in the identical block BLK.

For the NAND strings NS arranged in a matrix in the memory cell array 21, the end opposite to the gate of each of the selection transistors ST1 of the NAND strings NS on any one row is connected to corresponding one of m bit lines BL (BL0 to BL(m−1) (m is a natural number)). In addition, each bit line BL is connected commonly to NAND strings NS on corresponding one column across the plurality of blocks BLK.

In addition, the end terminal of the selection transistor ST2 is connected to a source line CELSRC. The source line CELSRC is connected commonly to a plurality of NAND strings NS across the plurality of blocks BLK.

As described above, data erasing is performed concurrently for the memory cell transistors MT in one block BLK, for example. In contrast, reading and writing of data may be performed concurrently for a plurality of memory cell transistors MT connected commonly to any one word line WL in the string units SU of the blocks BLK. A set of memory cell transistors MT sharing a word line WL in the string units SU as described is referred to as a cell unit CU, for example. That is, the cell unit CU is a set of memory cell transistors MT for which a writing or read operation is concurrently performed. The cell unit CU has, for example, one or a plurality of sets of storage spaces, and a write or read operation for one cell unit CU is executed for one of the sets of storage spaces. The one set of the storage spaces described above is called a "page" in units.

Next, a cross-sectional structure of the memory cell array 21 will be described with reference to FIG. 4. FIG. 4 illustrates an example of a cross-sectional structure of part of the memory cell array of the semiconductor storage device according to the first embodiment. In particular, FIG. 4 illustrates a part of the memory cell array 21 relating to two string units SU0 and SU1 in one block BLK. Specifically, FIG. 4 illustrates two NAND strings NS of the two string units SU0 and SU1 and peripheries of the two NAND strings NS. A plurality of NAND strings NS configured as illustrated in FIG. 4 is arranged in the X direction and the Y direction. For example, a set of the plurality of NAND strings NS arranged in the X direction and the Y direction corresponds to one string unit SU.

The semiconductor storage device 20 is provided on a semiconductor substrate 30. In the following description, it is assumed that a plane parallel to the surface of the semiconductor substrate 30 is an XY plane, and a direction perpendicular to the XY plane is a Z direction. In addition, it is assumed that the X direction and the Y direction are orthogonal to each other.

A p-type well region 30$p$ is provided in an upper portion of the semiconductor substrate 30. The plurality of NAND strings NS are provided above the p-type well region 30$p$. That is, above the p-type well region 30$p$, for example, a wiring layer 31 functioning as the selection gate line SGS, eight wiring layers 32 (WL0 to WL7) functioning as the word lines WL0 to WL7, and a wiring layer 33 functioning as the selection gate line SGD are disposed in turn. The wiring layers 31 and 33 may comprise multiple disposed layers. Insulating films, not illustrated, are provided between the multiple disposed layers of the wiring layers 31 and 33.

For example, the wiring layer 31 is connected commonly to the gates of the selection transistors ST2 of the plurality of NAND strings NS in one block BLK. Every wiring layer 32 is connected commonly to the control gates of the respective memory cell transistors MT of the plurality of NAND strings NS in one block BLK. The wiring layer 33 is connected commonly to the gates of the respective selection transistors ST1 of the plurality of NAND strings NS in one string unit SU.

A memory hole MH is provided so as to pass through the wiring layers 33, 32, and 31 and to reach the p-type well region 30$p$. On the side surface of the memory hole MH, a block insulating film 34, a charge accumulation layer (insulating film) 35, and a tunnel oxide film 36 are provided in turn. A semiconductor pillar (conductive film) 37 is embedded in the memory hole MH. The semiconductor pillar 37 may be, for example, non-doped polysilicon and may be configured to be a current path of the NAND string NS. On the upper end of the semiconductor pillar 37, a contact plug 38 configured to be a bit-line contact BLC is provided. On the upper end of the contact plug 38, a wiring layer 39 configured to be the bit line BL is provided. Note that one NAND string NS in one string unit SU is connected via the contact plug 38 to the same wiring layer 39 to which one NAND string NS in a different string unit SU is connected.

As described above, the selection transistor ST2, the plurality of memory cell transistors MT, and the selection transistor ST1 are disposed above the p-type well region 30$p$ in turn, and one memory hole MH corresponds to one NAND string NS.

An $n^+$ type impurity diffusion region 40 and a $p^+$ type impurity diffusion region 41 are provided in an upper portion of the p-type well region 30*p*. A contact plug 42 is provided on the upper surface of the n⁺ type impurity diffusion region 40. On the upper surface of the contact plug 42, a wiring layer 43 configured to be the source line CELSRC is provided. A contact plug 44 is provided on the upper surface of the p⁺ type impurity diffusion region 41. On the upper surface of the contact plug 44, a wiring layer 45 configured to be a well line CPWELL is provided.

The wiring layer 33 provided near the string unit SU0 and the wiring layer 33 provided near the string unit SU1 are insulated from each other by an insulating region 46. In addition, the string units SU0 and SU1 are separated from other string units SU, not illustrated, by slit regions 47.

Note that the configuration of the memory cell array 21 may be other configurations. An example of the configuration of the memory cell array 21 is disclosed in U.S. patent application Ser. No. 12/407,403 titled "THREE DIMENSIONAL STACKED NONVOLATILE SEMICONDUCTOR MEMORY" filed on Mar. 19, 2009. In addition, other configuration examples of the memory cell array 21 are disclosed in U.S. patent application Ser. No. 12/406,524, titled "THREE-DIMENSIONAL STACKED NONVOLATILE SEMICONDUCTOR MEMORY" filed on Mar. 18, 2009, U.S. patent application Ser. No. 12/679,991 titled "NON-VOLATILE SEMICONDUCTOR STORAGE DEVICE AND METHOD OF MANUFACTURING THE SAME" filed on Mar. 25, 2010, and U.S. patent application Ser. No. 12/532,030 titled "SEMICONDUCTOR MEMORY AND METHOD FOR MANUFACTURING SAME" filed on Mar. 23, 2009. The entire contents of all of the above patent applications are incorporated herein by reference.

1.1.5 Threshold Distributions of Memory Cell Transistor

Figure 5:
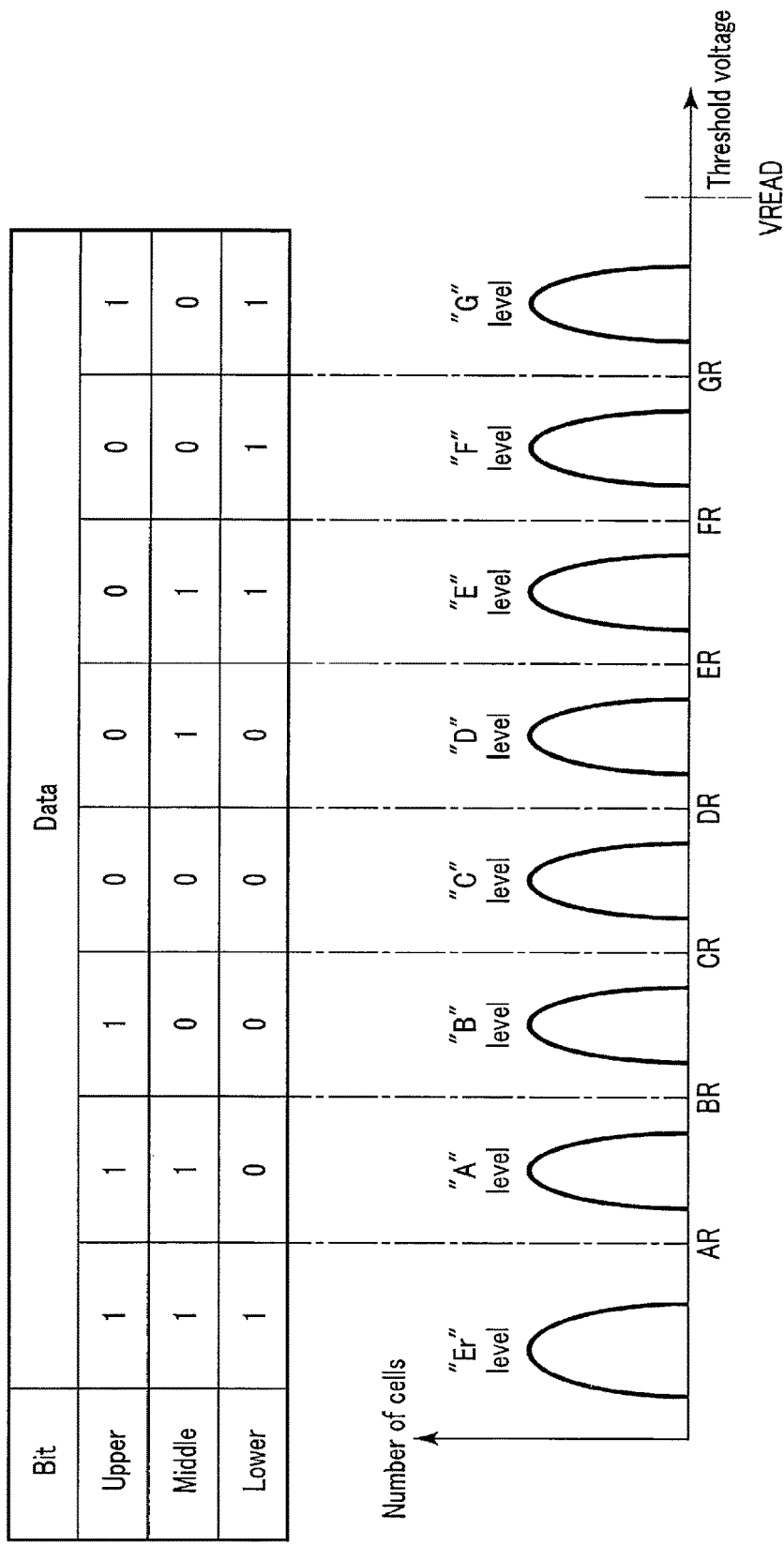
FIG. 5 illustrates distributions of threshold voltages of a memory cell transistor of the semiconductor storage device according to the first embodiment.

Next, distributions of threshold voltages that the memory cell transistor MT may take will be described with reference to FIG. 5. FIG. 5 is a schematic diagram illustrating an example of distributions of threshold voltages of the memory cell transistor of the semiconductor storage device according to the first embodiment. FIG. 5 illustrates an example of a case where 3-bit data is stored in one memory cell transistor MT (TLC: Triple Level Cell).

As illustrated in FIG. 5, the threshold voltages of the memory cell transistor MT may store 3-bit data with an upper bit (upper data), a middle bit (middle data), and a lower bit (lower data). That is, the threshold voltages may be applied to store "111", "110", "100", "000", "010", "011", "001", and "101" data.

The threshold voltage for the "111" data is at an "Er" level, which corresponds to, for example, a data erase state. The threshold voltage in the "Er" level is smaller than a voltage AR and has a positive or negative value.

Threshold voltages for data "110", "100", "000", "010", "011", "001", and "101" are at "A", "B", "E", "F", and "G" levels, respectively. Each of "A" to "G" levels correspond to a state where charges are injected into the charge accumulation layer 35 and data is written in the memory cell transistor MT, and the threshold voltage included in each level has, for example, a positive value. The threshold voltage in the "A" level is greater than the read voltage AR and smaller than a read voltage BR. The threshold voltage in the "B" level is greater than the read voltage BR and smaller than a read voltage CR. The threshold voltage in the "C" level is greater than the read voltage CR and smaller than a read voltage DR. The threshold voltage in the "D" level is greater than the read voltage DR and smaller than a read voltage ER. The threshold voltage in the "E" level is greater than the read voltage ER and smaller than a read voltage FR. The threshold voltage in the "F" level is greater than the read voltage FR and smaller than read voltage GR. The threshold voltage in the "G" level is greater than the read voltage GR and smaller than a voltage VREAD. The voltage VREAD is a voltage applied to the word lines WL which are not targets for reading when data is read in a certain block BLK. The voltages AR to GR are collectively referred to as a voltage VCGRV.

As described above, with the memory cell transistors MT having one of eight threshold voltage distributions, each memory cell transistor MT may take eight states. Note that the correspondence between each data and the threshold level is not limited to the above, and may be appropriately changed.

In addition, as described above, data writing and reading are performed in units of pages in one cell unit CU. In the example of FIG. 5, data is written and read out for each of the lower bit, the middle bit, and the upper bit. Therefore, since the memory cell transistor MT stores 3-bit data, data corresponding to the upper bit, the middle bit, and the lower bit are allocated to three pages in one cell unit CU, respectively. In the following description, pages that are concurrently written or read for the upper bit, the middle bit, and the lower bit are referred to as an upper page, a middle page, and a lower page, respectively.

1.1.6 Configuration of Sense Amplifier Module

Figure 6:
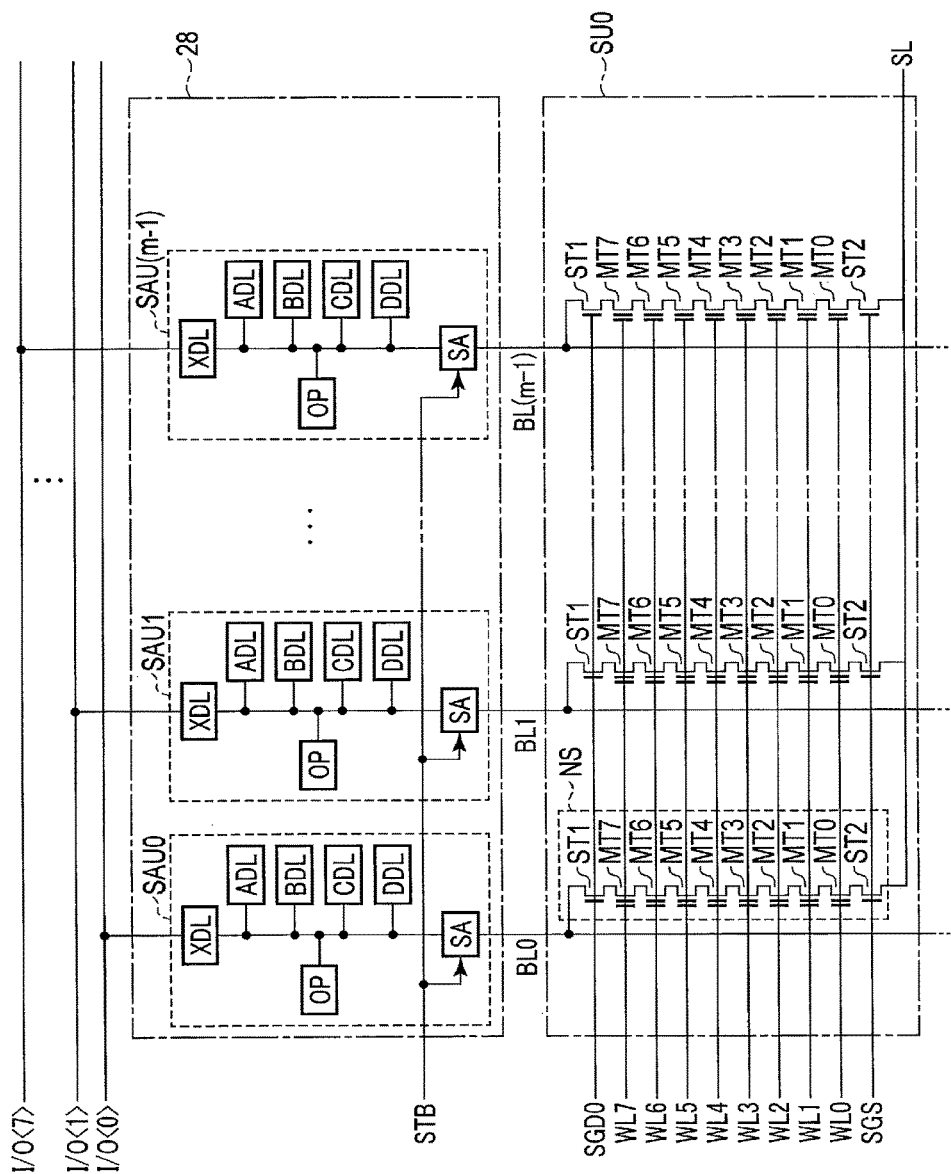
FIG. 6 a illustrates in a plan view a configuration of a sense amplifier module of the semiconductor storage device according to the first embodiment.

Next, a configuration of the sense amplifier module of the semiconductor storage device according to the first embodiment will be described. FIG. 6 illustrates in a plan view an example of the configuration of the sense amplifier module of the semiconductor storage device according to the first embodiment. As illustrated in FIG. 6, the sense amplifier module 28 includes sense amplifier units SAU (SAU0, SAU1, . . . , SAU(m−1)) provided for bit lines BL, respectively.

Each sense amplifier unit SAU includes a sense amplifier SA, an operation unit OP, and, for example, five latches ADL, BDL, CDL, DDL, and XDL.

The sense amplifier SA senses data read into a corresponding bit line BL and applies a voltage to a bit line BL according to write data. That is, the sense amplifier SA is a module that directly drives the bit line BL. In reading, the sense amplifier SA is supplied with a strobe signal STB from the sequencer 25, for example. The sense amplifier SA assures read data at a timing when the strobe signal STB is asserted. Then, the sense amplifier SA holds the data in a latch provided inside, not illustrated, and transfers the data to one of the latches ADL, BDL, CDL, DDL, and XDL.

The latches ADL, BDL, CDL, and DDL temporarily hold read data and write data. The operation unit OP performs various logical operations, such as a NOT operation, an OR operation, an AND operation a NAND operation, a NOR operation, and an XOR operation, on data held in the sense amplifier SA, and the latches ADL, BDL, CDL, DDL and XDL.

The sense amplifiers SA, the latches ADL, BDL, CDL, and DDL, and the operation unit OP are interconnected via a bus such that data can be transmitted and received among them. The bus is further connected to a latch XDL.

Data is input to and output from the sense amplifier module 28 via the latch XDL. That is, data received from the controller 10 is transferred to the latch ADL, BDL, CDL, or DDL, or the sense amplifier SA via the latch XDL. The data held in the latch ADL, BDL, CDL, or DDL or the sense amplifier SA is transmitted via the latch XDL to the controller 10 as one of signals I/O <7:0>. The latch XDL serves as a cache memory of the semiconductor storage device 20.

Therefore, even in the case where the latches ADL, BDL, CDL, and DDL are in use, if the latch XDL is available, the semiconductor storage device 20 can be in a ready state.

Note that in the example of FIG. 6, the bit line BL0 is connected to a signal line for communicating a signal I/O<0>, and the bit line BL1 is connected to a signal line for communicating a signal I/O<1>. The latch XDL connected to a bit line BL(m−1) is connected to a signal line for communicating a signal I/O<7>. As described, each of the signal lines connecting the bit line BL and the controller 10 corresponds to one of the signals I/O<7:0>. That is, the NAND string NS connected to a certain bit line BL is associated with one of the signals I/O<7:0>.

1.2 Operations

Next, operations of the semiconductor storage device according to the first embodiment will be described.

1.2.1 Read Operations

First, various read operations used in the semiconductor storage device according to the first embodiment will be described.

1.2.1.1 Test Reading

A test read operation in the semiconductor storage device according to the first embodiment will be described. "Test reading" is a term distinguished from "normal reading" and "shift reading", which will be described later. For example, in test reading, a read operation with a single special read voltage is performed. In the following description, when voltages are used in test reading, a suffix "t" is added to a symbol denoting the read voltages in order to distinguish those read voltages from read voltages used in other read operations.

FIG. 7 is a timing chart of unselected word lines, a selected word line, a node SEN, and a signal STB in the semiconductor storage device 20, schematically showing a test read operation in the semiconductor storage device according to the first embodiment. The node SEN is a node included in the sense amplifier SA. The potential of the node SEN fluctuates depending on whether the memory cell transistor MT connected to the selected word line is turned ON or turned OFF. Whether the data is "0" or "1" is determined according to this fluctuation amount. In this example, when the potential of the node SEN falls below a certain threshold, the sense amplifier SA determines that the memory cell transistor MT is in the turned ON state and holds data "0" in the latch inside the sense amplifier SA. In contrast, if the potential of the node SEN is kept equal to or higher than the certain potential, the sense amplifier SA determines that the memory cell transistor MT is in the turned OFF state and holds data "1".

As illustrated in FIG. 7, in the test reading, the row decoder 27 applies a certain voltage Vt to the selected word line WL at time T1. In this period, the row decoder 27 applies the voltage VREAD to the unselected word lines, and the node SEN in the sense amplifier SA is charged to a potential VSEN higher than a voltage VSS. Then, the sequencer 25 asserts the signal STB ("H" level in the example of FIG. 7) at time T2 while the voltage Vt is applied to the selected word line WL.

For example, in a case where the voltage Vt is applied to the selected word line WL and thus the memory cell transistor MT is turned ON, a current flows from the bit line BL to the source line SL. As a result, charges of the node SEN are also discharged, and the potential of the node SEN lowers. The sense amplifier SA asserts the signal STB at time T2, and fetches the state of the node SEN into the latch.

That is, if the potential of the node SEN is lowered, data "0" is stored in the latch, and if the potential is kept equal to or higher than a certain potential, data "1" is held in the latch.

As described above, in the test reading, data is assured according to the single special read level (voltage Vt).

1.2.1.2 Normal Reading

Next, a normal read operation in the semiconductor storage device according to the first embodiment will be described. Unlike the "test reading", "normal reading" means an operation of reading data at a predetermined (default) read voltage in data reading. In the following description, a suffix "def" is added to symbols denoting the read voltages of each level used in the normal reading in order to distinguish those read voltages from read voltages used in other read operations.

Figure 8:
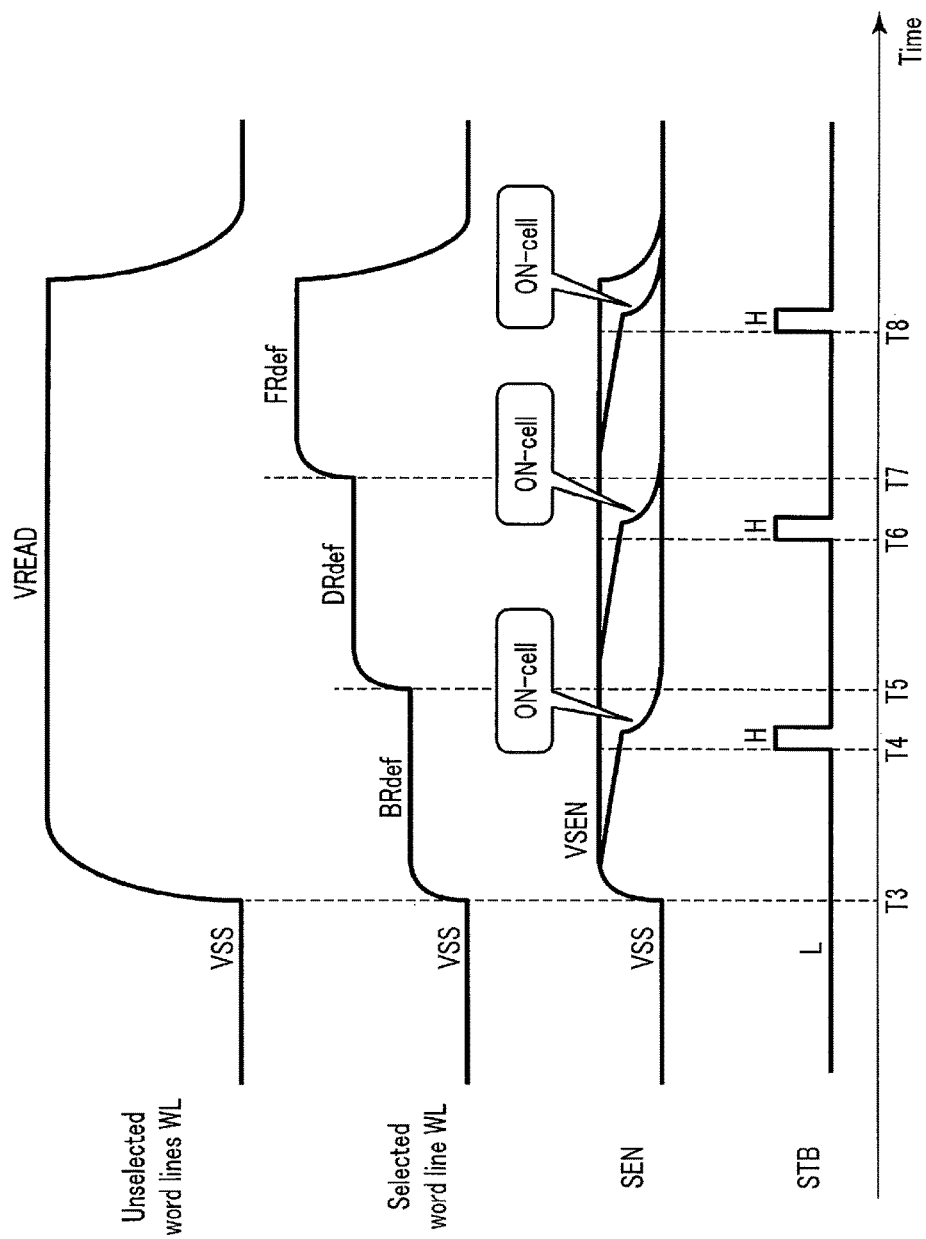
FIG. 8 is a timing chart showing a normal read operation of the semiconductor storage device according to the first embodiment.

FIG. 8 is a timing chart of the unselected word lines, the selected word line, the node SEN, and the signal STB in the semiconductor storage device 20, schematically showing the normal read operation in the semiconductor storage device according to the first embodiment.

In FIG. 8, as an example, a case of reading the middle page is illustrated.

As illustrated in FIG. 8, in the middle-page reading, the row decoder 27 applies a voltage BRdef at time T3, a voltage DRdef at time T5, and a voltage FRdef at time T7 to the selected word line WL. In the above period, the row decoder 27 applies the voltage VREAD to the unselected word lines, and the node SEN in the sense amplifier SA is charged to the potential VSEN higher than the voltage VSS. Then, the sequencer 25 asserts the signal STB once at each of time T4, T6, and T8 while each of the voltages BRdef, DRdef, and FRdef is applied to the selected word line WL.

For example, in a case where the voltage BRdef is applied to the selected word line WL and thus the memory cell transistor MT is turned ON, the sense amplifier SA asserts the signal STB at time T4 and fetches the state of the node SEN into the latch. The same applies to a case where the voltage DRdef or FRdef is applied to the selected word line WL. At time T6 and T8, the sense amplifier SA asserts the signal STB and holds data based on the potential of the node SEN is in the latch.

The operation unit OP performs an operation process using data held in the latch based on the three read voltage levels to generate one read data.

As described above, in the middle data reading, data is assured according to the three read voltage levels (voltages BRdef, DRdef, and FRdef).

Note that in the lower data reading and the upper data reading, data is assured according to two read voltage levels (voltages ARdef and ERdef in the case of lower data reading and voltages CRdef and GRdef in the case of upper data reading).

1.2.1.3 Shift Reading

Next, a shift read operation in the semiconductor storage device according to the first embodiment will be described. The shift reading is executed, for example, in a case where data cannot be correctly read in normal reading.

In FIG. 5 described above, threshold voltage distributions for respective data are independent from each other. By setting a voltage VCGRVdef serving as a read voltage to a value between threshold voltage distributions for the respective data, correct data can be read in the normal reading.

Figure 9:
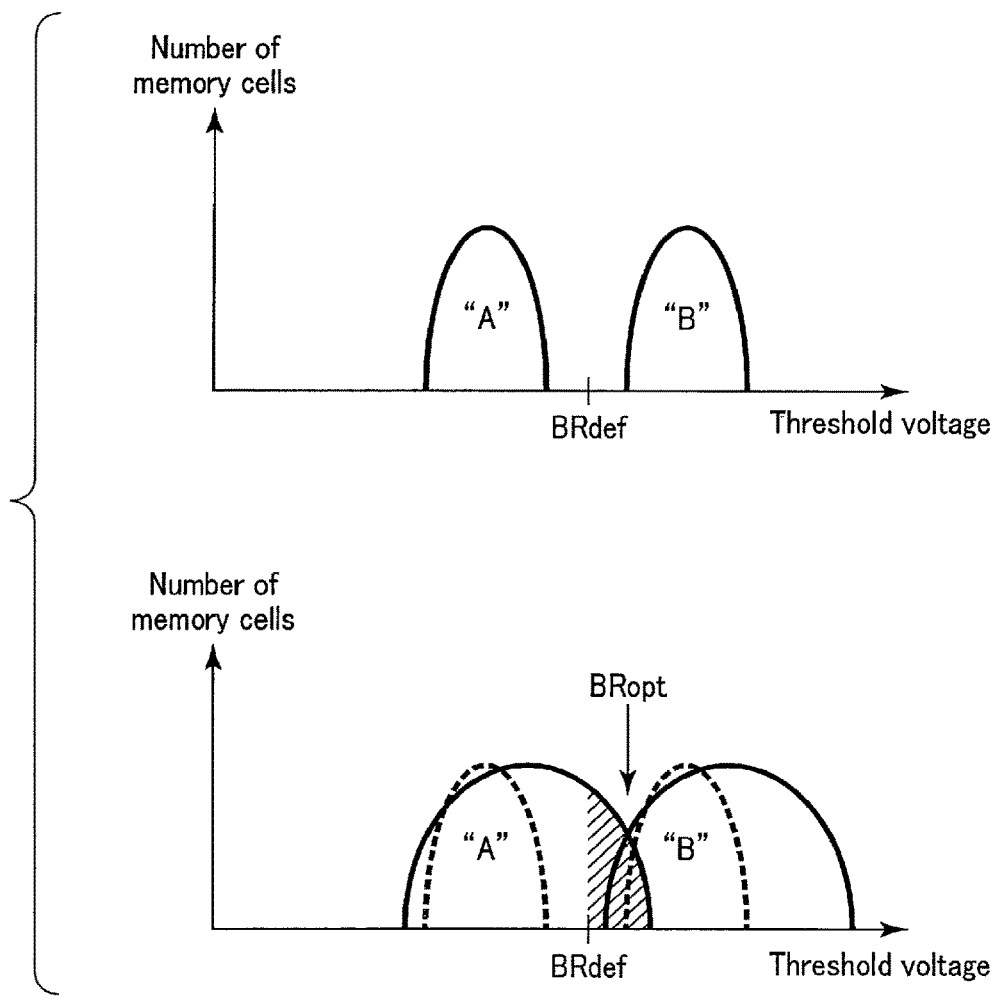
FIG. 9 schematically shows fluctuations of threshold voltage distributions in the semiconductor storage device according to the first embodiment.

However, due to various factors, the threshold voltages of the memory cell transistor MT may fluctuate. As a result, since the width of distribution of the threshold voltage for each data in FIG. 5 widens or the distribution moves, adjacent distributions may overlap with each other. This case is illustrated in FIG. 9. For example, assume that the threshold voltage distributions of "A" level and "B" level immediately after writing are as illustrated in the top graph of FIG. 9. Assume that the threshold voltage distributions spread out as illustrated in the bottom graph of FIG. 9 due to a factor such as disturbance. Then, when reading is performed at the initially set read voltage BRdef, an error occurs in read data of the memory cell transistor MT corresponding to a hatched area. If the number of error bits exceeds the number of error bits correctable by the ECC circuit 13, the data cannot be corrected.

In such a case, a voltage at which overlapped area of threshold voltage distributions at two levels becomes smaller (for example, a voltage BRopt at which the overlapped area of the threshold voltage distributions becomes the smallest) is preferably set as a new read voltage so as to reduce the number of error bits. A read operation performed by setting a read voltage (for example, the voltage BRopt) obtained by shifting a predetermined normal reading voltage (for example, the voltage BRdef) by a certain value is referred to as shift reading. As described above, the shift reading is a reading method in which a read voltage obtained by changing the read voltage in the normal reading is used. In the shift reading, a read voltage different from the predetermined normal reading voltage is used; however, the shift reading is similar to the normal reading in that data of a page to be targeted is read.

FIG. 10 illustrates a command sequence for the shift read operation of the semiconductor storage device according to the first embodiment.

As illustrated in FIG. 10, the controller 10 first issues a prefix command "xxh". The command "xxh" is a command for declaring that the controller 10 performs the shift reading to the semiconductor storage device 20. Subsequently, the controller 10 issues an address, for example, over one cycle. Then, the controller 10 issues values ΔDAC1 to ΔDAC4 corresponding to shift amounts for the voltages VCGRVdef, for example, over 4 cycles. For example, the D/A converter (DAC) values are identification values used when the controller 10 specifies the read voltages VCGRV to the semiconductor storage device 20. For example, the values ΔDAC1 to ΔDAC4 correspond to shift amounts ΔV1 to ΔV4 from the read voltages VCGRVdef, in first to fourth levels applied to the selected word line WL in the shift reading. More specifically, for example, when the values ΔDAC1 to ΔDAC3 are specified in the shift reading of the middle page, the read voltages BR, DR, and FR for the "B", "D", and "F" levels are expressed as follows using the shift amounts ΔV1 to ΔV3.

$BR = BR\text{def} + \Delta V1(\Delta DAC1)$ $DR = BR\text{def} + \Delta V2(\Delta DAC2)$ $FR = BR\text{def} + \Delta V3(\Delta DAC3)$ Note that in the shift reading of the middle data, the value ΔDAC4 may be redundant data, and additional information may be set.

The above example is also applied to the shift reading of the lower page and the upper page. That is, in a case where the values ΔDAC1 and ΔDAC2 are specified in the shift reading of the lower page, the read voltages AR and ER for the "A" and "E" levels are expressed as follows using the shift amounts ΔV1 and ΔV2.

$AR = AR\text{def} + \Delta V1(\Delta DAC1)$ $ER = ER\text{def} + \Delta V2(\Delta DAC2)$ In addition, in a case where the values ΔDAC1 and ΔDAC2 are specified in the shift reading of the upper page, the read voltages CR and GR for the "C" and "G" levels are expressed as follows using the shift amounts ΔV1 and ΔV2.

$CR = CR\text{def} + \Delta V1(\Delta DAC1)$ $GR = GR\text{def} + \Delta V2(\Delta DAC2)$ Note that in the shift reading of the lower data and the upper data, the values ΔDAC3 and ΔDAC4 may be redundant data, and additional information may be set.

Furthermore, the controller 10 issues a command "zzh". The command "zzh" has a variable. For example, in a case where "zzh"="01h", the command requests the lower-page reading, in a case where "zzh"="02h", the command requests the middle-page reading, and in a case where "zzh"="03h", the command requests the upper-page reading.

Then, in the same manner as in the normal reading, the controller 10 issues a first read command "00h", and subsequently issues addresses (including a column address, a block address, and a page address), for example, over 5 cycles. Then, the controller 10 issues a second read command "30h".

When the command "30h" is stored in the register 24, the sequencer 25 controls the voltage generation circuit 26, the row decoder 27, the sense amplifier module 28 and the like to start a read operation. The logic control circuit 23 sets the signal /RB to "L" level and info ms the controller 10 that the semiconductor storage device 20 is in a busy state. During the read operation, data for one page is read from the space corresponding to the address transmitted from the controller 10 and is held in one of the latches ADL to DDL. The held data is transferred into the latch XDL, if necessary, after the operation unit OP performs a predetermined operation process on the held data. The logic control circuit 23 sets the signal /RB to "H" level and informs the controller 10 that the semiconductor storage device 20 is in a ready state.

When the semiconductor storage device 20 is in a ready state, the controller 10 repeatedly asserts the signal /RE. Every time the signal /RE is toggled, data read from the memory cell array 21 is transmitted to the controller 10.

Note that in the above command sequence, the controller 10 asserts the signals CLE when commands are input to the semiconductor storage device 20, asserts the signals ALE when addresses are input to the semiconductor storage device 20, and negates the signals CLE and ALE when data is input to the semiconductor storage device 20. In addition, when any signal is input to the semiconductor storage device 20, the controller 10 toggles the signal /WE.

1.2.2 Tracking Operation

In order to minimize the number of error bits in the data reading, the shift reading is preferably performed at voltages (for example, the voltage BRopt in the below graph of FIG. 9) in valley positions where overlapped area of threshold voltage distributions of two levels is minimal. In the following description, a suffix "opt" is added to the symbol denoting the optimal read voltage of each level in order to distinguish those optimal read voltages from read voltages used in other read operations. In the following, an operation (tracking operation) for searching for the optimal read voltages VCGRVopt will be described.

1.2.2.1 Bit Count Tracking

Before describing the entirety of the tracking operation according to the first embodiment, bit count tracking will be described. The bit count tracking is a basic concept constituting the tracking operation for the semiconductor storage device according to the first embodiment.

Figure 11:
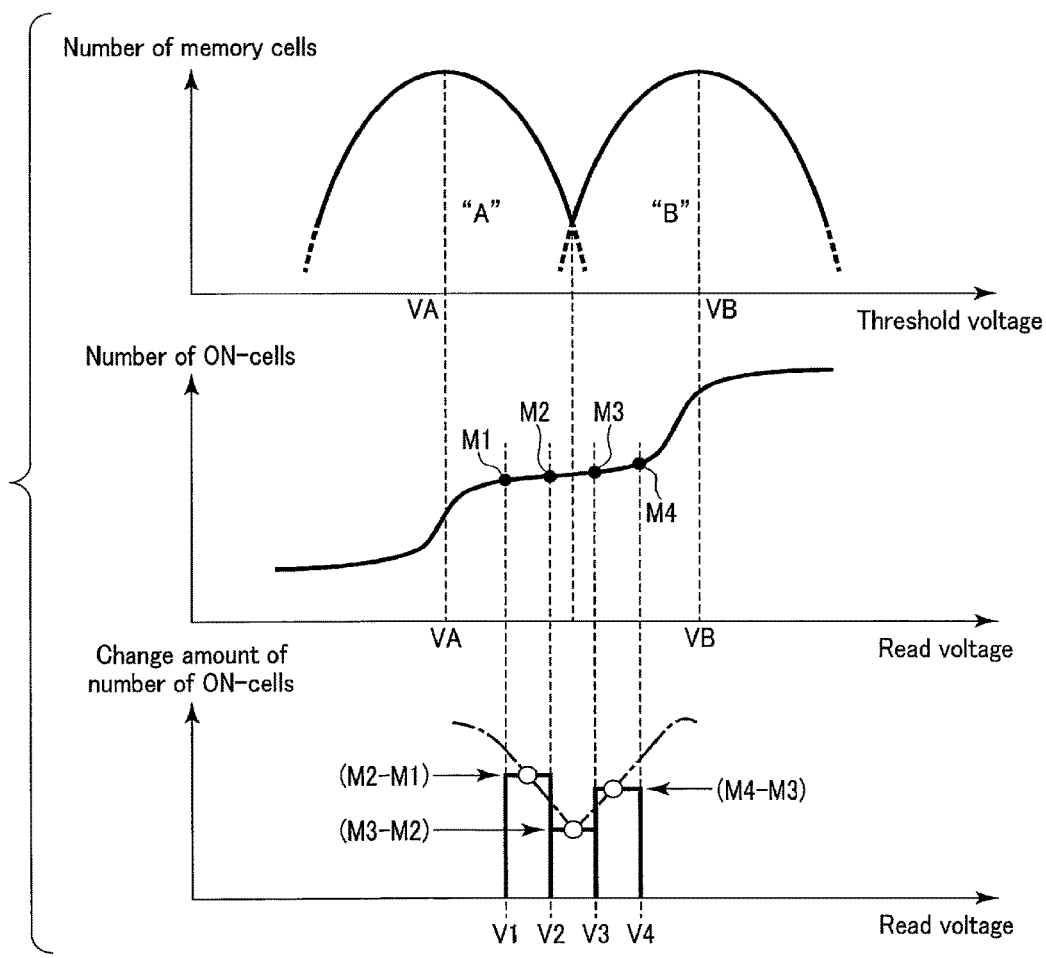
FIG. 11 shows a bit count tracking operation in the semiconductor storage device according to the first embodiment.

FIG. 11 is a schematic diagram illustrating the bit count tracking of the semiconductor storage device according to the first embodiment. The top drawing of FIG. 11 is a graph illustrating threshold voltage distributions of the "A" and "B" levels as an example of threshold voltage distributions of a memory cell transistor MT group. The middle drawing of FIG. 11 is a graph illustrating transition of the number of memory cells (number of ON-cells) to be turned ON at a certain read voltage. The bottom drawing of FIG. 11 is a histogram illustrating change amounts of the number of ON-cells in read voltage ranges. Note that in the middle and bottom drawings of FIG. 11, change amounts are plotted correspondingly to the memory cell transistor MT group having the threshold voltage distributions in the top drawing of FIG. 11.

As illustrated in the middle drawing of FIG. 11, as the read voltage increases, the number of ON-cells sharply increases at a voltage slightly lower than a voltage VA, which is the median value of the "A" level, and dM/dV becomes maximal. Here, the median value may be defined as a voltage with the highest distribution probability of the threshold voltage in the top drawing of FIG. 11. M is the number of ON-cells, and V is the voltage of the selected word line WL. As the read voltage further increases, the increase rate of the number of ON-cells lowers and becomes a minimal value at a certain read voltage value. The increase rate at the certain read voltage is zero in a case where the threshold voltage distribution in the "A" level and the threshold voltage distribution in the "B" level do not overlap with each other. In contrast, in a case where the threshold voltage distribution in the "A" level and the threshold voltage distribution in the "B" level overlap with each other, the increase rate becomes a certain minimal value which is not zero (>0). As the read voltage further increases, the increase rate of the number of ON-cells increases again, and dM/dV becomes maximal again at a voltage slightly lower than a voltage VB, which is the median value of the "B" level.

Due to the above change in the cumulative value of the number of ON-cells, it is possible to detect the valley position between the two levels, that is, the position of the read voltage at which the overlapped area of the threshold voltage distributions of the two levels is the smallest. For example, first, the read operation is performed using a read voltage V1. Assume that the number of ON-cells at that time is M1. Next, the read operation is performed using a voltage V2 greater than the voltage V1 by ΔV. Assume that the number of ON-cells at that time is M2. Then, the number of memory cell transistors MT newly turned ON when the voltage of the selected word line WL rises from V1 to V2 is (M2−M1).

Subsequently, a read operation is performed using a voltage V3 greater than the voltage V2 by ΔV. Assume that the number of ON-cells at this time is M3. Then, the number of memory cell transistors MT newly turned ON when the voltage of the selected word line WL rises from V2 to V3 is (M3−M2). Then, assuming that (M2−M1)>(M3−M2), it is considered that the voltage at which dM/dV is minimal is at least higher than the voltage V2.

Subsequently, a read operation is performed using a voltage V4 is greater than the voltage V3 by ΔV. If the number of ON-cells at that time is M4 and (M3−M2)<(M4−M3), the histogram as illustrated in the bottom drawing of FIG. 11 is obtained.

As a result of the above, based on the change amounts of the number of ON-cells, it is possible to estimate the threshold voltage distribution as indicated by an alternate long and short dashed line in the bottom drawing of FIG. 11, and to estimate that the valley position between the "A" and "B" levels is located between the voltages V2 and V3.

For example, the change amount of the number of ON-cells is derived, for example, by tracking a change in the number of bits (bit count) in read data for one page due to a change in the read voltage. These operations are collectively referred to as bit count tracking.

1.2.2.2 Entirety of Operations

Figure 12:
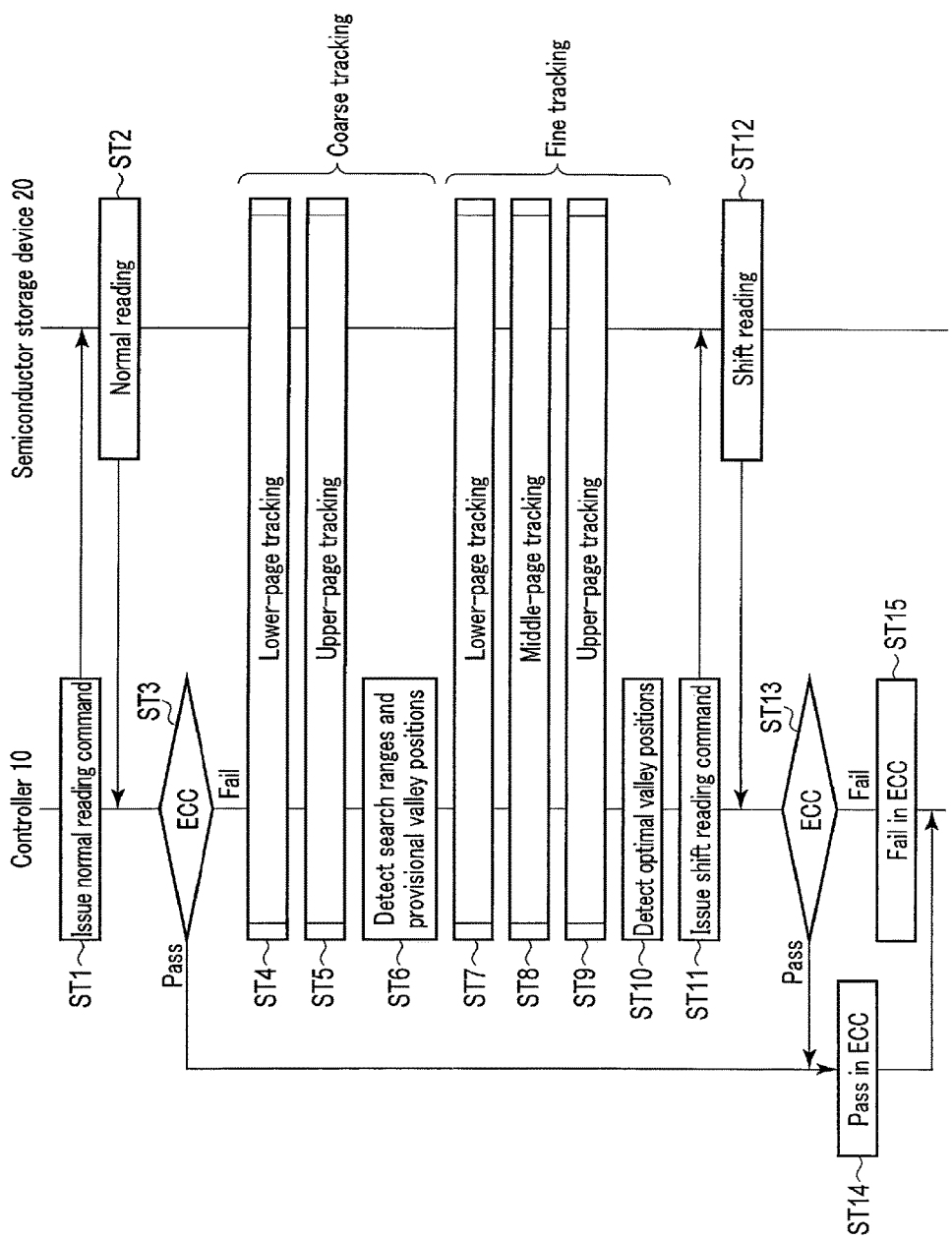
FIG. 12 is a flowchart of an entire operation in the semiconductor storage device according to the first embodiment.

FIG. 12 is a flowchart the tracking operation of the semiconductor storage device according to the first embodiment.

As illustrated in FIG. 12, in step ST1, the controller 10 issues to the semiconductor storage device 20 a normal reading command which identifies the predetermined read voltage VCGRVdef.

In step ST2, the semiconductor storage device 20 executes the normal reading and transmits read data to the controller 10.

In step ST3, the ECC circuit 13 executes an error checking and correction (ECC) based on the read data in the normal reading. When the read data in the the normal reading passes the ECC (step ST3; pass), the controller 10 proceeds to step ST14. If the read data fails the ECC (step ST3; fail), the controller 10 proceeds to step ST4.

In step ST4 and subsequent steps, the controller 10 attempts to find the optimal values of the seven voltages AR to GR. For this purpose, the controller 10 performs the tracking operations in two stages. The controller 10 performs the tracking operations in a first stage to specify a plurality of ranges for which the tracking operations are performed. The controller 10 performs the tracking operations in a second stage to perform the tracking operations within the specified ranges to estimate the optimal voltages AR to GR.

In steps ST4 and ST5, the controller 10 and the semiconductor storage device 20 perform the tracking operations in the first stage (lower-page tracking operation and upper-page tracking operation), respectively. Details of the lower-page tracking operation and the upper-page tracking operation will be described later.

In step ST6, the controller 10 detects search ranges and provisional valley positions used for subsequent tracking operations in the second stage based on the results of the tracking operations in the first stage.

The operations in steps ST4 to ST6 are full-level shift reading tracking (hereinafter also referred to as "coarse tracking") with coarse shift amounts. The details of the coarse tracking operation will be described later.

In steps ST7 to ST9, the controller 10 and the semiconductor storage device 20 perform the tracking operations in the second stage (lower-page tracking operation, middle-page tracking operation, and upper-page tracking operation) within the search ranges detected in the coarse tracking operation. Operations in steps ST7 and ST9 are similar to the operations in steps ST4 and ST5, respectively, except that the search ranges and the shift amounts differ from each other. Details of the middle-page tracking operation will be described later.

In step ST10, the controller 10 detects the optimal valley positions to be used for subsequent shift reading based on the results of the tracking operations in the second stage.

The operations in steps ST7 to ST10 are shift reading tracking (hereinafter also referred to as "fine tracking") in detected search ranges with fine shift amounts. Details of the fine tracking operation will be described later.

As such, by the lower-page tracking operation and the upper-page tracking operation with the coarse shift amounts in steps ST4 to ST6, the ranges searched in the lower-page tracking operation, the middle-page tracking operation, and the upper page tracking operation with the fine shift amounts in steps ST7 to ST10 are identified.

In step ST11, the controller 10 issues to the semiconductor storage device 20 a shift reading command which identifies the read voltages VCGRVopt at the detected optimal valley positions.

In step ST12, the semiconductor storage device 20 executes the shift reading and transmits optimal read data to the controller 10.

In step ST13, the ECC circuit 13 executes the ECC based on the data read by the shift reading. When the read data in the shift reading passes the ECC (step ST13; pass), the controller 10 proceeds to step ST14. If the read data fails the ECC (step ST13; fail), the controller 10 proceeds to step ST15.

In step ST14, the controller 10 acquires a "pass in ECC" status and terminates the operation. In step ST15, the controller 10 determines that the data cannot be corrected based on the ECC result and then terminates the operation.

Accordingly, the tracking operation is terminated.

1.2.2.3 Lower-Page Tracking

Next, the lower-page tracking operation of the semiconductor storage device according to the first embodiment will be described.

FIG. 13 is a flowchart of the lower-page tracking operation of the semiconductor storage device according to the first embodiment. As described above, the lower-page tracking operation is an operation common to steps ST4 and ST7 in FIG. 12.

As illustrated in FIG. 13, in step ST21, the controller 10 issues a test reading command for the lower page to the semiconductor storage device 20.

In step ST22, the semiconductor storage device 20 executes the test reading for the lower page and reads read data TL. The semiconductor storage device 20 holds the read data TL in the latch (for example, the latch ADL).

In step ST23, the controller 10 initializes loop processes to be executed in the following steps ST24 to ST29 (n=0 (n is an integer of 0≤n≤N (N is a positive integer))).

In step ST24, the controller 10 issues a shift reading command for the lower page to the semiconductor storage device 20.

In step ST25, the semiconductor storage device 20 executes the shift reading of the lower page, and reads read data ARn/ERn (AR0/ER0, AR1/ER1, . . . , or ARN/ERN) in the (n+1)th loop process. The semiconductor storage device 20 holds the read data ARn/ERn in the latch (for example, the latch BDL). The read data ARn/ERn in the (n+1)th loop process corresponds to the result of the shift reading of the lower page in which the voltages ARn and ERn are used to present. Therefore, the read data ARn/ERn has data "0" or "1" based on the relationship between the corresponding threshold voltage of the memory cell transistor MT and the voltages ARn and ERn in each bit.

In step ST26, the semiconductor storage device 20 performs operations for separated data ARsn (ARs0, ARs1, . . . , ARsN) and ERsn (ERs0, ERs1, . . . , ERsN) based on the read data TL and ARn/ERn held in the latches. Then, the semiconductor storage device 20 transmits the separated data ARsn and ERsn to the controller 10. The separated data ARsn and ERsn have partial information of the read data ARn/ERn. Specifically, the separated data ARsn has data "0" or "1" in each bit thereof that is based on the relationship between the corresponding threshold voltage of the memory cell transistor MT and the voltage ARn. The separated data ERsn has data "0" or "1" in each bit thereof that is based on the relationship between the corresponding threshold voltage of the memory cell transistor MT and the voltage ERn.

In step ST27, the controller 10 calculates a bit count based on the separated data ARsn and a bit count based on the separated data ERsn.

In step ST28, the controller 10 determines whether or not to continue the loop processes. Specifically, when the value n is not equal to the value N (step ST28; No), the process proceeds to step ST29 where the loop count is incremented, and then the process returns to step ST24. In a case where the value n is equal to the value N (step ST28; Yes), the tracking operation of the lower page ends.

FIG. 14 is a timing chart of the lower-page tracking operation of the semiconductor storage device according to the first embodiment. FIG. 14 corresponds to steps ST22 and ST25 in FIG. 13. That is, the lower-page tracking includes a test reading period corresponding to the period from time T11 to time T12, and a loop period of the lower-page shift reading corresponding to the period from time T13_0 to time T15_N. The loop period for the lower-page shift reading includes lower-page shift read operations that are performed (N+1) times. The lower-page shift reading in a (n+1)th loop corresponds to the period from time T13_n to time T15_n. In addition, in the lower-page shift reading, the read voltage is shifted in a first search range which is a certain voltage range, and a second search range which is discontinuous to the first search range and which is a voltage range higher than the first search range. Here, when two certain ranges are "discontinuous", the two ranges do not have an overlapped range and are not in contact with each other.

As illustrated in FIG. 14, in a period from time T11 to time T12, the row decoder 27 applies a voltage Vt_low to the selected word line WL and the voltage VREAD to the unselected word lines WL. Note that the voltage Vt_low is greater than the read voltage in the first search range and smaller than the read voltage in the second search range. In addition, the voltage Vt_low is equal to the predetermined read voltage CRdef of the "C" level, for example.

In a first loop, the row decoder 27 applies the voltage AR0 to the selected word line WL from time T13_0 to time T14_0, and applies the voltage ER0 from time T14_0 to time T15_0. In addition, the row decoder 27 applies the voltage VREAD to the unselected word lines WL from time T13_0 to time T15_0.

Subsequently, in a second loop, the row decoder 27 applies a voltage AR1 to the selected word line WL from time T13_1 to the time T14_1, and applies a voltage ER1 from time T14_1 to time T15_1. In addition, the row decoder 27 applies the voltage VREAD to the unselected word lines WL from the time T13_1 to time T15_1.

As such, in a (n+1)th loop, the row decoder 27 applies the voltage ARn to the selected word line WL from time T13_$n$ to time T14_$n$, and applies the voltage ERn to the selected word line WL from time T14_$n$ to time T15_$n$. In addition, the row decoder 27 applies the voltage VREAD to the unselected word lines WL from time T13_$n$ to time T15_$n$.

Note that the voltages ARn and ERn increase, for example, by shift amounts $\Delta V1a$ and $\Delta V2e$, respectively, as the loop count is incremented. That is, for example, the first search range is the voltage AR0 at the left and the first search range is a voltage ARN at the right. In addition, for example, the second search range is the voltage ER0 at the left and the second search range is the voltage ERN at the right. Note that the shift amounts ΔV1a and ΔV2e may be set equal to each other, for example.

Figure 15:
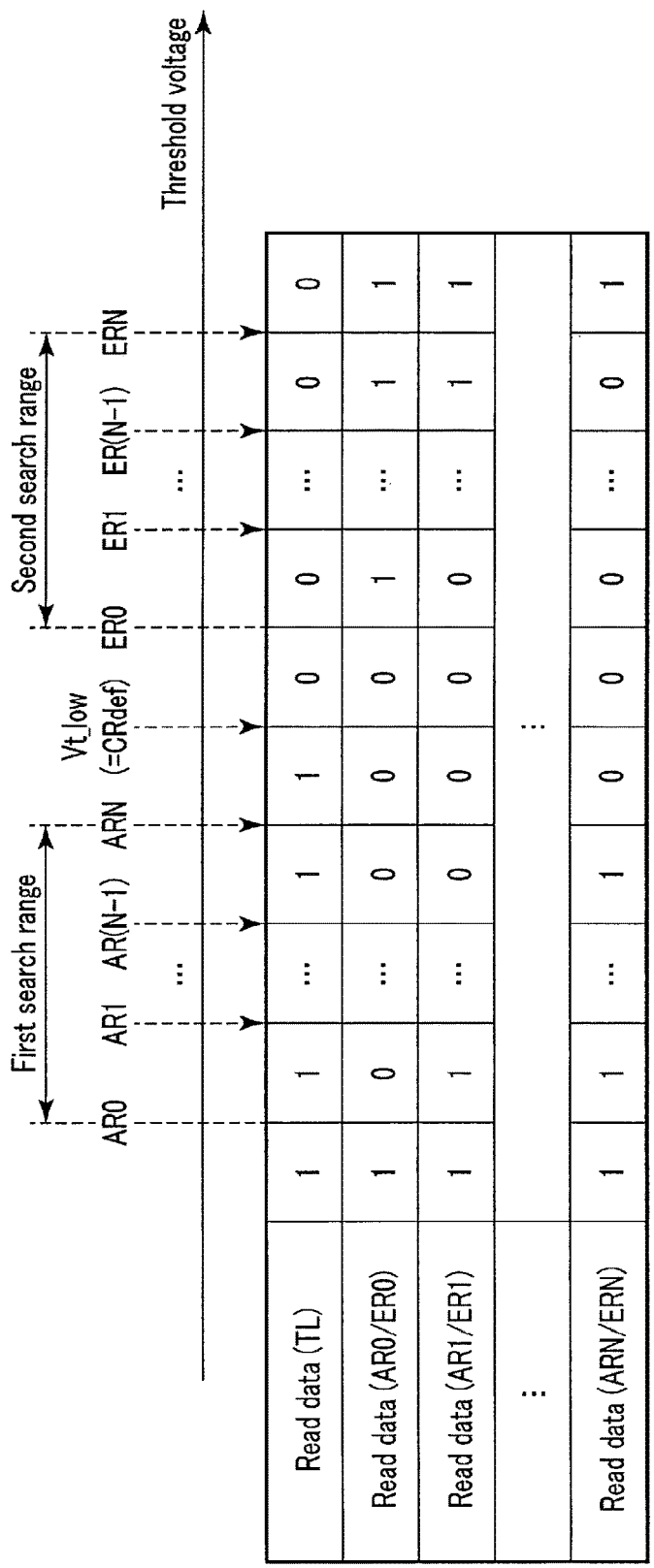
FIG. 15 is a table that shows data read by the lower-page tracking operation in the semiconductor storage device according to the first embodiment.

FIGS. 15 and 16 are tables of the read data and the separated data in the lower-page tracking of the semiconductor storage device according to the first embodiment, respectively. FIG. 15 corresponds to steps ST22 and ST25 in FIG. 13, and shows the data TL read by the test reading of the lower page and the data ARn/ERn read by the lower-page shift reading. FIG. 16 corresponds to step ST26 in FIG. 13, and shows the separated data ARsn and ERsn computed based on the read data TL and ARn/ERn.

As illustrated in FIG. 15, the read data TL is data "1" in a case where the threshold voltage of the memory cell transistor MT is less than the voltage VT_low, and is data "0" in a case where the threshold voltage of the memory cell transistor MT is equal to or greater than the voltage VT_low.

The read data AR0/ER0 is data "1" in a case where the threshold voltage of the memory cell transistor MT is less than the voltage AR0. The read data AR0/ER0 is data "0" in a case where the threshold voltage of the memory cell transistor MT is equal to or greater than the voltage AR0 and less than the voltage ER0. The read data AR0/ER0 is data "1" in a case where the threshold voltage of the memory cell transistor MT is equal to or greater than the voltage ER0.

The read data AR1/ER1 is data "1" in a case where the threshold voltage of the memory cell transistor MT is less than the voltage AR1. The read data AR1/ER1 is data "0" in a case where the threshold voltage of the memory cell transistor MT is equal to or greater than the voltage AR1 and less than the voltage ER1. The read data AR1/ER1 is data "1" in a case where the threshold voltage of the memory cell transistor MT is equal to or greater than the voltage ER1.

So, the read data ARn/ERn in the (n+1)th loop is data "1" when the threshold voltage of the memory cell transistor MT is less than the voltage ARn. The read data ARn/ERn is data "0" in a case where the threshold voltage of the memory cell transistor MT is equal to or greater than the voltage ARn and is less than the voltage ERn. The read data ARn/ERn is data "1" in a case where the threshold voltage of the memory cell transistor MT is equal to or greater than the voltage ERn.

As illustrated in FIG. 16, the separated data ARs0 is data "1" in a case where the threshold voltage of the memory cell transistor MT is less than the voltage AR0, and is data "0" in a case where the threshold voltage of the memory cell transistor MT is equal to or greater than the voltage AR0.

The separated data ARs1 is data "1" in a case where the threshold voltage of the memory cell transistor MT is less than the voltage AR1, and is data "0" when the threshold voltage of the memory cell transistor MT is equal to or greater than the voltage AR1.

As such, the separated data ARsn is data "1" in a case where the threshold voltage of the memory cell transistor MT is less than the voltage ARn, and is data "0" in a case where the threshold voltage of the memory cell transistor MT is equal to or greater than the voltage ARn. That is, the number of the separated data ARsn of "1" (bit count) corresponds to the number of memory cell transistors MT (number of ON-cells) the threshold voltage for which is less than the voltage ARn.

In contrast, the separated data ERs0 is data "0" in a case where the threshold voltage of the memory cell transistor MT is less than the voltage ER0, and is data "1" in a case where the threshold voltage of the memory cell transistor MT is equal to or greater than the voltage ER0.

The separated data ERs1 is data "0" in a case where the threshold voltage of the memory cell transistor MT is less than the voltage ER1, and is data "1" in a case where the threshold voltage of the memory cell transistor MT is equal to or greater than the voltage ER1.

Thus, the separated data ERsn is data "0" in a case where the threshold voltage of the memory cell transistor MT is less than the voltage ERn, and is data "1" in a case where the threshold voltage of the memory cell transistor MT is equal to or greater than the voltage ERn. That is, the number of the separated data ERsn of "0" corresponds to the number of memory cell transistors MT the threshold voltage of which is less than the voltage ERn.

Therefore, in step ST27 of FIG. 13, the controller 10 calculates the bit count of the separated data ARsn and the bit count of the separated data ERsn, and therefore, the controller 10 can monitor the number of ON-cells at the voltage ARn and the number of ON-cells at the voltage ERn, respectively. In addition, the controller 10 calculates the amount of a change in the bit counts between the separated data ARsn and ARs(n+1) and the amount of a change in the bit counts between the separated data ERsn and ERs(n+1), and therefore the controller 10 can monitor the amounts of changes in the number of ON-cells between the voltage ARn and AR(n+1) and the amounts of changes in the number of ON-cells between the voltages ERn and ER(n+1), respectively.

Note that the separated data ARsn may be derived by an operation of the read data TL and ARn/ERn, for example. For example, the operation unit OP may generate the separated data ARsn by performing an AND operation between the read data TL and the read data ARn/ERn (ARsn=TL AND (ARn/ERn)).

In addition, the separated data ERsn may be derived by an operation of the read data TL and ARn/ERn, for example. For example, the operation unit OP may generate the separated data ERsn by performing an AND operation between the NOT operation result ⁻TL of the read data TL and the read data ARn/ERn (ERsn=⁻TL AND (ARn/ERn)). Note that the symbol "⁻" used herein denotes an inversion.

Further, note that the operation unit OP may generate the separated data ERsn by an arbitrary operation, without being limited to the above example. For example, the operation unit OP may generate the separated data ERsn by performing an OR operation between the read data TL and the NOT operation result of the read data (⁻ARn/ERn) (ERsn=TL OR (⁻ARn/ERn)). In this case, the separated data ERsn is data "1" in a case where the threshold voltage of the memory cell transistor MT is less than the voltage ERn, and is data "0" in a case where the threshold voltage of the memory cell transistor MT is equal to or greater than the voltage ERn.

As described above, in the lower-page tracking, the semiconductor storage device 20 generates a set of (N+1) separated data ARs0, ARs1, . . . , and ARsN, and a set of (N+1) separated data ERs0, ERs1, . . . , and ERsN, by operation using one test reading and (N+1) shift readings. Then, the controller 10 calculates (N+1) bit counts in each of the discontinuous read voltage ranges (the first search range and the second search range) in each of the generates two sets of the separated data. The controller 10 calculates the amounts of 2N changes in bit counts based on the 2×(N+1) bit counts. Therefore, in the lower-page tracking, data for enabling the bit count tracking in the first search range and the second search range is generated.

1.2.2.4 Upper-Page Tracking

Next, an upper-page tracking operation of the semiconductor storage device according to the first embodiment will be described. As described above, the upper-page tracking operation is identical to the lower-page tracking operation except the magnitude of the voltage applied to the selected word line WL.

Figure 17:
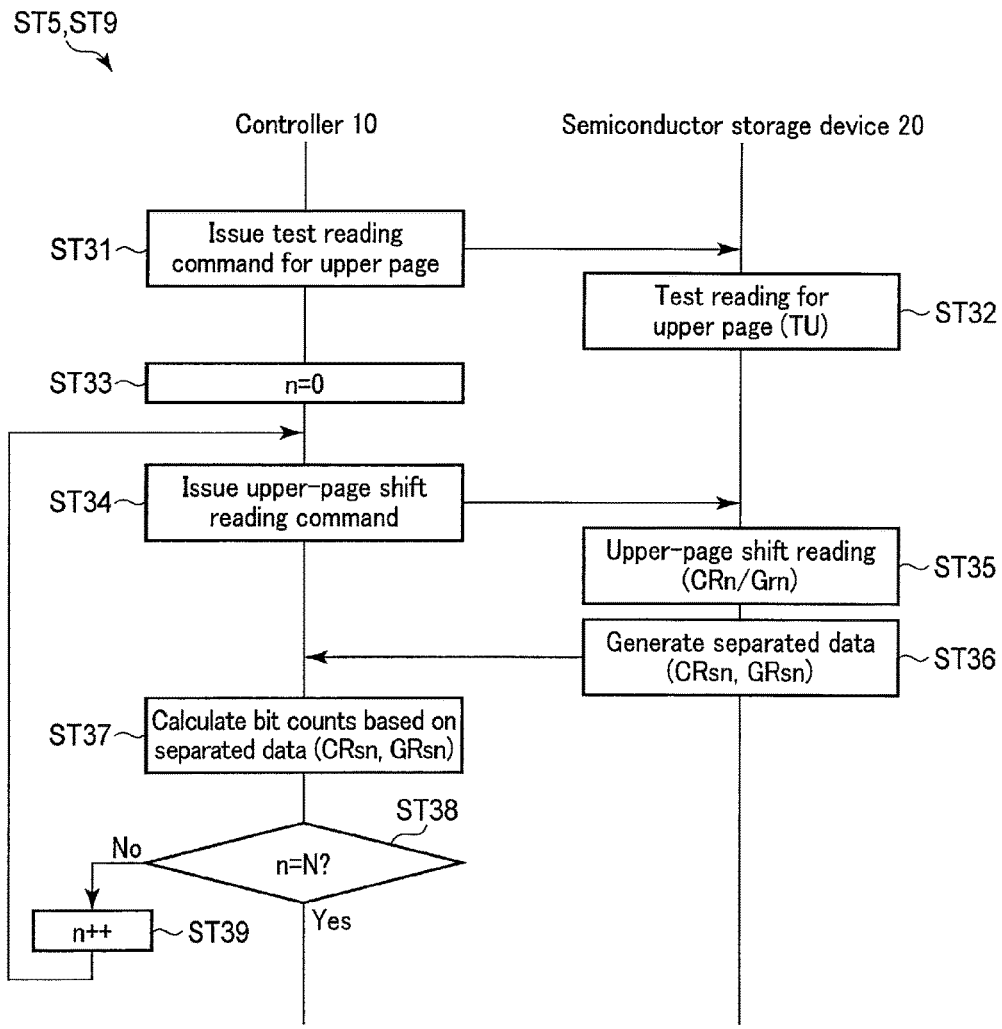
FIG. 17 is a flowchart of an upper-page tracking operation in the semiconductor storage device according to the first embodiment.

FIG. 17 is a flowchart of the upper-page tracking operation of the semiconductor storage device according to the first embodiment. The upper-page tracking operation is an operation common to steps ST5 and ST9 in FIG. 12.

As illustrated in FIG. 17, in step ST31, the controller 10 issues a test reading command for the upper page to the semiconductor storage device 20.

In step ST32, the semiconductor storage device 20 executes the test reading for the upper page, and reads read data TU. The semiconductor storage device 20 holds the read data TU in the latch (for example, the latch ADL).

In step ST33, the controller 10 initializes loop processes to be executed in the following steps ST34 to ST39 (n=0).

In step ST34, the controller 10 issues a shift reading command for the upper page to the semiconductor storage device 20.

In step ST35, the semiconductor storage device 20 executes the shift reading of the upper page, and in a (n+1)th loop of processes, reads read data CRn/GRn (CR0/GR0, CR1/GR1, CRN/GRN). The semiconductor storage device 20 holds the read data CRn/GRn in the latch (for example, the latch BDL). The read data CRn/GRn obtained in the processes of the (n+1)th loop corresponds to the result of the shift reading of the upper page as presented using voltages CRn and GRn. Therefore, the read data CRn/GRn has data "0" or "1" in each bit thereof based on the relationship between the corresponding threshold voltage of the memory cell transistor MT and the voltages CRn and GRn.

In step ST36, the semiconductor storage device 20 generates separated data CRsn (CRs0, CRs1, . . . , CRsN) and GRsn (GRs0, GRs1, . . . , GRsN) based on an operation of the read data TU and CRn/GRn held in the latches. Then, the semiconductor storage device 20 transmits the separated data CRsn and GRsn to the controller 10. The separated data CRsn and GRsn have partial information of the read data CRn/GRn. Specifically, the separated data CRsn has data "0" or "1" in each bit that is based on the relationship between the threshold voltage of the corresponding memory cell transistor MT and the voltage CRn. In each bit, the separated data GRsn has data "0" or "1" that is based on the relationship between the threshold voltage of the corresponding memory cell transistor MT and the voltage GRn.

In step ST37, the controller 10 calculates a bit count based on the separated data CRsn and a bit count based on the separated data GRsn.

In step ST38, the controller 10 determines whether or not to continue the loop processes. Specifically, when the value n is not equal to the value N (step ST38; No), the process proceeds to step ST39 where the loop count is incremented, and then returns to step ST34. In a case where the value n is equal to the value N (step ST38; Yes), the tracking operation of the upper page ends.

Figure 18:
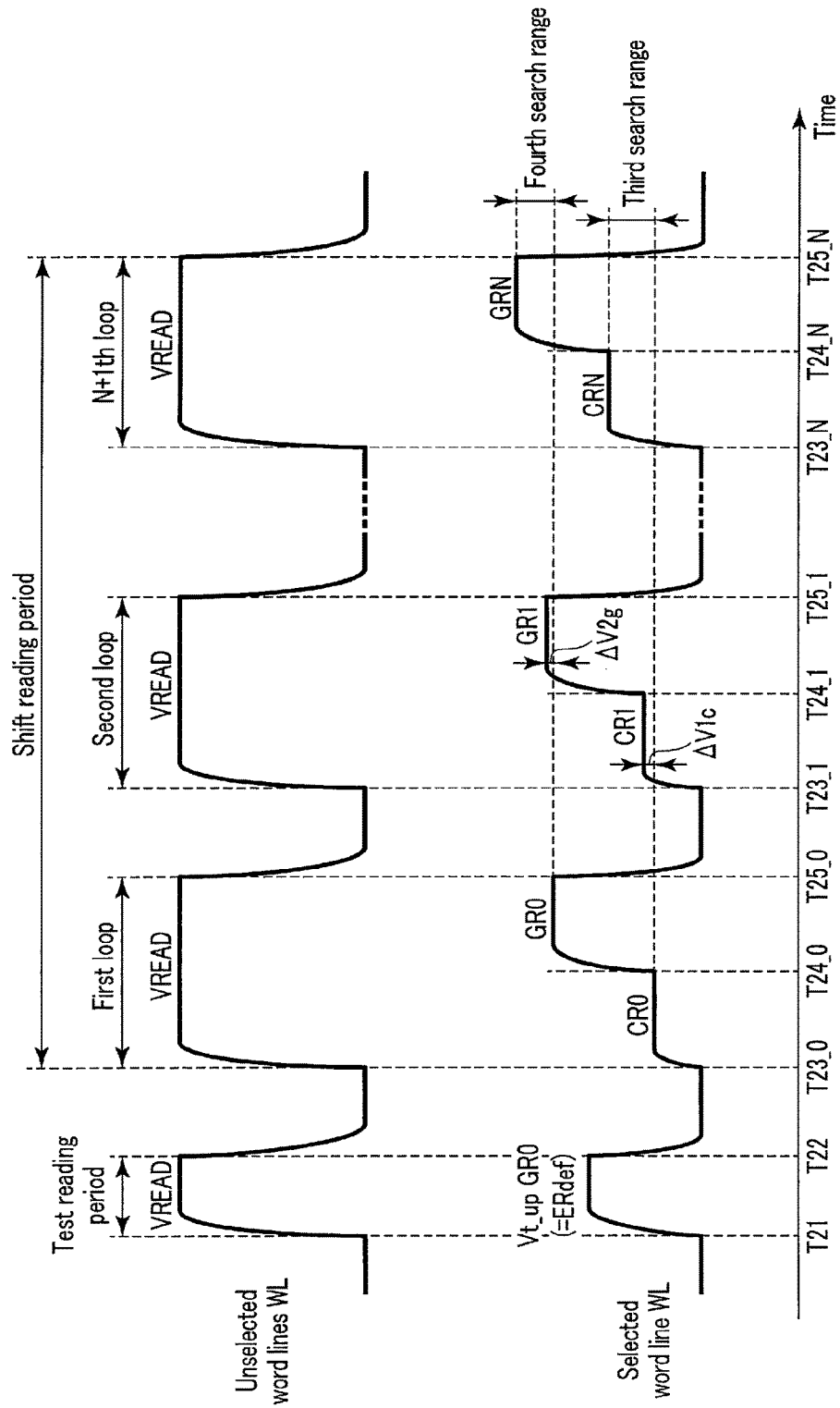
FIG. 18 is a timing chart of the upper-page tracking operation in the semiconductor storage device according to the first embodiment.

FIG. 18 is a timing chart for illustrating the upper-page tracking of the semiconductor storage device according to the first embodiment. FIG. 18 corresponds to steps ST32 and ST35 in FIG. 17. That is, the upper-page tracking includes a test reading period corresponding to the period from time T21 to time T22 and a loop period for the upper-page shift reading corresponding to the period from time T23_0 to time T25_N. The upper-page shift reading includes shift read operations performed (N+1) times. The upper-page shift reading in a (n+1)th loop corresponds to the period from time T23_n to time T25_n. In the upper page shift reading, the read voltage is shifted within a third search range, which is a certain voltage range, and also within a fourth search range, which is discontinuous to the third search range and is a voltage range higher than the third search range.

As illustrated in FIG. 18, in the period from time T21 to time T22, the row decoder 27 applies a voltage Vt_up to the selected word line WL and applies the voltage VREAD to the unselected word lines WL. Note that the voltage Vt_up is greater than the read voltage in the third search range and less than the read voltage in the fourth search range. In addition, the voltage Vt_up is equal to the predetermined read voltage ERdef of the "E" level, for example.

In a first loop, the row decoder 27 applies a voltage CR0 to the selected word line WL from time T23_0 to time T24_0, and applies a voltage GR0 from time T24_0 to time T25_0. In addition, the row decoder 27 applies the voltage VREAD to the unselected word lines WL from time T23_0 to time T25_0.

Subsequently, in the second loop, the row decoder 27 applies a voltage CR1 to the selected word line WL from time T23_1 to time T24_1, and applies a voltage GR1 from time T24_1 to time T25_1. In addition, the row decoder 27 applies the voltage VREAD to the unselected word lines WL from time T23_1 to time T251.

As such, in the (n+1)th loop, the row decoder 27 applies the voltage CRn to the selected word line WL from time T23_n to time T24_n, and applies the voltage GRn from time T24_n to time T25_n. In addition, the row decoder 27 applies the voltage VREAD to the unselected word lines WL from time T23_n to time T25_n.

Note that the voltages CRn and GRn increase by shift amounts $\Delta V1c$ and $\Delta V2g$, respectively, for example, as the loop count is incremented. That is, for example, the third search range shown in the left is the voltage CR0 and the third search range shown in the right is a voltage CRN. In addition, for example, the fourth search range shown in the left is the voltage GR0 and the fourth search range shown in the right is a voltage GRN. Note that the shift amounts $\Delta V1c$ and $\Delta V2g$ may be set equal to each other, for example. In addition, the shift amounts $\Delta V1c$ and $\Delta V2g$ may be equal to the shift amounts $\Delta V1a$ and $\Delta V2e$, for example.

Figure 20:
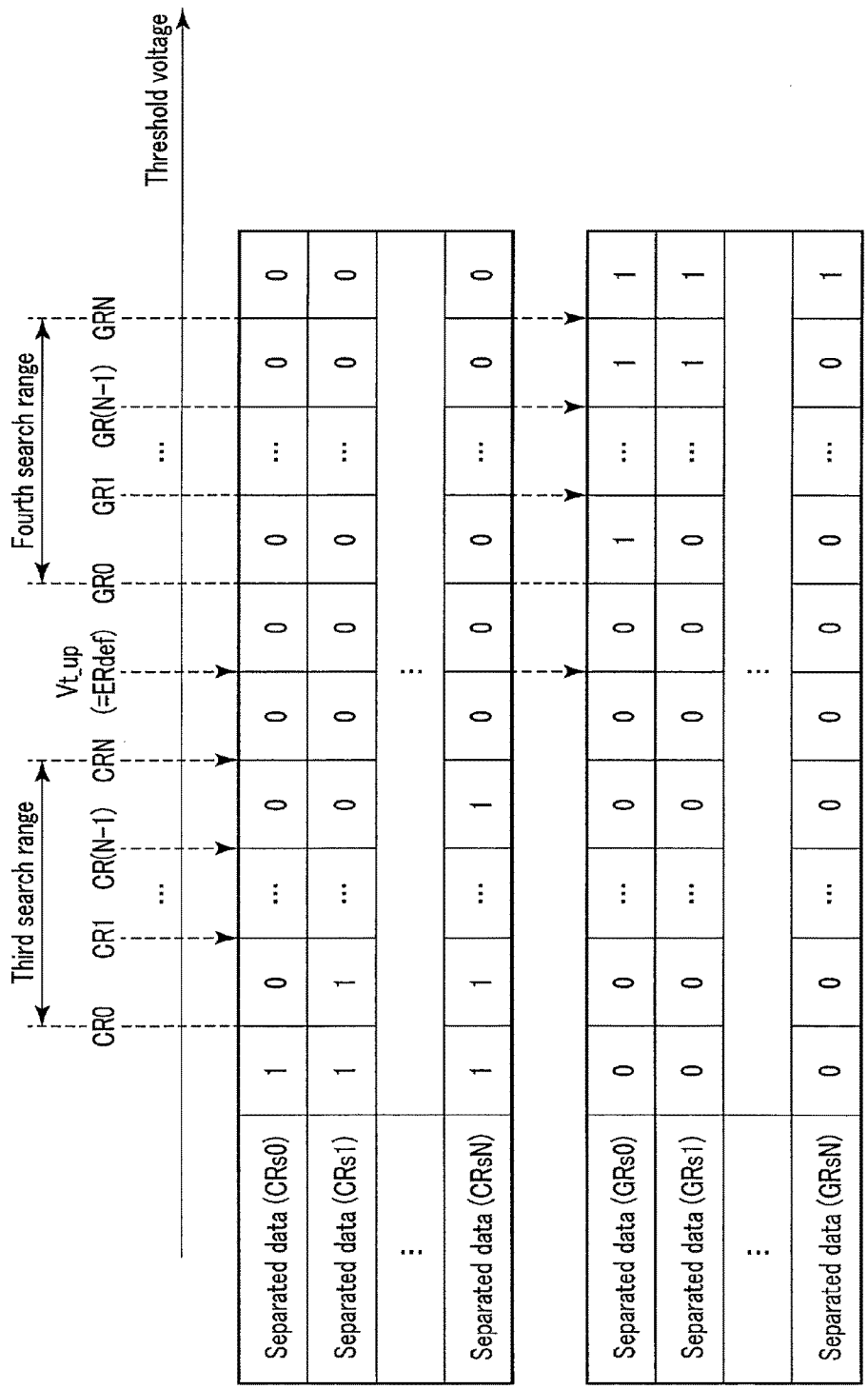
FIG. 20 is a table that shows data separated by the upper-page tracking operation in the semiconductor storage device according to the first embodiment.

FIGS. 19 and 20 are tables of read data and separated data in the upper-page tracking of the semiconductor storage device according to the first embodiment, respectively. FIG. 19 corresponds to steps ST32 and ST35 in FIG. 17, and shows the read data TU in the upper-page test reading and the read data CRn/GRn in the upper-page shift reading. FIG. 20 corresponds to step ST36 in FIG. 17, and shows the separated data CRsn and GRsn generated based on the read data TU and CRn/GRn.

As shown in FIG. 19, the read data TU is data "1" in a case where the threshold voltage of the memory cell transistor MT is less than the voltage VT_up, and is data "0" in a case where the threshold voltage of the memory cell transistor MT is equal to or greater than the voltage VT_up.

The read data CR0/GR0 is data "1" in a case where the threshold voltage of the memory cell transistor MT is less than the voltage CR0. The read data CR0/GR0 is data "0" in a case where the threshold voltage of the memory cell transistor MT is equal to or greater than the voltage CR0 and less than the voltage GR0. The read data CR0/GR0 is data "1" in a case where the threshold voltage is equal to or greater than the voltage GR0.

The read data CR1/GR1 is data "1" in a case where the threshold voltage of the memory cell transistor MT is less than the voltage CR1. The read data CR1/GR1 is data "0" in a case where the threshold voltage is equal to or greater than the voltage CR1 and less than the voltage GR1. The read data CR1/GR1 is data "1" in a case where the threshold voltage of the memory cell transistor MT is equal to or greater than the voltage GR1.

As such, the data CRn/GRn read in the (n+1)th loop is data "1" in a case where the threshold voltage of the memory cell transistor MT is less than the voltage CRn. The read data CRn/GRn is data "0" in a case where the threshold voltage of the memory cell transistor MT is equal to or greater than the voltage CRn and is less than the voltage GRn. The read data CRn/GRn is data "1" in a case where the threshold voltage of the memory cell transistor MT is equal to or greater than the voltage GRn.

As illustrated in FIG. 20, the separated data CRs0 is data "1" in a case where the threshold voltage of the memory cell transistor MT is less than the voltage CR0, and is data "0" in a case where the threshold voltage of the memory cell transistor MT is equal to or greater than voltage CR0.

The separated data CRs1 is data "1" in a case where the threshold voltage of the memory cell transistor MT is less than the voltage CR1, and is data "0" in a case where the threshold voltage of the memory cell transistor MT is equal to or greater than the voltage CR1.

As such, the separated data CRsn is data "1" in a case where the threshold voltage of the memory cell transistor MT is less than the voltage CRn, and is data "0" in a case where the threshold voltage of the memory cell transistor MT is equal to or greater than the voltage CRn. That is, the number of data "1" in the separated data CRsn corresponds to the number of memory cell transistors MT the threshold voltage of which is less than the voltage CRn.

In contrast, the separated data GRs0 is data "0" in a case where the threshold voltage of the memory cell transistor MT is less than the voltage GR0, and is data "1" in a case where the threshold voltage of the memory cell transistor MT is equal to or greater than the voltage GR0.

The separated data GRs1 is data "0" in a case where the threshold voltage of the memory cell transistor MT is less than the voltage GR1, and is data "1" in a case where the threshold voltage of the memory cell transistor MT is equal to or greater than the voltage GR1.

As such, the separated data GRsn is data "0" in a case where the threshold voltage of the memory cell transistor MT is less than the voltage GRn, and is data "1" in a case where the threshold voltage of the memory cell transistor MT is equal to or greater than the voltage GRn. That is, the number of data "0" in the separated data GRsn corresponds to the number of memory cell transistors MT the threshold voltage of which is less than the voltage GRn.

Therefore, in step ST37 of FIG. 17, the controller 10 calculates the bit count of the separated data CRsn and the bit count of the separated data GRsn, and therefore, the controller 10 monitors the number of ON-cells at the voltage CRn and the number of ON-cells at the voltage GRn, respectively. In addition, the controller 10 calculates the amounts of changes in the bit counts between the separated data CRsn and CRs(n+1) and the amounts of changes in the bit counts between the separated data GRsn and GRs(n+1), and therefore the controller 10 monitors the amounts of changes in the number of ON-cells between the voltage CRn and CR(n+1) and the amounts of changes in the number of ON-cells between the voltages GRn and GR(n+1), respectively.

Note that the separated data CRsn is generated by an operation based on, for example, the read data TU and CRn/GRn. For example, the operation unit OP can generate the separated data CRsn by performing an AND operation between the read data TU and the read data CRn/GRn (CRsn=TU AND (CRn/GRn)).

In addition, the separated data GRsn is generated by an operation based on the read data TU and CRn/GRn. For example, the operation unit OP can generate the separated data GRsn by performing an AND operation between the NOT operation result of the read data TU (⁻TU) and the read data CRn/GRn (GRsn=⁻TU AND (CRn/GRn)).

Note that the operation unit OP may generate the separated data GRsn by an arbitrary operation, without being limited to the above example. For example, the operation unit OP may generate the separated data GRsn by performing an OR operation between the read data TU and the NOT operation result of the read data (⁻CRn/GRn) (GRsn=TU OR (⁻CRn/GRn)). In this case, the separated data GRsn is data "1" in a case where the threshold voltage of the memory cell transistor MT is less than the voltage GRn, and is data "0" in a case where the threshold voltage of the memory cell transistor MT is equal to or greater than the voltage GRn.

As described above, in the upper-page tracking, the semiconductor storage device 20 generates a set of the (N+1) number of separated data CRs0, CRs1, ..., and CRsN, and a set of the (N+1) number of separated data GRs0, GRs1, ..., and GRsN, in one test reading and (N+1) shift readings. Then, the controller 10 calculates (N+1) bit counts of each of the two sets of separated data in use of the discontinuous read voltage ranges (the third search range and the fourth search range). The controller 10 calculates the amounts of 2N changes in the bit counts based on the 2×(N+1) bit counts. Therefore, in the upper-page tracking, data enabling the bit count tracking in the third search range and the fourth search range are generated.

1.2.2.5 Middle-Page Tracking

Next, the middle-page tracking operation of the semiconductor storage device according to the first embodiment will be described. Since there are three reading levels in the middle-page tracking operation, a test read operation is performed twice. Therefore, the middle-page tracking operation differs from the lower-page tracking operation and the upper-page tracking operation in that data read in the shift reading is divided into three pieces.

Figure 21:
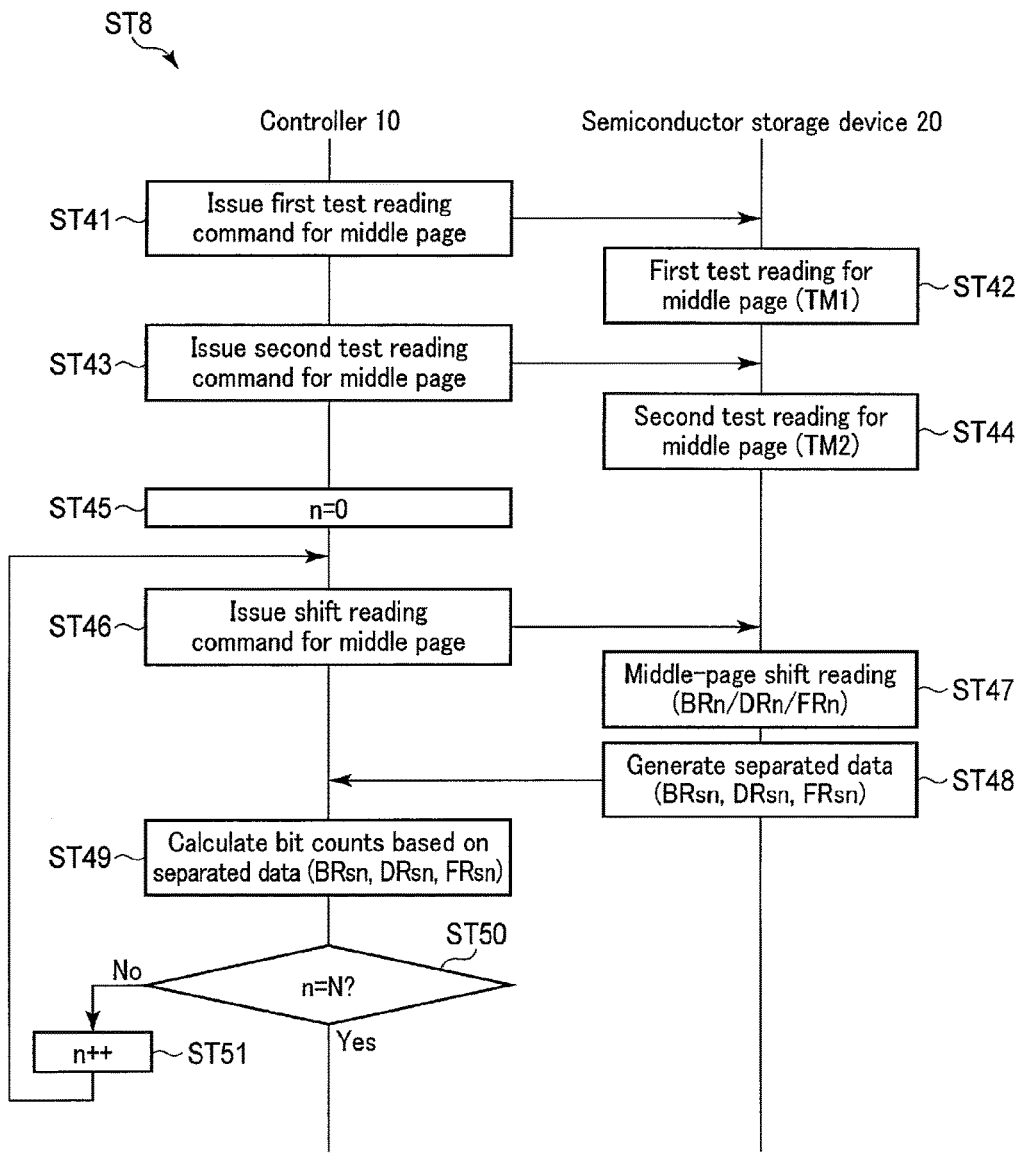
FIG. 21 is a flowchart of a middle-page tracking operation in the semiconductor storage device according to the first embodiment.

FIG. 21 is a flowchart of the middle-page tracking operation of the semiconductor storage device according to the first embodiment. The middle-page tracking operation illustrated in FIG. 21 is an operation corresponding to step ST8 in FIG. 12.

As illustrated in FIG. 21, in step ST41, the controller 10 issues a first test reading command for the middle page to the semiconductor storage device 20.

In step ST42, the semiconductor storage device 20 executes first test reading for the middle page, and reads data TM1. The semiconductor storage device 20 holds the read data TM1 in the latch (for example, the latch ADL).

In step ST43, the controller 10 issues a second test reading command for the middle page to the semiconductor storage device 20.

In step ST44, the semiconductor storage device 20 executes second test reading for the middle page, and reads data TM2. The semiconductor storage device 20 holds the read data TM2 in the latch (for example, the latch BDL).

In step ST45, the controller 10 initializes loop processes to be executed in the following steps ST46 to ST51 (n=0).

In step ST46, the controller 10 issues a shift reading command for the middle page to the semiconductor storage device 20.

In step ST47, the semiconductor storage device 20 executes shift reading of the middle page, and reads data BRn/DRn/FRn (BR0/DR0/FR0, BR1/DR1/FR1, . . . , BRN/DRN/FRN) in the (n+1)th loop processes. The semiconductor storage device 20 holds the read data BRn/DRn/FRn in the latch (for example, the latch CDL). The read data BRn/DRn/FRn in the (n+1)th loop processes correspond to the shift reading result of the middle page using voltages BRn, DRn, and FRn. Therefore, the read data BRn/DRn/FRn has data "0" or "1" in each bit that is based on the relationship between the corresponding threshold voltage of the memory cell transistor MT and the voltages BRn, DRn, and FRn.

In step ST48, the semiconductor storage device 20 operates separated data BRsn (BRs0, BRs1, . . . , BRsN), DRsn (DRs0, DRs1, . . . , DRsN) and FRsn (FRs0, FRs1, . . . , FRsN) based on the read data TM1 and TM2 and BRn/DRn/FRn held in the latches. Then, the semiconductor storage device 20 transmits the separated data BRsn, DRsn, and FRsn to the controller 10. The separated data BRsn, DRsn, and FRsn have partial information of the read data BRn/DRn/FRn. Specifically, the separated data BRsn has data "0" or "1" in each bit that is based on the relationship between the corresponding threshold voltage of the memory cell transistor MT and the voltage BRn. The separated data DRsn has data "0" or "1" in each bit that is based on the relationship between the corresponding threshold voltage of the memory cell transistor MT and the voltage DRn. The separated data FRsn has data "0" or "1" in each bit that is based on the relationship between the corresponding threshold voltage of the memory cell transistor MT and the voltage FRn.

In step ST49, the controller 10 calculates a bit count based on each of the separated data BRsn, DRsn, and FRsn.

In step ST50, the controller 10 determines whether or not to continue the loop processes. Specifically, in a case where the value n is not equal to the value N (step ST50; No), the process proceeds to step ST51 where the loop count is incremented, and then the process returns to step ST46. In a case where the value n is equal to the value N (step ST50; Yes), the tracking operation of the middle page ends.

Figure 22:
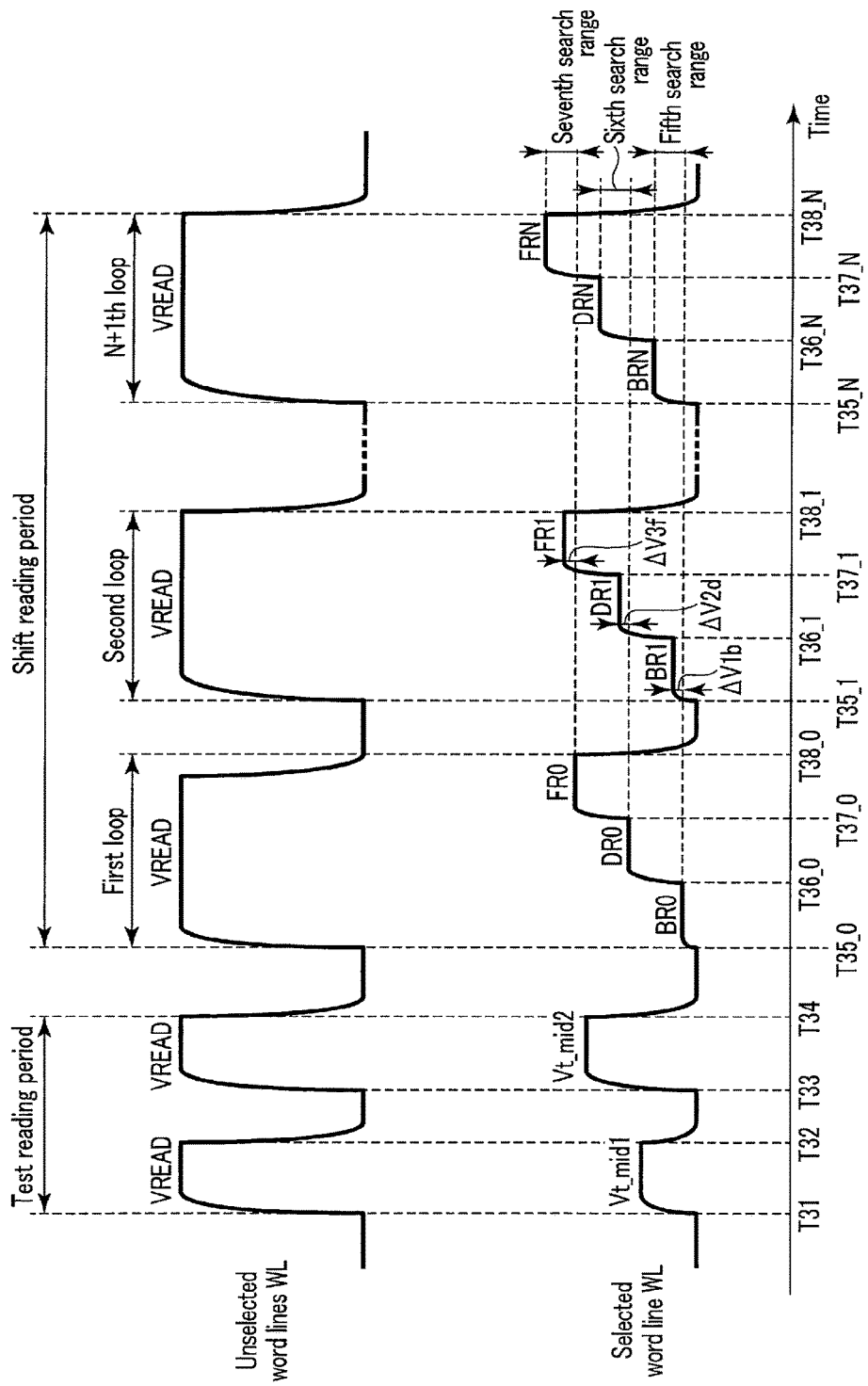
FIG. 22 is a timing chart of the middle-page tracking operation in the semiconductor storage device according to the first embodiment.

FIG. 22 is a timing chart of the middle-page tracking of the semiconductor storage device according to the first embodiment. FIG. 22 corresponds to steps ST42, ST44 and ST47 in FIG. 21. That is, the middle-page tracking includes a test reading period for the middle page corresponding to the period from time T31 to time T34, and a loop period of the middle page shift reading corresponding to the period from time T35_0 to time T38_N. The middle-page shift reading includes (N+1) shift readings. The middle-page shift reading in a (n+1)th loop corresponds to the period from time T35_n to time T38_n. In the middle-page shift reading, the read voltage is shifted in a fifth search range, which is a certain voltage range, in a sixth search range, which a voltage range higher than the voltage in the fifth search range, and in a seventh search range, which is a voltage range higher than the voltage in the sixth search range. Note that the fifth search range, the sixth search range, and the seventh search range are discontinuous to one another.

As illustrated in FIG. 22, in a period from time T31 to time T32, the row decoder 27 applies a voltage Vt_mid1 to the selected word line WL, and applies the voltage VREAD to the unselected word lines WL. Note that the voltage Vt_mid1 is greater than the read voltage in the fifth search range and less than the read voltage in the sixth search range.

In the period from time T33 to time T34, the row decoder 27 applies a voltage Vt_mid2 to the selected word line WL and the voltage VREAD to the unselected word lines WL. Note that the voltage Vt_mid2 is greater than the read voltage in the sixth search range and less than the read voltage in the seventh search range.

In a first loop, the row decoder 27 applies voltages BR0, DR0, and FR0 to the selected word line WL in the period from time T35_0 to time T36_0, in the period from time T36_0 to time T37_0, and in the period from time T37_0 to time T38_0, respectively. In addition, the row decoder 27 applies the voltage VREAD to the unselected word lines WL from time T35_0 to time T38_0.

Subsequently, in a second loop, the row decoder 27 applies voltages BR1, DR1, and FR1 to the selected word line WL in the period from time T35_1 to time T36_1, in the period from time T36_1 to time T37_1, and in the period from time T37_1 to time T38_1, respectively. In addition, the row decoder 27 applies the voltage VREAD to the unselected word lines WL from time T35_1 to time T38_1.

As such, in a (n+1)th loop, the row decoder 27 applies voltages BRn, DRn, and FRn to the selected word line WL in the period from time T35_n to time T36_n, in the period from time T36_n to time T37_n, and in the period from time T37_n to time T38_n, respectively. In addition, the row decoder 27 applies the voltage VREAD to the unselected word lines WL from time T35_n to time T38_n.

Note that the voltages BRn, DRn, and FRn increase, for example, by shift amounts $\Delta V1b$ $\Delta V2d$, and $\Delta V3f$, respectively, as the loop count is incremented. That is, for example, the left in the fifth search range is the voltage BR0 and the right in the fifth search range is a voltage BRN. In addition, for example, the left in the sixth search range is the voltage DR0 and the right in the sixth search range is a voltage DRN. In addition, for example, the left end in the seventh search range is the voltage FR0 and the right in the seventh search range is a voltage FRN. Note that the shift amounts $\Delta V1b$, $\Delta V2d$, and $\Delta V3f$ may be set equal to one another, for example. In addition, the shift amounts $\Delta V1b$, $\Delta V2d$, and $\Delta V3f$ may be equal to the shift amounts $\Delta V1a$, $\Delta V2e$, $\Delta V1c$, and $\Delta V2g$, for example.

Figure 23:
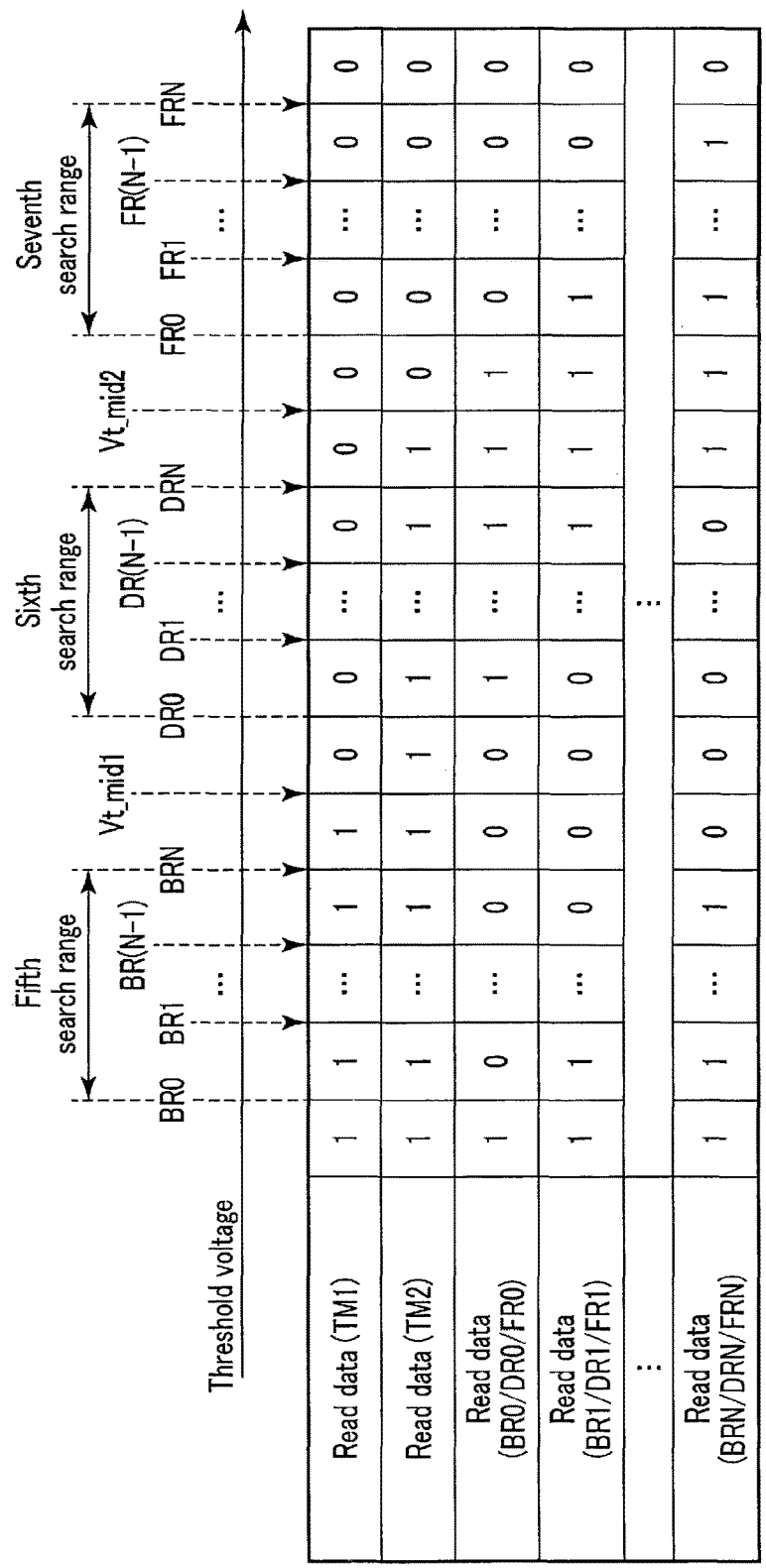
FIG. 23 is a table that shows data read by the middle-page tracking operation in the semiconductor storage device according to the first embodiment.
Figure 24:
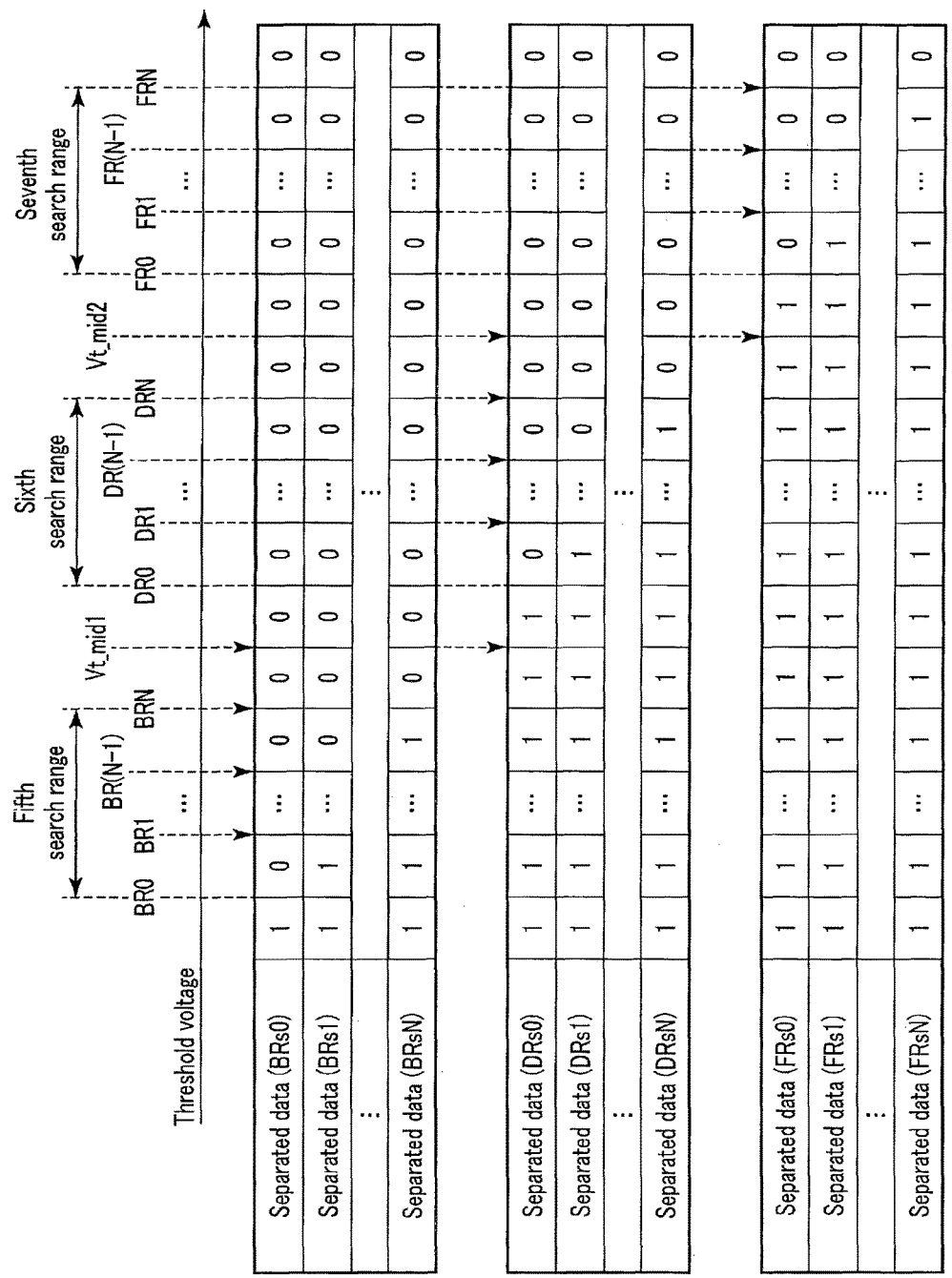
FIG. 24 is a table that shows data separated by the middle-page tracking operation of the semiconductor storage device according to the first embodiment.

FIGS. 23 and 24 are tables of the read data and the separated data in the middle-page tracking of the semiconductor storage device according to the first embodiment, respectively. FIG. 23 corresponds to steps ST42, ST44 and ST47 in FIG. 21, and shows the data TM1 read in the first test reading, the data TM2 read in the second test reading, and the data BRn/DRn/FRn read in the shift reading. FIG. 24 corresponds to step ST48 in FIG. 21, and shows the separated data BRsn, DRsn, and FRsn generated based on the read data TM1, TM2, and BRn/DRn/FRn.

As illustrated in FIG. 23, the read data TM1 is data "1" in a case where the threshold voltage of the memory cell transistor MT is less than the voltage Vt_mid1, and is data "0" in a case where the threshold voltage of the memory cell transistor MT is equal to or greater than the voltage Vt_mid1. In addition, the read data TM2 is data "1" in a case where the threshold voltage of the memory cell transistor MT is less than the voltage Vt_mid2, and is data "0" in a case where the threshold voltage of the memory cell transistor MT is equal to or greater than the voltage Vt_mid2.

The read data BR0/DR0/FR0 is data "1" in a case where the threshold voltage of the memory cell transistor MT is less than the voltage BR0. The read data BR0/DR0/FR0 is data "0" in a case where the threshold voltage of the memory cell transistor MT is equal to or greater than the voltage BR0 and less than the voltage DR0. The read data BR0/DR0/FR0 is data "1" in a case where the threshold voltage of the memory cell transistor MT is equal to or greater than the voltage DR0 and less than the voltage FR0. The read data BR0/DR0/FR0 is data "0" in a case where the threshold voltage of the memory cell transistor MT is equal to or greater than the voltage FR0.

In addition, the read data BR1/DR1/FR1 is data "1" in a case where the threshold voltage of the memory cell transistor MT is less than the voltage BR1. The read data BR1/DR1/FR1 is data "0" in a case where the threshold voltage is equal to or greater than the voltage BR1 and less than the voltage DR1. The read data BR1/DR1/FR1 is data "1" in a case where the threshold voltage of the memory cell transistor MT is equal to or greater than the voltage DR1 and is less than the voltage FR1. The read data BR1/DR1/FR1 is data "0" in a case where the threshold voltage of the memory cell transistor MT is equal to or greater than the voltage FR1.

As such, the read data BRn/DRn/FRn in the (n+1)th loop is data "1" in a case where the threshold voltage of the memory cell transistor MT is less than the voltage BRn. The read data BRn/DRn/FRn is data "0 in a case where the threshold voltage of the memory cell transistor MT is equal to or greater than the voltage BRn and less than the voltage DRn. The read data BRn/DRn/FRn is data "1 in a case where the threshold voltage of the memory cell transistor MT is equal to or greater than the voltage DRn and less than the voltage FRn. The read data BRn/DRn/FRn is data "0 in a case where the threshold voltage is equal to or greater than the voltage FRn.

As illustrated in FIG. 24, the separated data BRs0 is data "1" in a case where the threshold voltage of the memory cell transistor MT is less than the voltage BR0, and is data "0" in a case where the threshold voltage of the memory cell transistor MT is equal to or greater than the voltage BR0.

The separated data BRs1 is data "1" in a case where the threshold voltage of the memory cell transistor MT is less than the voltage BR1, and is data "0" in a case where threshold voltage of the memory cell transistor MT is equal to or greater than the voltage BR1.

As such, the separated data BRsn is data "1" in a case where the threshold voltage of the memory cell transistor MT is less than the voltage BRn, and is data "0" in a case where the threshold voltage of the memory cell transistor MT is equal to or greater than the voltage BRn. That is, the number of data "1" of the separated data BRsn corresponds to the number of memory cell transistors MT the threshold voltage of which is less than the voltage BRn.

Similarly, the separated data DRs0 is data "1" in a case where the threshold voltage of the memory cell transistor MT is less than the voltage DR0, and is data "0" in a case where the threshold voltage of the memory cell transistor MT is equal to or greater than the voltage DR0.

The separated data DRs1 is data "1" in a case where the threshold voltage of the memory cell transistor MT is less than the voltage DR1, and is data "0" in a case where the threshold voltage of the memory cell transistor MT is equal to or greater than voltage DR1.

As such, the separated data DRsn is data "1" in a case where the threshold voltage of the memory cell transistor MT is less than the voltage DRn, and is data "0" in a case where the threshold voltage of the memory cell transistor MT is equal to or greater than the voltage DRn. That is, the number of data "1" of the separated data DRsn corresponds to the number of memory cell transistors MT the threshold voltage of which is less than the voltage DRn.

Similarly, the separated data FRs0 is data "1" in a case where the threshold voltage of the memory cell transistor MT is less than the voltage FR0, and is data "0" in a case where the threshold voltage of the memory cell transistor MT is equal to or greater than the voltage FR0.

The separated data FRs1 is data "1" in a case where the threshold voltage of the memory cell transistor MT is less than the voltage FR1, and is data "0" in a case where the threshold voltage of the memory cell transistor MT is equal to or greater than the voltage FR1.

As such, the separated data FRsn is data "1" in a case where the threshold voltage of the memory cell transistor MT is less than the voltage FRn, and is data "0" in a case where the threshold voltage of the memory cell transistor MT is equal to or greater than the voltage FRn. That is, the number of data "1" of the separated data FRsn corresponds to the number of memory cell transistors MT the threshold voltage of which is less than the voltage FRn.

Therefore, in step ST49 of FIG. 21, the controller 10 calculates the bit count of the separated data BRsn, the bit count of the separated data DRsn, and the bit count of the separated data FRsn, and thereby, the controller 10 monitors the number of ON-cells at the voltage BRn, the number of ON-cells at the voltage DRn, and the number of ON-cells at the voltage FRn, respectively. In addition, the controller 10 calculates the amount of a change in bit counts between the separated data BRsn and BRs(n+1), the amount of a change in bit counts between the separated data DRsn and DRs(n+1), and the amount of a change in bit counts between the separated data FRsn and FRs(n+1), and thereby, the controller 10 monitors the amount of a change in the number of ON-cells between the voltage BRn and BR(n+1), the amount of a change in the number of ON-cells between the voltage DRn and DR(n+1), and the amount of a change in the number of ON-cells between the voltages FRn and FR(n+1), respectively.

Note that separated data BRsn is generated by an operation based on, for example, read data TM1 and BRn/DRn/FRn. For example, the operation unit OP can generate the separated data BRsn by performing an AND operation between the read data TM1 and the read data BRn/DRn/FRn (BRsn=TM1 AND (BRn/DRn/FRn)).

In addition, the separated data DRsn is generated by an operation based on the read data TM1, TM2, and BRn/DRn/FRn, for example. For example, the operation unit OP can generate the separated data DRsn by performing an OR operation between the read data TM1 and an AND operation between the read data TM2 and the NOT operation result of the read data BRn/DRn/FRn ($^-$BRn/DRn/FRn) (DRsn=TM1 OR (TM2 AND ($^-$BRn/DRn/FRn))).

In addition, the separated data FRsn is generated by an operation based on the read data TM2 and BRn/DRn/FRn, for example. For example, the operation unit OP can generate the separated data FRsn by performing an OR operation between the read data TM2 and the read data BRn/DRn/FRn (FRsn=TM2 OR (BRn/DRn/FRn)).

Note that the operation unit OP may generate the separated data DRsn and FRsn by an arbitrary operation, without being limited to the above example.

For example, the operation unit OP may generate the separated data DRsn by performing an AND operation on the NOT operation result of the read data TM1 ($^-$TM1), the read data TM2, and the NOT operation result of the read data BRn/DRn/FRn ($^-$BRn/DRn/FRn) (DRsn=$^-$TM1 AND TM2 AND ($^-$BRn/DRn/FRn)). In this case, the separated data DRsn is data "0" in a case where the threshold voltage of the memory cell transistor MT is less than the voltage Vt_mid1, the separated data DRsn is data "1" in a case where the threshold voltage of the memory cell transistor MT is equal to or greater than the voltage Vt_mid1 and less than the voltage DRn, and the separated data DRsn is data "0" in a case where the threshold voltage of the memory cell transistor MT is equal to or greater than the voltage DRn.

In addition, for example, the operation unit OP may generate the separated data FRsn by performing an AND operation on the NOT operation result of the read data TM2 (⁻TM2) and the read data BRn/DRn/FRn (FRsn=⁻TM2 AND (BRn/DRn/FRn)). In this case, the separated data FRsn becomes data "1" in a case where the threshold voltage of the memory cell transistor MT is equal to or greater than the voltage Vt_mid2 and is less than the voltage FRn, and is data "0" in a case where the threshold voltage is equal to or greater than the voltage FRn.

As described above, in the middle-page tracking, the semiconductor storage device 20 generates a set of (N+1) separated data BRs0, BRs1, . . . , and BRsN, a set of (N+1) separated data DRs0, DRs1, . . . , and DRsN, and a set of separated data FRs0, FRs1, . . . , and FRsN in the two test readings and the (N+1) shift readings. Then, the controller 10 calculates (N+1) bit counts of each of the three sets of computed separated data in each of the discontinuous read voltage ranges (the fifth search range, the sixth search range, and the seventh search range). The controller 10 calculates the 3N amounts of changes in 3×(N+1) bit counts. Therefore, in the middle-page tracking, data for enabling the bit count tracking in the fifth search range, the sixth search range, and the seventh search range is generated.

1.2.2.6 Coarse Tracking

Next, a coarse tracking operation of the semiconductor storage device according to the first embodiment will be described.

Figure 26:
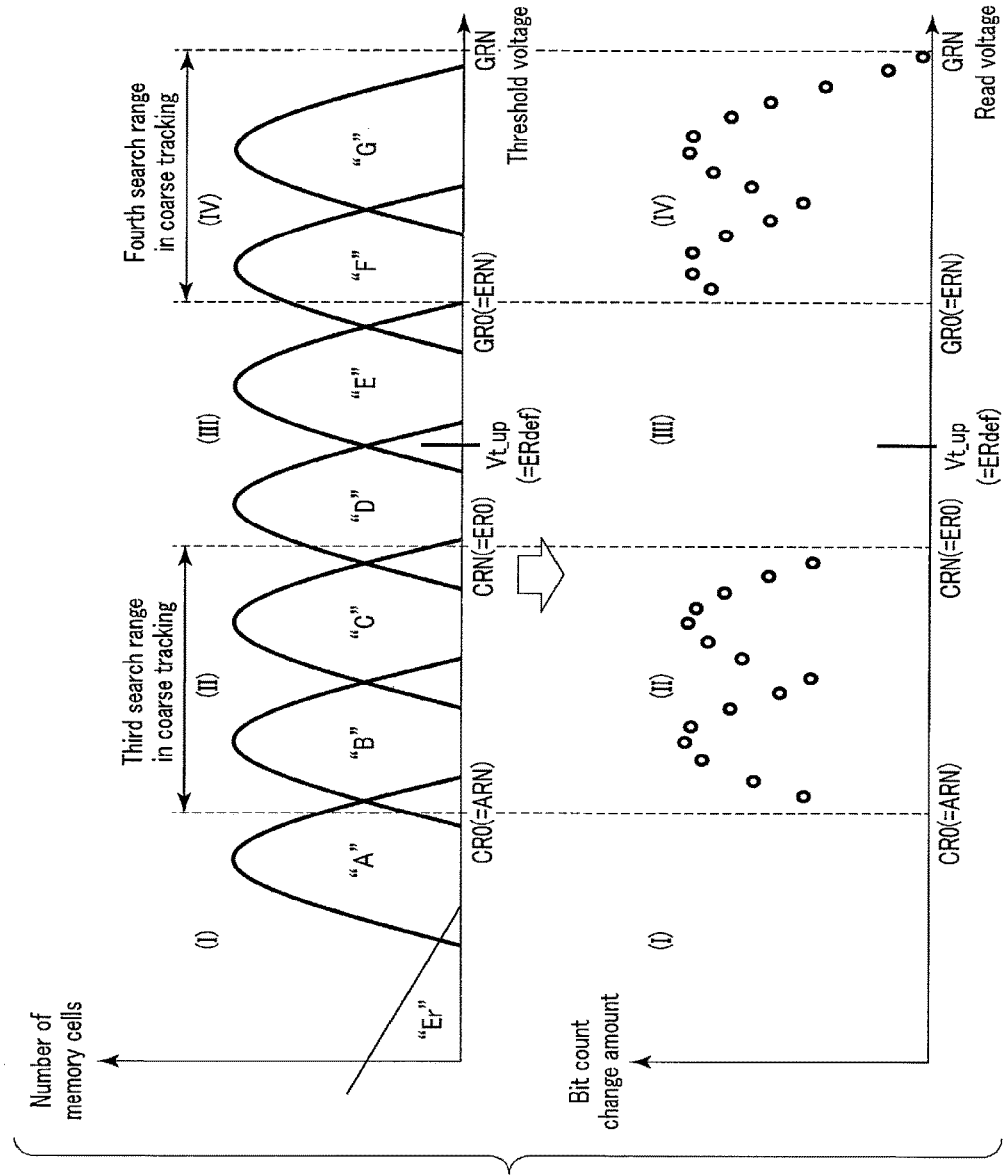
FIG. 26 schematically shows an upper-page tracking operation in the coarse tracking of the semiconductor storage device according to the first embodiment.
Figure 27:
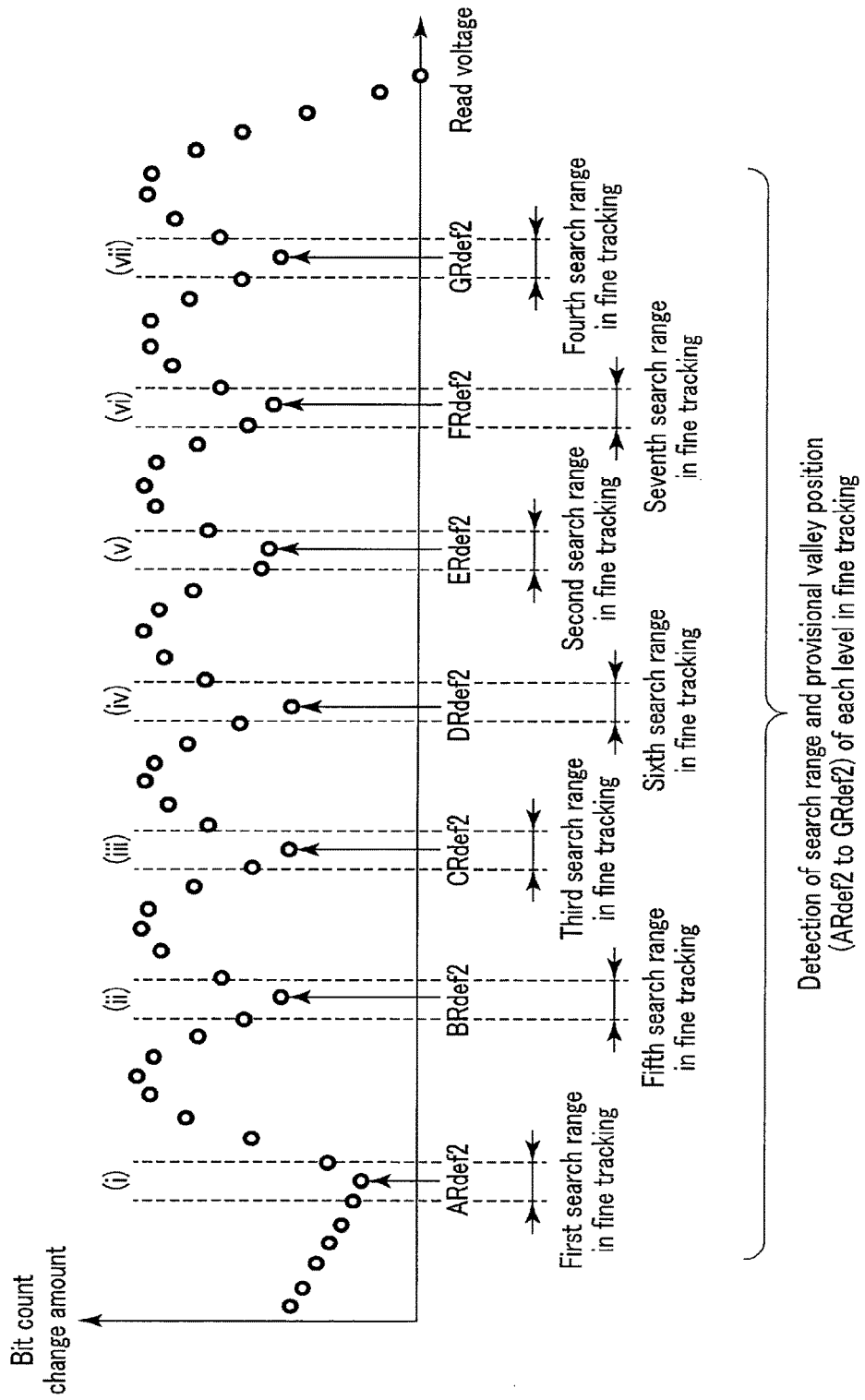
FIG. 27 schematically shows a coarse tracking operation in the semiconductor storage device according to the first embodiment.

FIGS. 25 to 27 are schematic diagrams illustrating the coarse tracking operation of the semiconductor storage device according to the first embodiment. FIGS. 25, 26, and 27 correspond to steps ST4, ST5, and ST6 in FIG. 12, respectively. That is, FIGS. 25, and 26 schematically illustrate the ranges of the read voltages in which the bit count tracking are performed based on the lower-page tracking and the upper-page tracking in the coarse tracking, respectively. FIG. 27 schematically illustrates provisional valley positions detected as a result of the coarse tracking and search ranges to be applied for the fine tracking.

In the coarse tracking according to the first embodiment, voltage ranges (in a full level) sufficiently covering voltage values each of which can be at a valley position between respective adjacent levels (seven in the case of the TLC) are taken as tracking ranges. Specifically, in the coarse tracking, the full level is divided into four consecutive ranges (I) to (IV). Here, if two ranges are "continuous", an end of one range and an opposed end of the other range have an identical voltage. The ranges (I) to (IV) correspond to the range of the smallest, second smallest, third smallest, and greatest search starting voltages, respectively.

Note that the ranges (I) to (IV) are described as continuous ranges in the first embodiment; however, the ranges (I) to (IV) are not limited to this, and may not be continuous.

As illustrated in a graph at the top of FIG. 25, the controller 10 sets the range (I) as a first search range, and the range (III) as a second search range. Specifically, for example, the voltages AR0 and ARN are set to voltages at the left end and the right end of the range (I), respectively. The voltages ER0 and ERN are set to voltages at the left end and the right end of range (III), respectively. In addition, the controller 10 sets the read voltage Vt_low (for example, the voltage CRdef) in the range (II), for example.

Then, the semiconductor storage device 20 executes the lower-page tracking including (N+1) shift readings in the ranges (I) and (III). In the shift readings, the read voltages are shifted all over the ranges (I) and (III) including their ends or boundaries. As a result of the lower-page tracking, the semiconductor storage device 20 generates (N+1) separated data ARsn over the entire range (I) and (N+1) separated data ERsn over the entire range (III).

As illustrated in a graph at the bottom of FIG. 25, the controller 10 calculates the amounts of changes in the bit counts at N points over the entire range (I) based on the (N+1) separated data ARsn. In addition, the controller 10 calculates the amounts of changes in the bit counts at N points over the entire range (III) based on the (N+1) separated data ERsn.

As such, by performing the lower-page tracking by the coarse tracking, the results of the bit count tracking over the entire ranges (I) and (III) are generated.

In addition, as illustrated in a graph at the top of FIG. 26, the controller 10 sets the range (II) as a third search range and the range (IV) as a fourth search range. Specifically, for example, the voltages CR0 and CRN are set to voltages at the left end and the right end of the range (II), respectively. Since the range (II) is continuous to the ranges (I) and (III), the voltage CR0 is equal to the voltage ARN and the voltage CRN is equal to the voltage ER0, for example. In addition, the voltages GR0 and GRN are set to voltages at the left end and the right end of range (IV), respectively. Since the range (IV) is continuous to the range (III), the voltage GR0 is equal to the voltage ERN, for example. In addition, the controller 10 sets the read voltage Vt_up (for example, the voltage ERdef) in the range (III), for example.

Then, the semiconductor storage device 20 executes the upper-page tracking including (N+1) shift readings in the ranges (II) and (IV). In the shift readings, the read voltages are shifted all over the ranges (II) and (IV). As a result of the upper-page tracking, the semiconductor storage device 20 generates (N+1) separated data CRsn over the entire range (II) and (N+1) separated data ERsn over the entire range (TV).

As illustrated in a graph at the bottom of FIG. 26, the controller 10 calculates the amounts of changes in the bit counts at N points over the entire range (II) based on the (N+1) separated data CRsn. In addition, the controller 10 calculates the amounts of changes in the bit counts at N points over the entire range (IV) based on the (N+1) separated data GRsn.

As described above, by performing the upper-page tracking in the coarse tracking, the results of the bit count tracking over the entire ranges (II) and (IV) are generated.

Thus, the 4N amounts of changes in the bit counts are calculated over the entire four consecutive ranges (I) to (IV). The controller 10 performs the bit count tracking based on the 4N amounts of changes in the bit counts, and detects all the provisional valley positions between all of the levels.

As illustrated in FIG. 27, when the amounts of changes in the bit counts calculated in the lower-page tracking and the upper-page tracking are plotted, the threshold voltage distributions of the memory cell transistor MT are reproduced over the entire region of the full level. The controller 10 detects seven points where the amount of the bit count change is locally minimal. The detected seven points are regarded as provisional valley positions between the "Er" level and the "A" level, between the "A" level and the "B" level, between the "B" level and the "C" level, between the "C" level and the "D" level, between the "D" level and the "E" level, between the "E" level and the "F" level, and between the "F" level and the "G" level, in ascending order of corresponding read voltages. In the following description, the read voltages corresponding to the detected seven points are denoted by ARdef2 to GRdef2, respectively, correspondingly to the predetermined read voltages ARdef to GRdef in order to distinguish the former and the latter read voltages.

In addition, the controller 10 detects, for example, voltage ranges (i) to (vii) each including one of the provisional valley positions. The ranges (i) to (vii) include the voltages ARdef2 to GRdef2, respectively. In addition, the ranges (i) to (vii) are discontinuous because the ranges (i) to (vii) are limited to the peripheries of the provisional valley positions. Note that in the example of FIG. 27, each of the ranges (i) to (vii) is detected as a voltage range having three points that includes, as a center point, the amount of the bit count change at the detected provisional valley position. However, the ranges (i) to (vii) are not limited to this. Arbitrary discontinuous ranges may be detected.

Consequently, the coarse tracking operation ends.

1.2.2.7 Fine Tracking

Next, the fine tracking operation of the semiconductor storage device according to the first embodiment will be described with reference to FIG. 27. As described above, in the coarse tracking operation, the bit count tracking of the lower-page tracking and the bit count tracking of the upper-page tracking are performed for the full level. In contrast, in the fine tracking, the bit count tracking of the lower-page tracking, the bit count tracking of the middle-page tracking, and the bit count tracking of the upper-page tracking are performed not for the full level but for limited ranges.

The controller 10 sets search ranges to be used for fine tracking based on the provisional valley positions. Specifically, the controller 10 sets the ranges (i) and (v) as a first search range and a second search range for the lower-page tracking in the fine tracking, respectively. In addition, the controller 10 sets the ranges (iii) and (vii) as a third search range and a fourth search range for the upper-page tracking in fine tracking, respectively. In addition, the controller 10 sets the ranges (ii), (iv), and (vi) as a fifth search range, a sixth search range, and a seventh search range for the middle-page tracking in the fine tracking, respectively.

Figure 28:
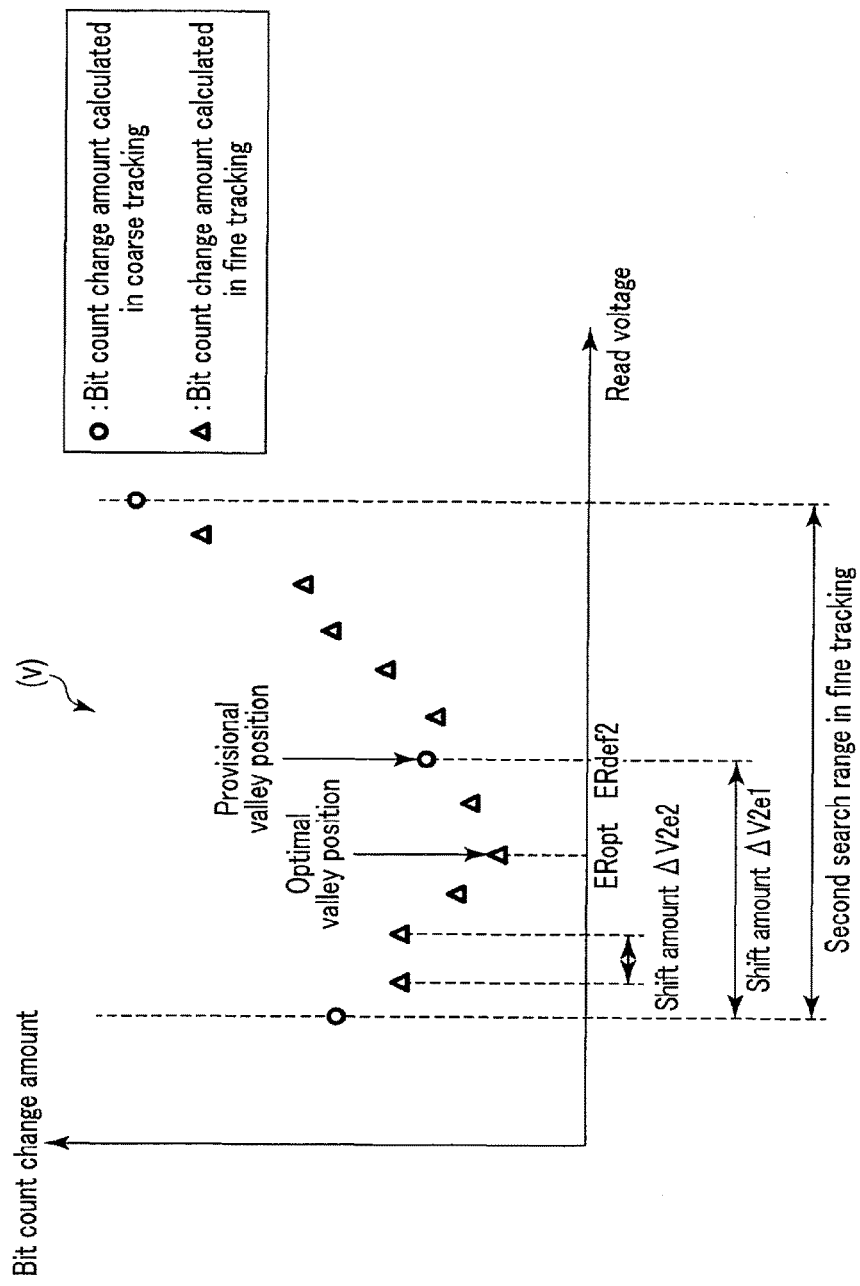
FIG. 28 schematically shows a fine tracking operation in the semiconductor storage device according to the first embodiment.

FIG. 28 is a schematic diagram showing differences between the coarse tracking and the fine tracking of the semiconductor storage device according to the first embodiment. In FIG. 28, the range (v) set as the second search range in the fine tracking is illustrated as an example; however, an operation in the other search ranges may be similarly performed. In FIG. 28, the amounts of the bit count changes (indicated by "o") calculated in the coarse tracking and the amounts of the bit count changes (indicated by "Δ") newly calculated in the fine tracking are plotted together.

As illustrated in FIG. 28, for example, the controller 10 sets a range [ERdef2−ΔV2e1, ERdef2+ΔV2e1], which is shifted in positive and negative directions from the voltage ERdef2 at the provisional valley position by a shift amount ΔV2e1 taken in coarse tracking, as a second search range in the fine tracking. Then, the controller 10 issues a shift reading command so as to shift the read voltage by a shift amount ΔV2e2 in the fine tracking that is a shift amount smaller than the shift amount ΔV2e1.

The semiconductor storage device 20 performs the shift readings by shifting the read voltages by the shift amount ΔV2e2 over the entire second search range in the fine tracking. Thus, the semiconductor storage device 20 generates the separated data ERsn over the entire second search range in the fine tracking.

Based on the separated data ERsn, the controller 10 calculates the amounts of the bit count changes over the entire second search range in the fine tracking. Therefore, in the example of FIG. 28, in the range where the three amounts of bit count changes are calculated in the coarse tracking, 13 amounts of bit count changes are calculated in the fine tracking operation.

The controller 10 detects an optimal valley position based on the calculated amounts of bit count changes. In the example of FIG. 28, four points at which the amounts of bit count changes are smaller than the amount of the bit count change at the provisional valley position are detected in the fine tracking. From among the four points, the controller 10 detects a position having a minimal amount of the bit count change amount as an optimum valley position, and sets the read voltage corresponding to the optimal valley position as an optimal read voltage ERopt.

Consequently, the fine tracking operation ends.

1.3 Effect of the Present Embodiment

According to the first embodiment, it is possible to detect the valley positions of the threshold voltage distributions at high speed and with high accuracy. Those effects will be described below.

Various tracking techniques for detecting valley positions have been proposed. For example, as a first technique, a technique of executing test reading across the full level and performing tracking is known. In the first technique, since read data in the full level may be acquired with minimal operations, high-speed tracking may be performed. However, the test reading requires a reading mechanism different from the reading mechanism of normal reading. More specifically, in the test reading, states of various elements (for example, voltages on circuit wires) in the semiconductor storage device 20 differ from those in the normal reading. Therefore, the optimal read voltage estimated using the test reading may differ from the optimal read voltage for the normal reading. Therefore, the tracking result obtained in the first technique may degrade the detection accuracy of the valley position in an actual read operation.

In addition, for example, as a second technique, a technique of performing the shift readings across the full level and performing the tracking is known. In the second method, the shift reading, which requires reading mechanism identical to the reading mechanism of the normal reading, is used. Therefore, it may solve a concern that the first technique mentioned above may provide the degraded valley position detection accuracy since the first technique has reading mechanism different from the reading mechanism of the normal reading. However, in the second technique, in a case where data of a plurality of bits is stored in one memory cell transistor, a plurality of levels of read voltages are applied in one read operation. Therefore, similarly to the first technique, performing the tracking may take a long time when focusing on only one level of read voltage in one read operation.

In addition, for example, as a third technique, a technique of fixing a search range in shift reading within a predetermined limited range for performing the shift reading, and performing the tracking is known. In the third technique, since the search range is limited, it may be possible to perform operations at higher speed than in the second technique. However, since the search range is fixed, in a case where there is a valley position for an unintended level in the search range, there may be a possibility of erroneously detecting a valley position.

FIG. 29 schematically illustrates a situation that may occur when a valley position P1 between certain levels is searched for with the third technique. A graph at the top of FIG. 29 shows the positional relationship between threshold voltage distributions and a search range allowing proper detection of a valley position. A graph at the bottom of FIG. 29 shows the positional relationship between the threshold voltage distributions and the search range where a valley position can be erroneously detected.

In the third technique, for example, a range that may not cover a valley position (for example, P2) between the level located in the range and an adjacent level is fixedly set as a range assumed to include a valley position P1. In the example of the top graph of FIG. 29, since setting the search range is appropriate, the valley position P1 is detected by tracking the search range. However, as shown in the bottom graph of FIG. 29, there may be a case where the threshold voltage distributions may shift as a whole after the search range is set. In this case, not only the valley position P1 but also the valley position P2 fall within the search range. Therefore, when the tracking is performed in that search range, if the number of memory cells at the valley position P2 is less than the number of memory cells at the valley position P1, the valley position P2 may be erroneously detected as the valley position P1.

According to the first embodiment, the two steps of the tracking operation are continuously performed. Specifically, as the first step of the tracking operation, the coarse tracking operation in which the read voltages change by first shift amounts across the full level is performed. Therefore, in the coarse tracking operation, it is possible to comprehensively detect provisional valley positions between respective levels.

In addition, in the coarse tracking operation, a search range corresponding to each of the provisional valley positions is further detected. Each of the detected search ranges is set in the full level to a range covering the corresponding valley position and not covering the other valley positions. Thus, the detected search ranges are discontinuous to each other.

Also, as the second step of the tracking operation, the fine tracking operation in which the read voltages change by a second shift amount over a limited search range is executed. In the fine tracking operation, each search range detected in the coarse tracking operation is applied. As described above, since the respective search ranges detected in the coarse tracking operation are discontinuous to each other, only the valley position corresponding to each search range may be located. In addition, since the fine tracking operation is executed sequentially with the coarse tracking operation, it may prevent the valley position from moving out of the search range between the coarse tracking operation and the fine tracking operation. Therefore, erroneous detection of the valley position may be prevented.

In addition, the second shift amount is set to a value smaller than the first shift amount. Therefore, in the coarse tracking operation, comprehensive searches may be carried out across the full level with less number of times than in tracking operations performed by using the second shift amount. In contrast, in the fine tracking operation, the search accuracy of the valley position may be improved more than the search accuracy in the tracking operation using the first shift amount.

In addition, the search ranges of the fine tracking operation are narrower than the search ranges of the coarse tracking operation. Therefore, it may shorten the time required for the fine tracking operation, and eventually it may shorten the time required for the overall tracking operations.

Also, the coarse tracking operation and the fine tracking operation include the bit count tracking performed using the shift reading. Thus, the reading mechanism similar to that of the normal reading can be applied. Therefore, it may detect the valley positions with respect to the threshold voltage distributions taken during an actual read operation.

In the bit count tracking performed by the shift readings, a plurality of levels of voltages applied in one shift reading is simultaneously shifted. Thus, in each of the lower-page tracking and the upper-page tracking, for example, bit counts at two points may be generated in one shift reading, and in the middle-page tracking, bit counts at three points may be generated in one shift reading. Therefore, the time required for the bit count tracking performed using the shift readings may be shortened.

In addition, in the bit count tracking performed using the shift readings, the test reading(s) is(are) executed before the shift reading. Thus, separated data may be generated based on the read data in the test reading(s) and the read data in the shift reading(s). Therefore, the bit counts may be obtained depending on the number of voltage levels applied in one shift reading.

In the coarse tracking operation, the bit count tracking is performed by dividing the full level into the four ranges (I) to (IV). More specifically, the bit count tracking is performed in the ranges (I) and (III) in the lower-page tracking, and the bit count tracking is performed in the ranges (II) and (IV) in the upper-page tracking. The range (II) is the range between the ranges (I) and (III), and the range (III) is the range between the ranges (II) and (IV). Thus, comprehensively searches for the full level may be conducted while setting the search ranges in a single page tracking to be discontinuous to each other.

In addition, in the fine tracking operation, the bit count tracking is performed in each of the seven ranges (i) to (vii) discontinuous to one another. More specifically, the bit count tracking is performed in the ranges (i) and (v) in the lower-page tracking, the bit count tracking is performed in the ranges (iii) and (vii) in the upper-page tracking, and the bit count tracking are performed in ranges (ii), (iv), and (vi) in the middle-page tracking. Thus, efficiently perform the bit count tracking using the shift readings may be effectively performed in the seven ranges discontinuous to each other.

1.4 Modification Example of First Embodiment

Note that the semiconductor storage device according to the first embodiment is not limited to the example described above, and various modifications may be applicable.

For example, in the semiconductor storage device according to the first embodiment, the lower-page tracking and the upper-page tracking are performed in the coarse tracking operation; however, embodiments are not limited to this. Specifically, in the coarse tracking operation, the middle-page tracking may be performed in lieu of the lower-page tracking and the upper-page tracking.

FIG. 30 is a flowchart of entire tracking operations of a semiconductor storage device according to a modification example of the first embodiment. FIG. 30 corresponds to FIG. 12. Operations in steps ST1 to ST3 and steps ST6 to ST15 in FIG. 30 are similar to those in FIG. 12, and therefore, will not be discussed here for simplicity.

As illustrated in FIG. 30, in a case where the read data fails in the ECC performed in step ST3 (step ST3; Fail), the controller 10 proceeds to step ST16.

In step ST16, the controller 10 and the semiconductor storage device 20 perform a middle-page tracking operation. Then, in step ST6, the controller 10 detects search ranges and provisional valley positions to be used for the subsequent tracking operation based on the results of the coarse tracking operation. The operations in steps ST16 and ST6 are for the coarse tracking operation.

In addition, in steps ST7 to ST9, the controller 10 and the semiconductor storage device 20 execute a fine tracking operation in the search ranges detected in the coarse tracking operation. In step ST10, the controller 10 detects optimal valley positions based on the results of the fine tracking operation.

Next, the middle-page tracking operation in the coarse tracking of the semiconductor storage device according to the modification example of the first embodiment will be described. The middle-page tracking in the coarse tracking of the semiconductor storage device according to the modification example of the first embodiment differs from other middle-page tracking operations in that bit counts are further calculated between fifth and six search ranges and between six and seventh search ranges, the fifth to seventh search ranges being discontinuous to one another.

Figure 31:
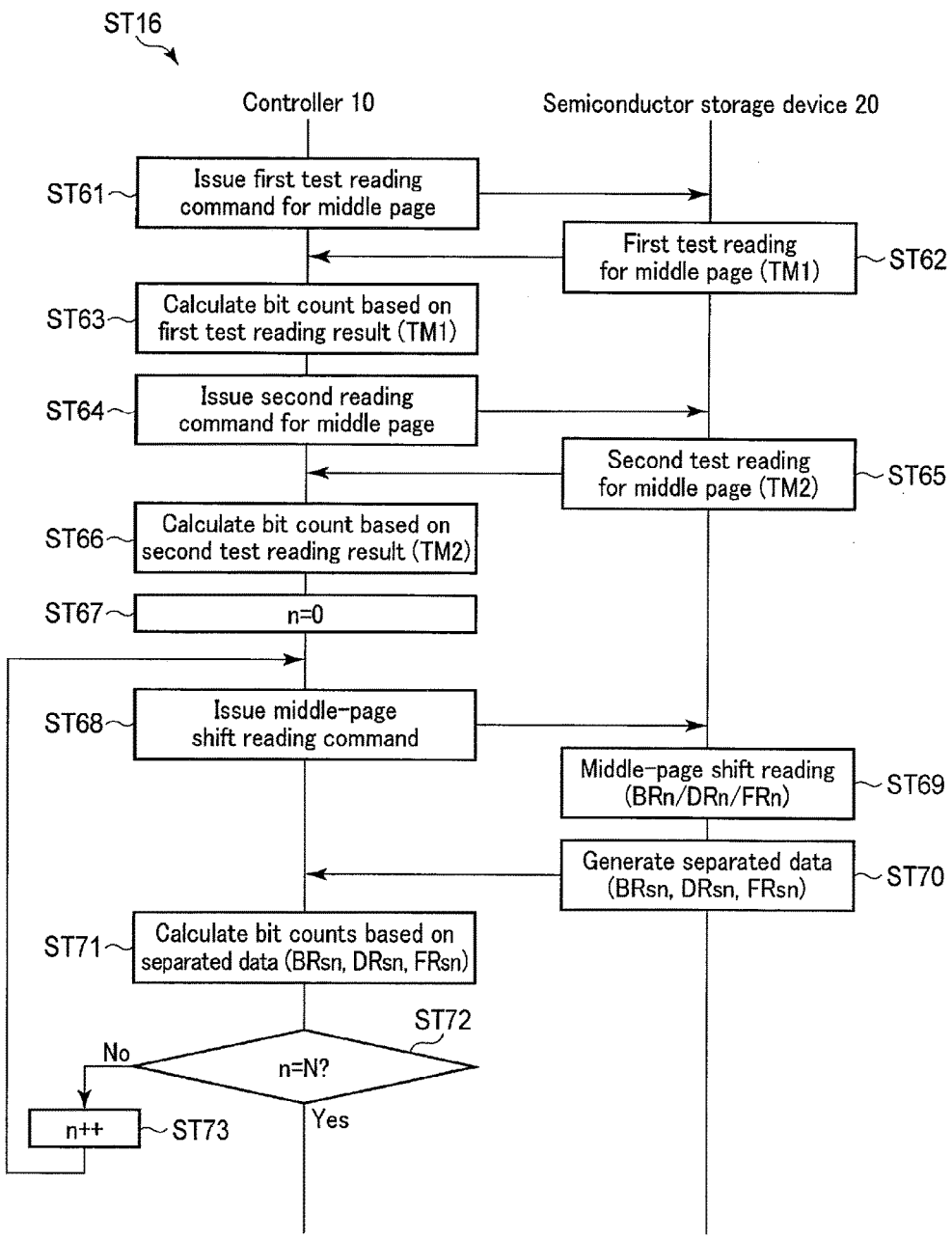
FIG. 31 is a flowchart of a middle-page tracking operation in coarse tracking of the semiconductor storage device according to the modification example of the first embodiment.

FIG. 31 is a flowchart of the middle-page tracking operation in the coarse tracking of the semiconductor storage device according to the modification example of the first embodiment. FIG. 31 corresponds to step ST16 in FIG. 30.

As illustrated in FIG. 31, in step ST61, the controller 10 provides a first test reading command for a middle page to the semiconductor storage device 20.

In step ST62, the semiconductor storage device 20 executes a first test reading for the middle page and reads data TM1. The semiconductor storage device 20 holds the read data TM1 in the latch (for example, the latch ADL) and transmits the read data TM1 to the controller 10.

In step ST63, the controller 10 calculates a bit count based on the read data TM1.

In step ST64, the controller 10 issues a second test reading command for the middle page to the semiconductor storage device 20.

In step ST65, the semiconductor storage device 20 executes second test reading for the middle page and reads data TM2. The semiconductor storage device 20 holds the read data TM2 in the latch (for example, the latch BDL) and transmits the read data TM2 to the controller 10.

In step ST66, the controller 10 calculates a bit count based on the read data TM2.

Steps ST67 to ST73 are similar to steps ST45 to ST51 in FIG. 21.

Consequently, the tracking operation of the middle page in the coarse tracking ends.

Figure 32:
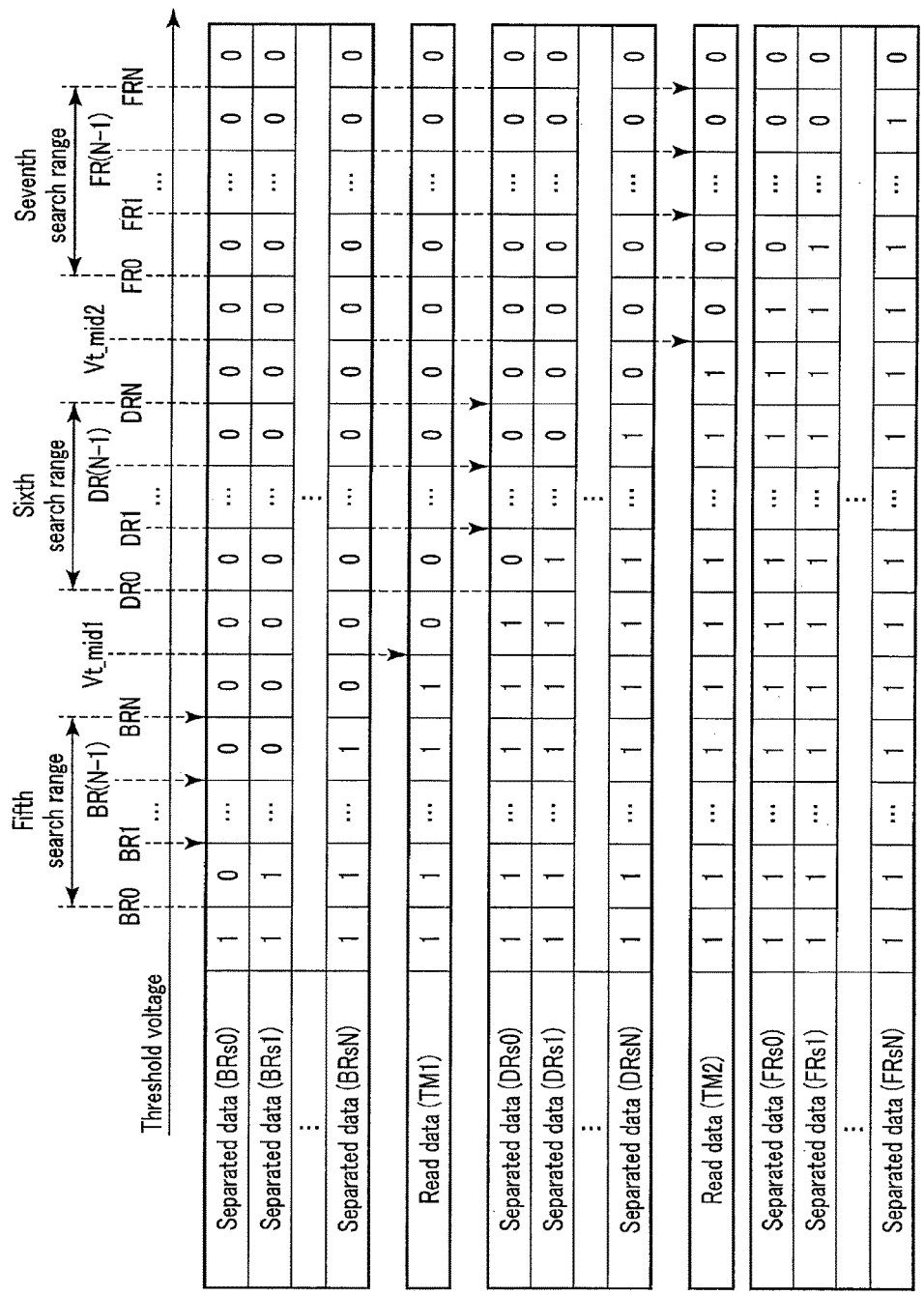
FIG. 32 is a table that shows data separated by the middle-page tracking operation in the coarse tracking of the semiconductor storage device according to the modification example of the first embodiment.

FIG. 32 is a table of read data and separated data in the middle-page tracking using the coarse tracking according to the modification example of the first embodiment. FIG. 32 corresponds to steps ST63, ST66, and ST71 in FIG. 31, and shows the read data TM1 and TM2 in test reading for the middle page, separated data BRsn, DRsn, and FRsn generated based on the middle-page shift readings. Among the above data, the separated data BRsn, DRsn, and FRsn are similar to those in FIG. 24, and therefore the explanation is omitted for simplicity.

As illustrated in FIG. 32, the read data TM1 is data "1" in a case where the threshold voltage of the memory cell transistor MT is less than the voltage Vt_mid1, and is data "0" in a case where the threshold voltage of the memory cell transistor MT is equal to or greater than the voltage Vt_mid1. That is, the number of data "1" of the read data TM1 corresponds to the number of memory cell transistors MT the threshold voltage of which is less than the voltage Vt_mid1.

Therefore, in step ST63 in FIG. 31, the controller 10 monitors the number of ON-cells at the voltage Vt_mid1 by generating the bit counts of the read data TM1. In addition, the controller 10 calculates the amount of a bit count change between the separated data BRsN and the read data TM1 and the amount of a bit count change between the read data TM1 and the separated data DRs0, and therefore the controller 10 monitors the amount of a change in the number of ON-cells between the voltage BRN and Vt_mid1 and the amount of a change in the number of ON-cells between the voltages Vt_mid1 and DR0, respectively.

In addition, the read data TM2 is data "1" in a case where the threshold voltage of the memory cell transistor MT is less than the voltage Vt_mid2, and is data "0" in a case where the threshold voltage of the memory cell transistor MT is equal to or greater than the voltage Vt_mid2.

Therefore, in step ST66 of FIG. 31, the controller 10 monitors the number of ON-cells at the voltage Vt_mid2 by generating the bit count of the read data TM2. In addition, the controller 10 calculates the amount of a bit count change between the separated data DRsN and the read data TM2 and the amount of a bit count change between the read data TM2 and the separated data FRs0, and therefore the controller 10 monitors the amount of a change in the number of ON-cells between the voltages DRN and Vt_mid2 and the amount of a change in the number of ON-cells between the voltages Vt_mid2 and FR0, respectively.

As described above, in the coarse tracking for the middle-page tracking, the semiconductor storage device 20 generates a set of the (N+1) separated data BRs0, BRs1, ..., and BRsN, a set of the (N+1) separated data DRs0, DRs1, ..., and DRsN, and a set of the (N+1) separated data FRs0, FRs1, ..., and FRsN by two test readings and (N+1) shift readings. Then, the controller 10 calculates the amounts of continuous changes in the bit counts in each of the discontinuous read voltage ranges (e.g. the fifth search range, the sixth search range, and the seventh search range) based on each of the three sets of the generated separated data.

In addition, the semiconductor storage device 20 further reads the data TM1 and TM2 in the two test readings. Based on the read data TM1 and TM2, the controller 10 calculates the amounts of bit count changes in the fifth search range and the sixth search range, and in the sixth search range and the seventh search range.

FIG. 33 is a schematic diagram showing the coarse tracking operation of the semiconductor storage device according to the modification example of the first embodiment. FIG. 33 schematically shows the ranges of the read voltages in which bit count tracking is performed based on the middle-page tracking by the coarse tracking.

In the coarse tracking according to the modification example of the first embodiment, the full level is divided into three discontinuous ranges (V) to (VII). The ranges (V) to (VII) correspond to the range of the smallest, second smallest, and greatest search starting voltages, respectively.

As illustrated in a graph at the top of FIG. 33, the controller 10 sets the range (V) as a fifth search range, sets the range (VI) as a sixth search range, sets the range (VII) as a seventh search range. Specifically, for example, voltages BR0 and BRN are set to voltages at the left end or boundary and the right end or boundary of the range (V), respectively. In addition, for example, voltages DR0 and DRN are set to voltages at the left end or boundary and the right end or boundary of the range (VI), respectively, and voltages FR0 and FRN are set to voltages at the left end or boundary and the right end or boundary of the range (VII), respectively. In addition, for example, the controller 10 sets the read voltage Vt_mid1 between the ranges (V) and (VI), and sets the read voltage Vt_mid2 between the ranges (VI) and (VII).

Then, the semiconductor storage device 20 executes the middle-page tracking including (N+1) shift readings for the ranges (V) to (VII). In the shift readings, the read voltages are shifted over the entire ranges (V) to (VII). As a result of the middle-page tracking, the semiconductor storage device 20 generates the (N+1) separated data BRsn over the entire range (V), and the (N+1) separated data DRsn over the entire range (VI), and generates (N+1) separated data FRsn over the entire range (VII). In addition, the semiconductor storage device 20 further reads the read data TM1 and TM2 obtained in the first test reading and the second test reading.

As shown in a graph at the bottom of FIG. 33, the controller 10 calculates the amounts of changes in the bit counts at N points over the entire range (V) based on the (N+1) separated data BRsn. The controller 10 calculates the amounts of changes in the bit counts at N points over the entire range (VI) based on the (N+1) separated data DRsn. The controller 10 calculates the amounts of changes in the bit counts at N points over the entire range (VII) based on the (N+1) separated data FRsn.

In addition, the controller 10 calculates the amount of a bit count change at one point between the voltages BRN and Vt_mid1 based on the separated data BRsN and the read data TM1. The controller 10 calculates the amount of a bit count change at one point between the voltages Vt_mid1 and DR0 based on the separated data DRs0 and the read data TM1. The controller 10 calculates the amount of a bit count change at one point between the voltages DRN and Vt_mid2 based on the separated data DRsN and the read data TM2. The controller 10 calculates the amount of a bit count change at one point between the voltages Vt_mid2 and FR0 based on the separated data FRs0 and the read data TM2. Note that the amounts of the bit count changes at the above four points are indicated by black dots in a graph at the bottom of FIG. 33.

As described above, the amounts of bit count changes in the entirety of each of the three discontinuous ranges (V) to (VII) are calculated, and the amounts of the bit count changes in the gap between the ranges (V) and (VI) and in the gap between the ranges (VI) and (VII) are calculated. Therefore, tracking over the entire range of the full level is performed in the coarse tracking. As a result of this coarse tracking, the controller 10 detects provisional valley positions in all the gaps between the levels.

In order to perform the bit count tracking in the entire region in the full level with the coarse tracking described above, it is preferable that the gap between the ranges (V) and (VI) and the gap between the range (VI) and (VII) may be set arbitrarily. More specifically, the amounts of bit count changes calculated in each gap between the ranges (V) to (VII) may not be obtained with desired accuracy if the pitch for the amounts of bit count changes calculated in each gap between the ranges (V) to (VII) is undesirably wider or narrower than the pitch for the amounts of bit count changes calculated in each of the ranges (V) to (VII) (i.e. the shift amount of the read voltage). That is, preferably, the pitch for the amounts of bit count changes (i.e. the shift amount of the read voltage) calculated within each of the ranges (V) to (VII) may be substantially equal to the pitch for the amounts of bit count changes calculated in each gap between the ranges (V) to (VII). When the amounts of bit count changes calculated in the middle-page tracking are plotted, the threshold voltage distributions of the memory cell transistor MT are reproduced over the entire region of the full level.

Therefore, the controller 10 detects provisional valley positions in all the gaps between the levels based on the results of the bit count tracking over the full-level.

Note that since the read data TM1 and TM2 are read in the test reading, the reading mechanism of the normal reading is not commonly applied to the readings of data TM1 and TM2. Therefore, accuracy of the amounts of bit count changes calculated using the read data TM1 and TM2 may be lower than accuracy of the amounts of bit count changes calculated by using only the separated data BRsn, DRsn, and FRsn. Therefore, for example, when plotting the amounts of bit count changes, it is preferable to calculate a weighted average using the amounts for a plurality of adjacent points (for example, three points). Thus, accuracy of the plotted amounts of bit count changes may be evened.

2. Second Embodiment

Next, a semiconductor storage device according to a second embodiment will be described. The semiconductor storage device according to the first embodiment executes the bit count tracking in the fine tracking. In contrast, the semiconductor storage device according to the second embodiment executes syndrome tracking in the fine tracking. In the second embodiment, an example in which the syndrome tracking is performed, particularly in lower-page tracking in the fine tracking, will be described. In the following description, components like those in the first embodiment are denoted by same reference numerals, and explanation is omitted for simplicity. Only portions of the second embodiment that are different from the first embodiment will be described.

2.1 Syndrome Tracking

FIG. 34 is a schematic diagram illustrating the syndrome tracking of the semiconductor storage device according to the second embodiment. As illustrated in FIG. 34, data for one page read from the memory cell array 21 includes data and parities. The ECC circuit 13 holds in advance a parity check matrix as illustrated that are used for the parities and data. A parity check expression (syndrome) is obtained by performing an XOR operation of bits having the value "1" on the parity check matrix. In this syndrome, the value "1" indicates an error (syndrome NG), and the total number of bits having the value "1" is the total number of errors (the number of syndrome NGs).

The number of syndrome NGs correlates with the number of error bits in the read data. In particular, it is known that the number of syndrome NGs has a strong correlation with the number of error bits in a case where a low-density parity-check code (LDPC) is used in an ECC process executed in the ECC circuit 13. Therefore, the number of syndrome NGs may be a parameter for the valley position detection with higher accuracy than the amount of a bit count change. That is, a read voltage at which the number of syndrome NGs is minimal may indicate a more optimal valley position than a read voltage at which the amount of a bit count change is minimal. As such, a technique of searching for a read voltage at which the number of syndrome NGs is minimal is referred to as "syndrome tracking." Since the syndrome tracking is executed by using the ECC circuit 13, load on the controller 10 is greater than the load in bit count tracking; however, the valley position may be searched for with higher accuracy.

2.2 Lower-Page Tracking in Fine Tracking

FIG. 35 is a flowchart of a lower-page tracking operation in the fine tracking of the semiconductor storage device according to the second embodiment. FIG. 35 illustrates an operation corresponding to step ST7 in FIG. 12 showing the fine tracking operations in the search ranges (i) and (v).

As illustrated in FIG. 35, in step ST71, the controller 10 issues a test reading command for a lower page to the semiconductor storage device 20.

In step ST72, the semiconductor storage device 20 executes the test reading for the lower page and reads data TL. The semiconductor storage device 20 holds the read data TL in a latch (for example, the latch ADL).

In step T73, the controller 10 issues a normal reading command for the lower page to the semiconductor storage device 20.

In step ST74, the semiconductor storage device 20 executes the normal reading for the lower page and reads data ARd/ERd. The semiconductor storage device 20 holds the read data ARd/ERd in a latch (for example, the latch BDL).

In step ST75, the semiconductor storage device 20 generates separated data ARsd and ERsd based on the read data TL and ARd/ERd held in the latches. Then, the semiconductor storage device 20 transmits the separated data ARsd and ERsd to the controller 10.

In step ST76, the controller 10 initializes loop processes to be executed in the following steps ST77 to ST83 (n=0).

In step ST77, the controller 10 issues a shift reading command for the lower page to the semiconductor storage device 20.

In step ST78, the semiconductor storage device 20 executes the shift reading for the lower page, and in an (n+1)th loop of the processes, reads data ARn/ERn (AR0/ER0, AR1/ER1, . . . , ARN/ERN). The semiconductor storage device 20 holds the read data ARn/ERn in a latch (for example, the latch CDL).

In step ST79, the semiconductor storage device 20 generates separated data ARsn (ARs0, ARs1, . . . , ARsN) and ERsn (ERs0, ERs1, . . . , ERsN) based on an operation on the read data TL and ARn/ERn held in the latches. Then, the semiconductor storage device 20 transmits the separated data ARsn and ERsn to the controller 10.

In step ST80, the controller 10 generates integrated data ARsd and ERsn based on the separated data ARsd and ERsn. In addition, the controller 10 generates integrated data ARsn/ERsd based on the separated data ERsd and ARsn. The integrated data ARsd/ERsn has data "0" or "1" in each bit based on the relationship between a corresponding threshold voltage of a memory cell transistor MT and the voltages ARdef and ERn. The integrated data ARsn/ERsd has data "0" or "1" in each bit based on the relationship between a corresponding threshold voltage of the memory cell transistor MT and the voltages ARn and ERdef.

In step ST81, the controller 10 generates the number of syndrome NGs based on the integrated data ARsd/ERsn and the number of syndrome NGs based on the integrated data ARsn/ERsd.

In step ST82, the controller 10 determines whether or not to continue the loop processes. Specifically, in a case where a value n is not equal to a value N (step ST82; No), the process proceeds to step ST83 where the loop count is incremented, and then the process returns to step ST77. In addition, in a case where the value n is equal to the value N (step ST82; Yes), the lower-page tracking operation in the fine tracking ends.

Figure 36:
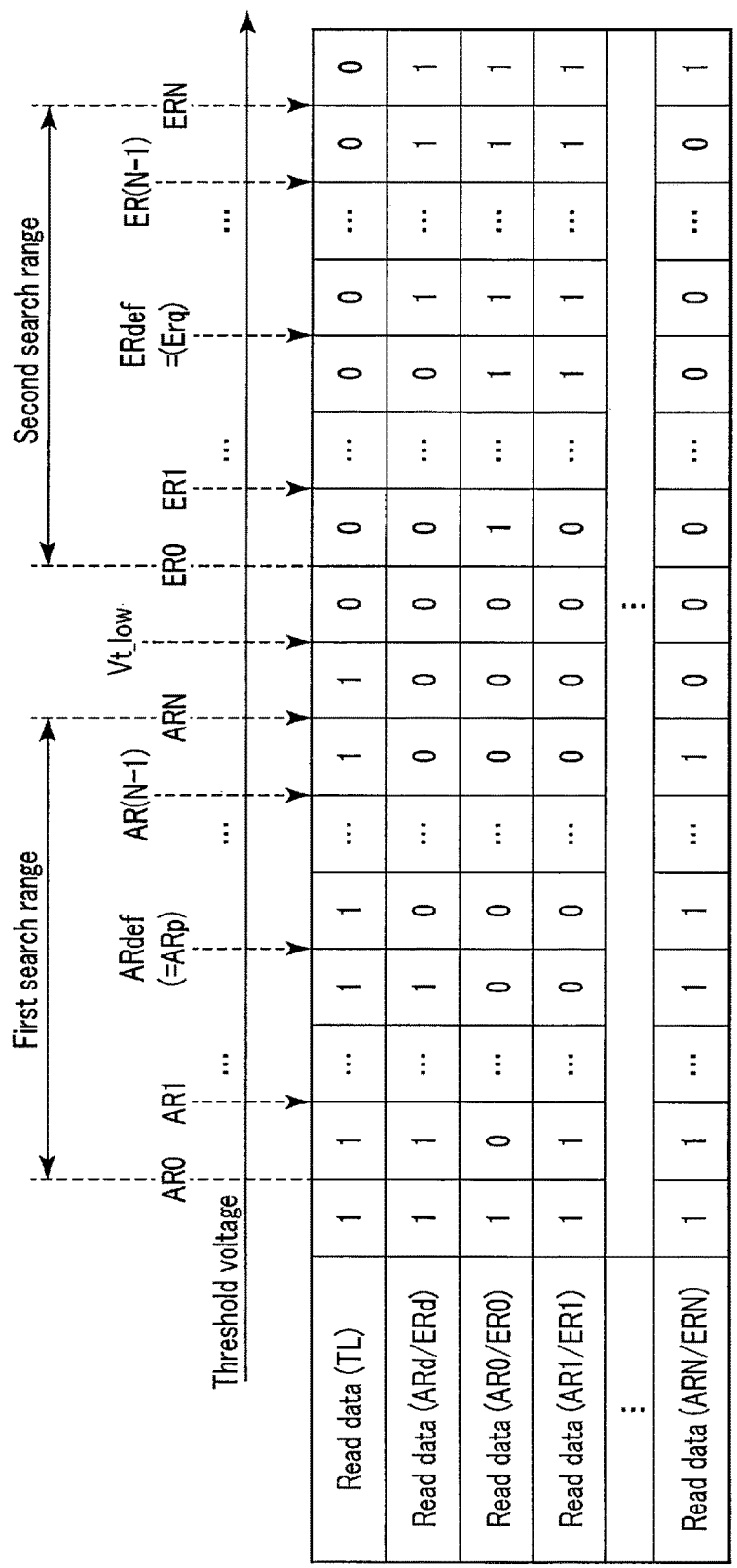
FIG. 36 is a table that shows data read by the lower-page tracking operation in the fine tracking of the semiconductor storage device according to the second embodiment.
Figure 37:
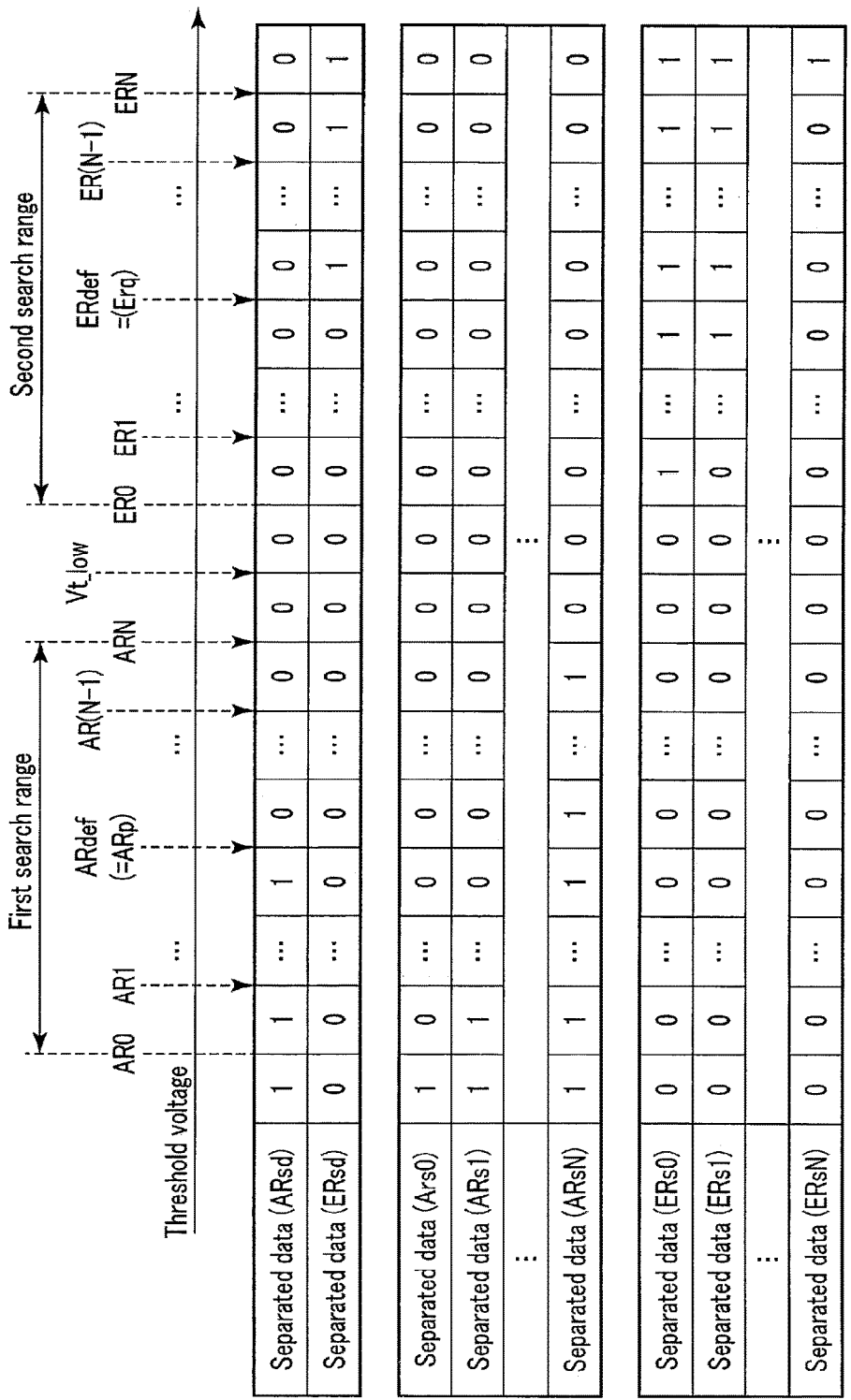
FIG. 37 is a table that shows data separated by the lower-page tracking operation in the fine tracking of the semiconductor storage device according to the second embodiment.

FIGS. 36 to 38 are tables of the read data, the separated data, and the integrated data in the lower-page tracking for the fine tracking of the semiconductor storage device according to the second embodiment, respectively. FIG. 36 corresponds to steps ST72, ST74 and ST78 in FIG. 35, and shows the data TL read in the test reading, the data ARd/ERd read in the normal reading, and the data ARn/ERn read in the shift readings. FIG. 37 corresponds to steps ST75 and ST79 in FIG. 35, and shows the separated data ARsd, ERsd, ARsn, and ERsn generated based on the read data TL, ARd/ERd, and ARn/ERn. FIG. 38 corresponds to step ST81 in FIG. 35, and shows the integrated data ARsd/ERsn and ARsn/ERsd.

As illustrated in FIG. 36, the read data ARd/ERd is data "1" in a case where the threshold voltage of the memory cell transistor MT is less than the voltage ARdef, the read data ARd/ERd is data "0" in a case where the threshold voltage of the memory cell transistor MT is equal to or greater than the voltage ARdef and less than the voltage ERdef, and the read data ARd/ERd is data "1" in a case where the threshold voltage of the memory cell transistor MT is equal to or greater than the voltage ERdef. The voltage ARdef is, for example, equal to the read voltage ARp in the shift reading in a (p+1)th loop (n=p). In addition, the voltage ERdef is, for example, equal to the read voltage ERq in the shift reading in a (q+1)th loop (n=q). Note that the value p and the value q may be equal, and the voltages ARdef and ERdef may be different from the read voltage in the shift reading.

The other read data TL and ARn/ERn are like those in FIG. 15 in the first embodiment, and therefore, explanation is omitted for simplicity.

As illustrated in FIG. 37, the separated data ARsd is data "1" in a case where the threshold voltage of the memory cell transistor MT is less than the voltage ARdef, and is data "0" in a case where the threshold voltage is equal to or greater than the voltage ARdef.

The separated data ARsd is generated, for example, based on an operation on the read data TL and ARd/ERd. For example, the operation unit OP may generate the separated data ARsd by performing an AND operation between the read data TL and the read data ARd/ERd (ARsd=TL AND (ARd/ERd)).

In addition, the separated data ERsd is data "0" in a case where the threshold voltage of the memory cell transistor MT is less than the voltage ERdef, and is data "1" in a case where the threshold voltage of the memory cell transistor MT is equal to or greater than the voltage ERdef.

The separated data ERsd is generated, for example, based on an operation on the read data TL and ARd/ERd. For example, the operation unit OP may generate the separated data ERsd by performing an AND operation between the NOT operation result of the read data TL ($^-$TL) and the read data ARd/ERd (ERsd=$^-$TL AND (ARd/ERd)).

The other separated data ARsn and ERsn are like those in FIG. 16 in the first embodiment, and therefore explanation is omitted for simplicity.

As illustrated in FIG. 38, the integrated data ARs0/ERsd is data "1" in a case where the threshold voltage of the memory cell transistor MT is less than the voltage AR0, the integrated data ARs0/ERsd is data "0" in a case where the threshold voltage of the memory cell transistor MT is equal to or greater than the voltage AR0 and less than the voltage ERdef, and the integrated data ARs0/ERsd is data "1" in a case where the threshold voltage of the memory cell transistor MT is equal to or greater than the voltage ERdef.

The integrated data ARs1/ERsd is data "1" in a case where the threshold voltage of the memory cell transistor MT is less than the voltage AR1, the integrated data ARs1/ERsd is data "0" in a case where the threshold voltage of the memory cell transistor MT is equal to or greater than the voltage AR1 and less than the voltage ERdef, and the integrated data ARs1/ERsd is data "1" in a case where the threshold voltage of the memory cell transistor MT is equal to or greater than the voltage ERdef.

As such, the integrated data ARsn/ERsd is data "1" in a case where the threshold voltage of the memory cell transistor MT is less than the voltage ARn, the integrated data ARsn/ERsd is data "0" in a case where the threshold voltage of the memory cell transistor MT is equal to or greater than the voltage ARn and less than the voltage ERdef, and the integrated data ARsn/ERsd is data "1" in a case where the threshold voltage of the memory cell transistor MT is equal to or greater than the voltage ERdef. That is, the integrated data ARsn/ERsd is equivalent to the data read in the shift reading in which the read voltage in the "E" level is fixed to the voltage ERdef and only the read voltages in the "A" level are shifted in the range of the voltages AR0 to ARN.

Note that the integrated data ARsn/ERsd is generated based on, for example, an operation on the separated data ARsn and ERsd. For example, the controller 10 may generate the integrated data ARsn/ERsd by performing an OR operation between the separated data ARsn and the separated data ERsd (ARsn/ERsd=ARsn OR ERsd).

In contrast, the integrated data ARsd/ERs0 is data "1" in a case where the threshold voltage of the memory cell transistor MT is less than the voltage ARdef, the integrated data ARsd/ERs0 is data "0" in a case where the threshold voltage of the memory cell transistor MT is equal to or greater than the voltage ARdef and less than the voltage ER0, and the integrated data ARsd/ERs0 is data "1" in a case where the threshold voltage of the memory cell transistor MT is equal to or greater than the voltage ER0.

The integrated data ARsd/ERs1 is data "1" in a case where the threshold voltage of the memory cell transistor MT is less than the voltage ARdef, the integrated data ARsd/ERs1 is data "0" in a case where the threshold voltage of the memory cell transistor MT is equal to or greater than the voltage ARdef and less than the voltage ER1, and the integrated data ARsd/ERs1 is data "1" in a case where the threshold voltage of the memory cell transistor MT is equal to or greater than the voltage ER1.

As such, the integrated data ARsd/ERs0 is data "1" in a case where the threshold voltage of the memory cell transistor MT is less than the voltage ARdef, the integrated data ARsd/ERs0 is data "0" in a case where the threshold voltage of the memory cell transistor MT is equal to or greater than the voltage ARdef and less than the voltage ERn, and the integrated data ARsd/ERs0 is data "1" in a case where the threshold voltage of the memory cell transistor MT is equal to or greater than the voltage ERn. That is, the integrated data ARsd/ERsn is equivalent to the read data in the shift readings in which the read voltage the "A" level is fixed to the voltage ARdef and only the read voltages in the "E" level are shifted in the range of the voltages ER0 to ERN.

Note that the integrated data ARsd/ERsn are generated based on, for example, an operation on the separated data ARsd and ERsn. For example, the controller 10 may generate the integrated data ARsd/ERsn by performing an OR operation between the separated data ARsd and the separated data ERsn (ARsd/ERsn=ARsd OR ERsn).

2.3 Effects According to Second Embodiment

FIG. 39 is a schematic diagram illustrating effects of the second embodiment. In FIG. 39, regarding the search range (i), true values corresponding to the amounts of bit count changes and to the number of syndrome NGs are indicated by dotted lines for reference. In addition, in a graph at the top of of FIG. 39, "○" represents an amount of a bit count change obtained in a case where the bit count tracking is performed in the search range (i) for the fine tracking. In a graph at the bottom of FIG. 39, "□" represents an amount of a bit count change obtained in a case where the syndrome tracking is performed in the search range (i) for the fine tracking.

As illustrated in the graph at the top of FIG. 39, the amounts of the bit count changes have large variations (variance) from the true values. Thus, in a region such as the "Er" level where a threshold voltage distribution changes more gently than in the "A" level, an error in the amount of the bit count change is more likely to occur. Therefore, in the bit count tracking, the amount of the bit count change that is minimal may fall within a wide range in a side from a true valley position toward the "Er" level. Therefore, as shown in the graph at the top of FIG. 39, a valley position P3 may be detected as a result of the bit count tracking which is greatly displaced from a true valley position P4.

In contrast, as shown in the graph at the bottom of FIG. 39, since the number of syndrome NGs more strongly correlates to the number of error bits than the amount of the bit count change does, the inconsistency of the number of Syndrome NGs with the true value is smaller than that of the amount of the bit count change. Therefore, even in a region such as the "Er" level where the threshold voltage distribution gradually changes, the inconsistency of the number of syndrome NGs is less likely to occur. Therefore, in the syndrome tracking, the number of syndrome NGs that is minimal may fall within a narrower range in a side from the true valley position toward the "Er" level, like a range in a side toward the "A" level. Therefore, as shown in the graph at the bottom of FIG. 39, a valley position P5 is detected as a result of the syndrome tracking a true valley position P6 with high accuracy with respect to a true valley position P6.

According to the second embodiment, in the lower-page tracking for the fine tracking, the semiconductor storage device 20 generates the separated data ARsd and ERsd based on the test reading for the lower page and the normal reading for the lower page. Then, the semiconductor storage device 20 generates the separated data ARsn and ERsn based on loop processes for the lower-page shift reading. The controller 10 generates the integrated data ARsd/ERsn based on the separated data ARsd and ERsn, and generates the integrated data ARsn/ERsd based on the separated data ARsn and ERsd. The controller 10 calculates the number of syndrome NGs based on the generated integrated data ARsd/ERsn and ARsn/ERsd in the ECC circuit 13. As a result, the controller 10 performs the syndrome tracking in lieu of the bit count tracking in the search ranges (i) and (v). Therefore, even in the search range (i) where accuracy of valley position detection tends to deteriorate in a case of using the amounts of the bit count changes, the valley position may be more accurately detected by using the number of syndrome NGs.

In addition, in the syndrome tracking, the ECC circuit 13 only needs to calculate the number of syndrome NGs, and may not be required to perform error correction. Therefore, the controller 10, with the syndrome tracking, may execute more accurate valley detection while saving time required for an error correction operation of the ECC circuit 13.

In the shift reading for the syndrome tracking, a plurality of levels of voltages applied in one shift reading are simultaneously shifted. Thus, for example, in the lower-page tracking, it is possible to obtain the number of syndrome NGs at two points in every one shift reading. Therefore, time required in the shift reading for the syndrome tracking may be shortened.

2.4 First Modification Example of Second Embodiment

Note that the semiconductor storage device according to the second embodiment is not limited to the example described above, and various modifications are applicable. For example, in the semiconductor storage device according to the second embodiment, the valley positions in the search ranges (i) and (v) are detected in the syndrome tracking; however, the present invention is not limited to this. Specifically, the syndrome tracking may be performed only for detection of the valley position in the search range (i), and bit count tracking may be performed for detection of the valley position in the search range (v).

Figure 40:
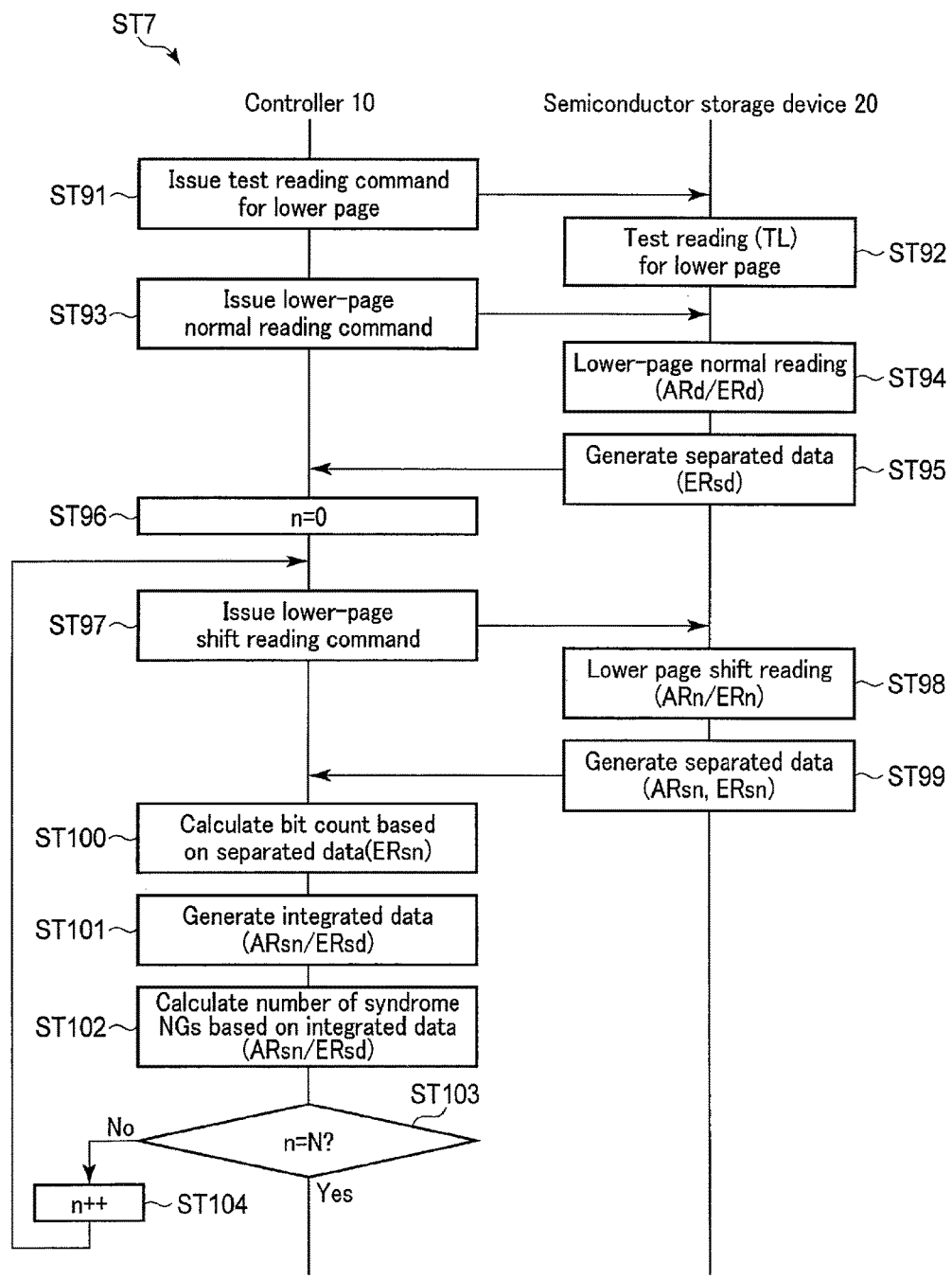
FIG. 40 is a flowchart of a lower-page tracking operation in fine tracking of a semiconductor storage device according to a first modification example of the second embodiment.

FIG. 40 is a flowchart of a lower-page tracking operation in the fine tracking of the semiconductor storage device according to a first modification example of the second embodiment. FIG. 40 corresponds to FIG. 35 according to the second embodiment. That is, FIG. 40 corresponds to step ST7 in FIG. 12 illustrating fine tracking operations in the search ranges (i) and (v).

As illustrated in FIG. 40, steps ST91 to ST94 are like steps ST71 to ST74 in FIG. 35, and therefore explanation is omitted for simplicity.

In step ST95, the semiconductor storage device 20 generates only the separated data ERsd based on an operation on the read data TL and ARd/ERd held in the latches. Then, the semiconductor storage device 20 transmits the separated data ERsd to the controller 10. Step ST95 differs from step ST75 in FIG. 35 in that the separated data ARsd is not generated in step ST95.

In step ST96, the controller 10 initializes loop processes to be executed in the following steps ST97 to ST104 (n=0).

Steps ST97 to ST99 are like steps ST77 to ST79 in FIG. 35, and explanation is omitted for simplicity.

In step ST100, the controller 10 calculates a bit count based on the separated data ERsn.

In step ST101, the controller 10 generates the integrated data ARsn/ERsd by using the separated data ERsd and ARsn.

In step ST102, the controller 10 calculates the number of syndrome NGs based on the integrated data ARsn/ERsd.

In step ST103, the controller 10 determines whether or not to continue the loop processes. Specifically, in a case where the value n is not equal to the value N (step ST102; No), the process proceeds to step ST104 where the loop count is incremented, and then the process returns to step ST97. In addition, in a case where the value n is equal to the value N (step ST102; Yes), the lower-page tracking operation in the fine tracking ends.

Figure 41:
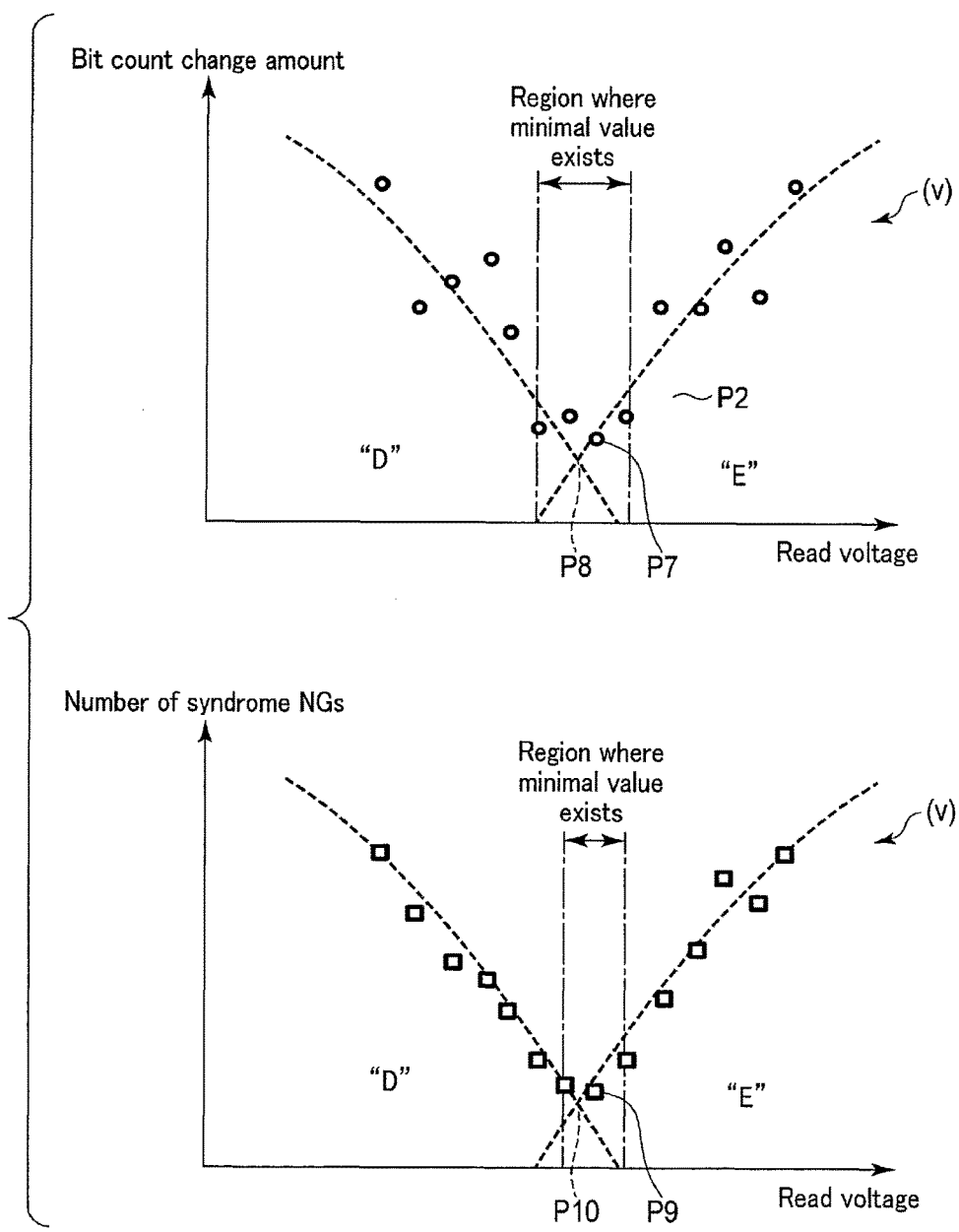
FIG. 41 shows characteristics of the semiconductor storage device according to the first modification example of the second embodiment.

FIG. 41 illustrates graphs showing effects of the modification example of the second embodiment. In FIG. 41, true values corresponding to the amounts of bit count changes and of the number of syndrome NGs in the search range (v) are indicated by dotted lines for reference. In addition, in the graph at the top of FIG. 41, "○" represents an amount of a bit count change obtained in a case where the bit count tracking is performed in the search range (v) in the fine tracking. In the graph at the bottom of FIG. 41, "□" represents an amount of a bit count change obtained in a case where syndrome tracking is performed in the search range (v) in the fine tracking.

As described above, the number of syndrome NGs more strongly correlates with the number of error bits than the amount of the bit count change does. Therefore, as illustrated in the graph at the bottom of FIG. 41, in the syndrome tracking in the search range (v), the number of syndrome NGs that is minimal may fall within a narrower range around the true valley position, similarly to the syndrome tracking in the search range (i). Therefore, a valley position P9 detected as a result of the syndrome tracking may more accurately coincide with a true valley position P10.

In contrast, as described above, the amount of the bit count change has greater displacements from the true value than the number of syndrome NGs has. However, as illustrated in the graph at the top of FIG. 41, for example, in a region where both levels adjacent the region have threshold voltage distributions abruptly changing, such as a valley position between the "D" level and the "E" level, a displacement in the amount of the bit count change is less likely to occur. That is, a valley position P7 detected as a result of the bit count tracking in the search range (v) may accurately coincides with a true valley position P8. Therefore, even if the bit count tracking is used in the search range (v) in lieu of the syndrome tracking, an optimal valley position may be accurately detected.

According to the first modification example of the second embodiment, in the lower-page tracking of the fine tracking, the semiconductor storage device 20 generates only the separated data ERsd based on the test reading for the lower page and the normal reading for the lower page. Then, the semiconductor storage device 20 generates the separated data ARsn and ERsn based on loop processes for the lower-page shift reading. The controller 10 calculates a bit count based on the separated data ERsn. In addition, the controller 10 generates the integrated data ARsn/ERsd based on the separated data ARsn and ERsd. The controller 10 calculates the number of syndrome NGs based on the generated integrated data ARsn/ERsd and in the ECC circuit 13. Therefore, the controller 10 may perform the syndrome tracking only in the search range (i) and perform the bit count tracking in the search range (v). As a result, an optimal valley position may be accurately detected while minimizing the load on the controller 10.

2.5 Second Modification Example of Second Embodiment

Next, a second modification example of the second embodiment will be described. In the second modification example of the second embodiment, a modification of further enhancing the detection accuracy of a valley position is applied to the first modification example of the second embodiment. Specifically, the second modification example differs from the first modification example of the second embodiment in that a provisional valley position detected in coarse tracking is applied to separated data that are positioned in an "E" level side and used for integrated data in syndrome tracking in the search range (i). In the following description, differences from the first modification example of the second embodiment example will be described, and a redundant description will be omitted.

FIG. 42 is a flowchart of a lower-page tracking operation in the fine tracking of the semiconductor storage device according to the second modification example of the second embodiment. FIG. 42 corresponds to FIG. 40 according to the first modification example of the second embodiment.

As illustrated in FIG. 42, steps ST111 to ST112 are similar to steps ST91 to ST92 in FIG. 40, and therefore will not be described.

In step ST113, the controller 10 issues a lower-page shift reading command which applies the read voltage ERdef2 of the provisional valley position of the "E" level detected in the coarse tracking. Specifically, the controller 10 issues the lower-page shift reading command so that the read voltages of the lower page become the voltages ARdef and ERdef2.

In step ST114, the semiconductor storage device 20 executes the lower-page shift reading and reads the data ARd/ERd2. The semiconductor storage device 20 holds read data ARd/ERd2 in a latch (for example, the latch BDL).

In step ST115, the semiconductor storage device 20 generates only separated data ERsd2 based on an operation on the read data TL and ARd/ERd2 held in the latches. Then, the semiconductor storage device 20 transmits the separated data ERsd2 to the controller 10. Step ST115 differs from step ST95 in FIG. 40 in that the separated data ERsd2 is generated in lieu of the separated data ERsd.

In step ST116, the controller 10 initializes loop processes to be executed in the following steps ST117 to ST124 (n=0).

Steps ST117 to ST120 are similar to steps ST97 to ST100 in FIG. 40, and therefore explanation is omitted for simplicity.

In step ST121, the controller 10 generates integrated data ARsn/ERsd2 by performing an operation using the separated data ERsd2 and ARsn.

In step ST122, the controller 10 calculates the number of syndrome NGs based on the integrated data ARsn/ERsd2.

Steps ST123 to ST124 are similar to steps ST103 to ST104 in FIG. 40, and therefore explanation is omitted.

According to the second modification example of the second embodiment, the syndrome tracking may be executed in the search range (i) in a state where the number of syndrome NGs is further reduced.

As described above, since a syndrome is obtained by performing a logical operation with the parity check matrix, the size of the syndrome depends on the size of the parity check matrix. That is, the number of syndrome NGs has an upper limit value corresponding to the size of the parity check matrix. Therefore, in a case where the number of error bits is excessively large, the number of syndrome NGs correlating with the number of error bits is saturated in a state where the number of error syndromes reaches the upper limit value. If the number of syndrome NGs reaches the upper limit value, even if the read voltage is shifted, the number of syndrome NGs does not change and remains to be the upper limit value. Therefore, it may not be determined which is a read voltage that reduces the number of error bits. As described above, in a case where the number of error bits is excessively large, the syndrome tracking may be less appropriate.

Figure 43:
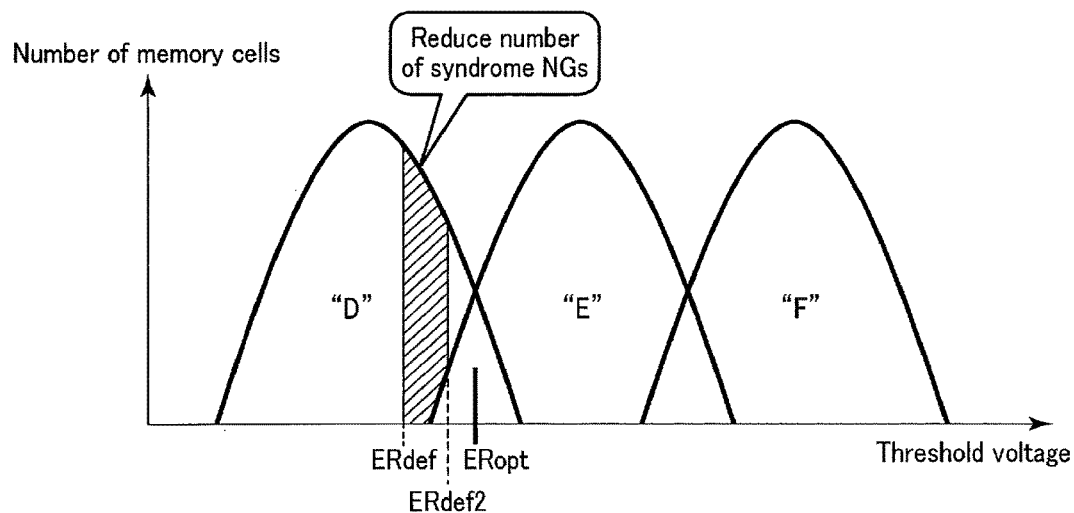
FIG. 43 shows characteristics of the semiconductor storage device according to the second modification example of the second embodiment.

FIG. 43 illustrates the relationship between the threshold voltage distributions of the memory cell transistor MT and the read voltages. As illustrated in FIG. 43, prior to the tracking, the controller 10 executes a read operation using the predetermined read voltage ERdef. Then, the controller 10 performs a coarse tracking operation and detects the read voltage ERdef2 corresponding to a provisional valley position. The voltage ERdef2 is closer to the optimal read voltage ERopt than the voltage ERdef is. That is, the number of error bits of the read data at the voltage ERdef2 is smaller than that of the read data at the voltage ERdef. More specifically, the integrated data ARsn/ERsd2 has fewer error bits than the integrated data ARsn/ERsd has by as many as the number of memory cells in a hatched area illustrated in FIG. 43.

According to the second modification example of the second embodiment, in the lower-page tracking for the fine tracking, the semiconductor storage device 20 generates only the separated data ERsd2 based on the test reading for the lower page and the lower-page shift reading. Then, the semiconductor storage device 20 generates the separated data ARsn and ERsn based on loop processes for the lower-page shift reading. The controller 10 calculates a bit count based on the separated data ERsn. In addition, the controller 10 generates the integrated data ARsn/ERsd2 based on the separated data ARsn and ERsd2. The controller 10 calculates the number of syndrome NGs based on the generated integrated data ARsn/ERsd2 in the ECC circuit 13. As described above, the integrated data ARsn/ERsd2 has a smaller number of error bits than the integrated data ARsn/ERsd has. Therefore, even in a case where with respect to the integrated data ARsn/ERsd, the number of syndrome NGs reaches the upper limit value, relying on the integrated data ARsn/ERsd2, the number of syndrome NGs may be reduced to the extent that the number of syndrome NGs does not reach the upper limit value. Therefore, it is more likely that an optimal valley position may be detected.

2.6 Third Modification Example of Second Embodiment

Next, a third modification example of the second embodiment will be described. In a semiconductor storage device according to the third modification example of the second embodiment, a modification of further enhancing the detection accuracy of a valley position is applied to the second modification example of the second embodiment. Specifically, the third modification example differs from the second modification example of the second embodiment in that an optimal valley position detected in the fine tracking is applied for separated data that are positioned in the "E" level side and used for generation of integrated data. In the following description, differences from the second modification example of the second embodiment will be described, and a redundant description will be omitted.

FIGS. 44 and 45 are flowcharts of a lower-page tracking operation in the fine tracking of the semiconductor storage device according to the third modification example of the second embodiment. FIGS. 44 and 45 correspond to FIG. 42 according to the second modification example of the second embodiment.

As illustrated in FIG. 44, steps ST131 to ST132 are similar to steps ST111 to ST112 in FIG. 42, and therefore explanation is omitted for simplicity.

In step ST133, the controller 10 initializes a loop process to be executed in the following steps ST134 to ST139 (n=0).

In step ST134, the controller 10 issues a shift reading command for a lower page to the semiconductor storage device 20.

In step ST135, the semiconductor storage device 20 executes the shift reading for the lower page, and in a (n+1)th loop process, reads the data ARn/ERn (AR0/ER0, AR1/ER1, . . . , ARN/ERN). The semiconductor storage device 20 holds the read data ARn/ERn in a latch (for example, the latch BDL).

In step ST136, the semiconductor storage device 20 generates the separated data ERsn (ERs0, ERs1, . . . , ERsn) based an operation on the read data TL and ARn/ERn held in the latches. Then, the semiconductor storage device 20 transmits the separated data ERsn to the controller 10.

In step ST137, the controller 10 calculates a bit count based on the separated data ERsn.

In step ST138, the controller 10 determines whether or not to continue the loop processes. Specifically, in a case where the value n is not equal to the value N (step ST138; No), the process proceeds to step ST139 where the loop count is incremented, and then the process returns to step ST134. In addition, in a case where the value n is equal to the value N (step ST138; Yes), the process proceeds to step ST140.

In step ST140, the controller 10 executes the bit count tracking based on the bit counts obtained based on the separated data ERsn. As a result of the bit count tracking, the controller 10 detects the read voltage ERopt at the optimal valley position for the "E" level.

As illustrated in FIG. 45, in step 141, the controller 10 initializes loop processes to be executed in the following steps ST142 to ST146 (n=0).

In step ST142, the controller 10 issues a lower-page shift reading command which applies the read voltage ERopt detected in step ST140. Specifically, in an (n+1)th loop, the controller 10 issues the lower-page shift reading command so that the read voltages for the lower page are set to the voltages ARn and ERopt.

In step ST143, the semiconductor storage device 20 executes the lower-page shift reading, and in the (n+1)th loop processes, reads data ARn/ERopt (AR0/ERopt, AR1/ERopt, . . . , ARN/ERopt). The semiconductor storage device 20 transmits the read data ARn/ERopt to the controller 10.

In step ST144, the controller 10 calculates the number of syndrome NGs based on the read data ARn/ERopt.

In step ST145, the controller 10 determines whether or not to continue the loop processes. Specifically, in a case where the value n is not equal to the value N (step ST145; No), the process proceeds to step ST146 where the loop count is incremented, and then the process returns to step ST142. In addition, in a case where the value n is equal to the value N (step ST145; Yes), the lower-page tracking in the fine tracking ends.

According to the third modification example of the second embodiment, the syndrome tracking in the search range (i) is executed in a state where the number of syndrome NGs is further reduced.

FIG. 46 shows the relationship between the threshold voltage distributions of the memory cell transistor MT and the read voltages. As shown in FIG. 46, prior to the tracking, the controller 10 executes a read operation using the predetermined read voltage ERdef. The controller 10 detects a read voltage ERdef2 corresponding to a provisional valley position in the coarse tracking operation. Then, the controller 10 detects the read voltage ERopt corresponding to the optimal valley position between the "D" level and the "E" level in the fine tracking within the search range (v). The number of error bits of the read data at the voltage ERopt is smaller than that of the read data at the voltage ERdef2. More specifically, the integrated data ARsn/ERopt has fewer error bits than the integrated data ARsn/ERsd2 by as many as the number of memory cells in a hatched area illustrated in FIG. 46.

According to the third modification example of the second embodiment, for the lower-page tracking in the fine tracking, the semiconductor storage device 20 executes the loop processes of the lower-page shift readings for the search range (v) before the loop processes of the lower-page shift readings for the search range (i). In the loop processes of the lower-page shift readings for the search range (v), the controller 10 detects in advance the read voltage ERopt corresponding to the optimal valley position. In the loop processes of the lower-page shift reading for the search range (i), the semiconductor storage device 20 executes the lower-page shift reading to which the read voltage ERopt is applied and reads the data ARn/ERopt. The controller 10 calculates the number of syndrome NGs in the ECC circuit 13, based on the read data ARn/ERopt. As described above, the integrated data ARsn/ERopt has fewer error bits than the integrated data ARsn/ERsd2 has. Therefore, even in the event that the number of syndrome NGs for the integrated data ARsn/ERsd2 reaches the upper limit value, the number of syndrome NGs may be reduced in the integrated data ARsn/ERopt to the extent that the number of syndrome NGs does not reach the upper limit value. Therefore, the likelihood that an optimal valley position may be detected is increased.

2.7 Fourth Modification Example of Second Embodiment

Next, a fourth modification example of the second embodiment will be described. In the semiconductor storage device according to the fourth modification example of the second embodiment, a modification of further enhancing the detection accuracy of a valley position is applied to the third modification example of the second embodiment. Specifically, the fourth modification example of the second embodiment is similar to the third modification example of the second embodiment in that the data which is used to calculate the number of syndrome NGs is data read by applying the voltage ERopt. However, the fourth modification example of the second embodiment differs from the third modification example of the second embodiment in that data read by applying the voltage ERopt in a certain loop is also applied to other loops. In the following description, differences from the third modification example of the second embodiment will be described, and a redundant description will be omitted.

Figure 47:
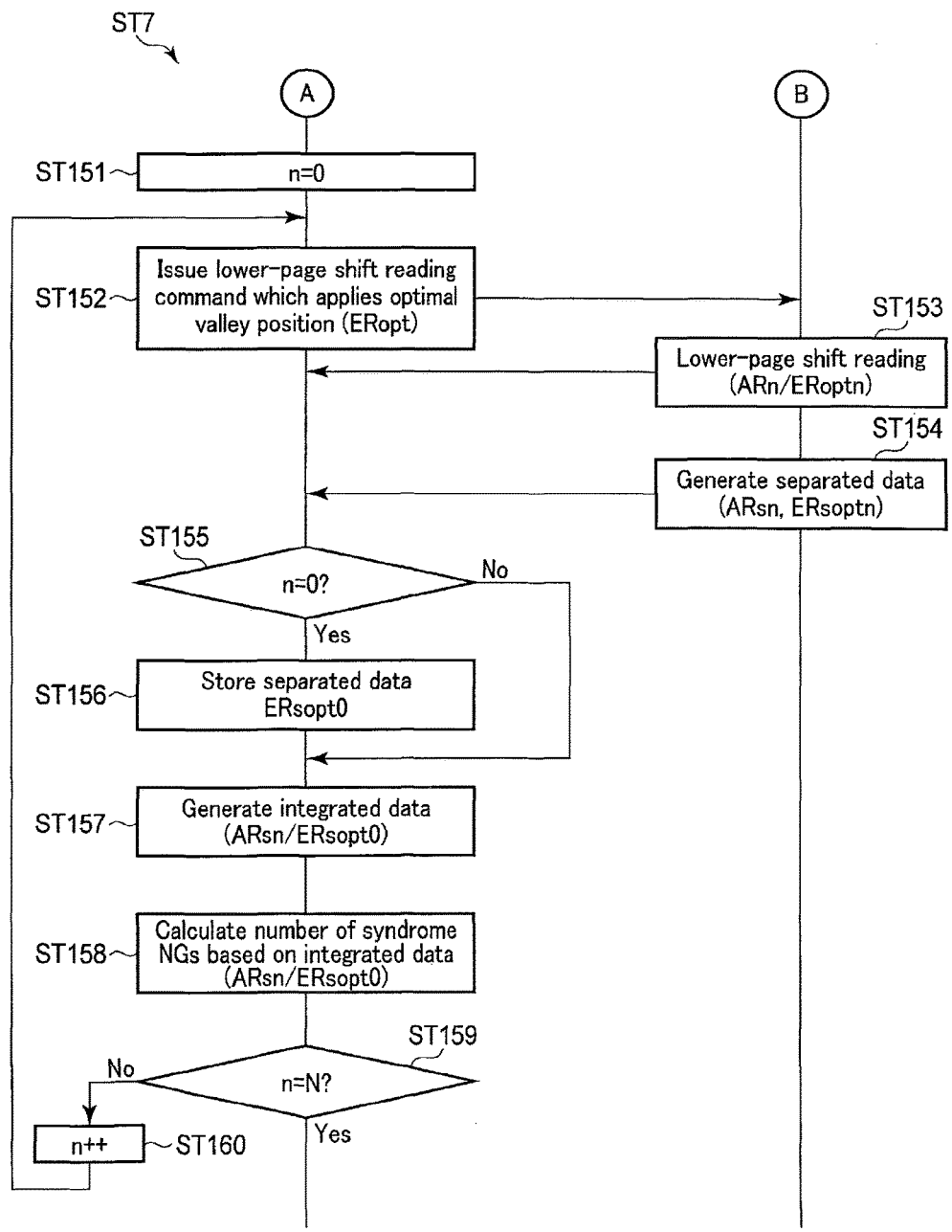
FIG. 47 is a flowchart of a lower-page tracking operation in fine tracking of a semiconductor storage device according to a fourth modification example of the second embodiment.

FIG. 47 is a flowchart of a lower-page tracking operation for the fine tracking of the semiconductor storage device according to the fourth modification example of the second embodiment. FIG. 47 corresponds to FIG. 45 according to the third modification example of the second embodiment. In addition, the fourth modification example of the second embodiment is similar to the third modification example of the second embodiment regarding operations corresponding to FIG. 44 according to the third modification example of the second embodiment. Therefore, a description of the operations will be omitted.

As shown in FIG. 47, in step ST151, the controller 10 initializes loop processes to be executed in the following steps ST152 to ST160 (n=0).

In step ST152, the controller 10 issues a lower-page shift reading command which applies the read voltage ERopt detected in step ST140. Specifically, the controller 10 issues the lower-page shift reading command in an (n+1)th loop so that the read voltages for the lower page are set to the voltages ARn and ERopt.

In step ST153, the semiconductor storage device 20 executes the lower-page shift reading, and in the (n+1)th loop processes, reads data ARn/ERoptn (AR0/ERopt1, AR1/ERopt2, . . . , ARN/ERoptN). In each of the read data ARn/ERoptn, the voltage ERopt is applied as the read voltage in the "E" level side. However, the read data in the "E" level side in the different (n+1) loop processes are not necessarily exact matches for each other. In order to represent separately in terms of the above differences, a suffix "n" which indicates the loop count is appended to the read data ARn/ERopt for the sake of convenience.

In step ST154, the semiconductor storage device 20 generates the separated data ARsn (ARs0, ARs1, . . . , ARsN) and the ERsoptn (ERsopt0, ERsopt1, . . . , ERsoptN) based on the read data TL and the ARn/ERoptn held in the latches. Then, the semiconductor storage device 20 transmits the separated data ARsn and ERsoptn to the controller 10.

In step ST155, the controller 10 determines whether or not the loop count indicates a first loop (n=0). When the loop count indicates the first loop (step ST155; Yes), the process proceeds to step ST156. If the loop count indicates other than the first loop (step ST155; No), the controller 10 proceeds to step ST157.

In step ST156, the controller 10 stores the separated data ERsopt0 obtained in the first loop process. Note that the separated data ERsopt0 is used in loop processes that is not the first loop process.

In step ST157, the controller 10 generates integrated data ARsn/ERsopt0 by performing an operation using the separated data ARsn and the separated data ERsopt0 obtained in the first loop process.

In step ST158, the controller 10 calculates the number of syndrome NGs based on the integrated data ARsn/ERsopt0.

In step ST159, the controller 10 determines whether or not to continue the loop processes. Specifically, in a case where the value n is not equal to the value N (step ST159; No), the process proceeds to step ST160 where the loop count is incremented, and then the process returns to step ST152. In addition, in a case where the value n is equal to the value N (step ST159; Yes), the lower-page tracking operation in the fine tracking ends.

According to the fourth modification example of the second embodiment, the magnitude of the displacements of the numbers of syndrome NGs from the true value may be reduced.

Figure 48:
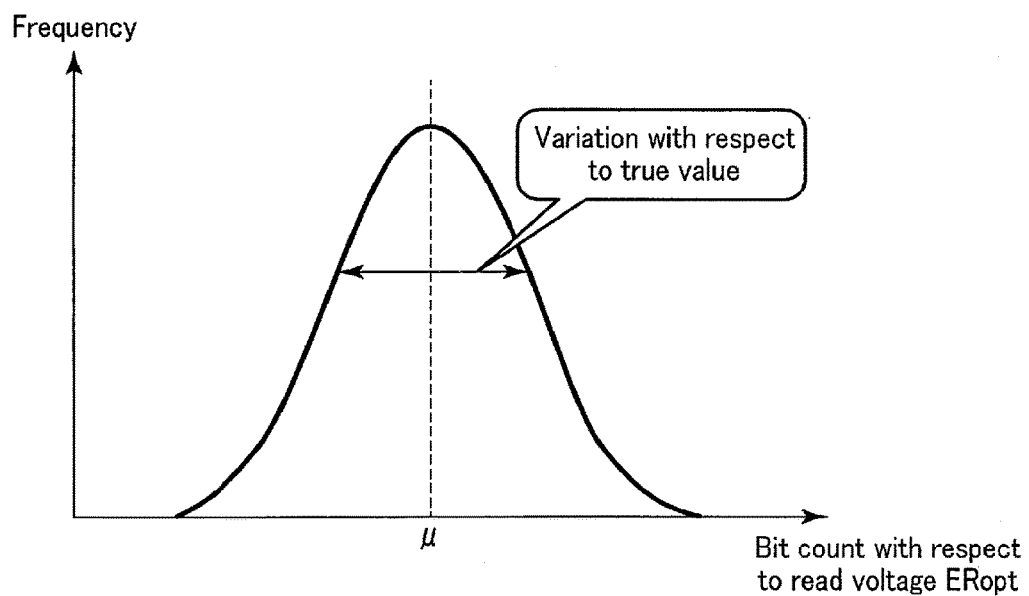
FIG. 48 shows characteristics of the semiconductor storage device according to the fourth modification example of the second embodiment.

FIG. 48 shows a state where the bit counts fluctuate when a plurality of read operations are performed at a certain read voltage. In the example of FIG. 48, in a case where the read voltage ERopt is applied, the bit counts of read data fluctuate in a certain range having a center at a certain value μ estimated to be a true value. As described, in actual read operations, even in a case where same read voltages are applied for pages in a same written state, the bit counts of the read data may fluctuate within a certain range (hereinafter such a fluctuation is referred to as "noise"). That is, also in the loop processes for the shift reading in the fine tracking, even if the same read voltages ERopt are applied in all the loops, the bit counts of the read data with the voltages ERopt may fluctuate in every loop.

According to the fourth modification example of the second embodiment, in the lower-page tracking of the fine tracking, the semiconductor storage device 20 executes the loop processes for the lower-page shift reading in the search range (v) before the loop processes of the lower-page shift reading in the search range (i). In the loop processes for the lower-page shift reading in the search range (v), the controller 10 detects in advance the read voltage ERopt corresponding to the optimal valley position. In the loop processes of the lower-page shift reading in the search range (i), the semiconductor storage device 20 executes the lower-page shift reading which applies the read voltage ERopt and reads the data ARn/ERoptn. In addition, the semiconductor storage device 20 generates the separated data ARsn and ERsoptn. The controller 10 stores the separated data ERsopt0 in the first loop. Then, in an nth loop, the controller 10 generates the integrated data ARsn/ERsopt0 and then, calculates the number of syndrome NGs based on the integrated data ARsn/ERsopt0. Thus, in all the loops, the results of the read data based on the voltage ERopt are normalized with respect to the result obtained in the first loop. Therefore, the magnitude of the displacement with respect to the true value generated in each loop may become equal in all the loops, and the detection accuracy of the valley position is improved. Therefore, the likelihood that an optimal valley position may be detected is increased.

3. Third Embodiment

Next, a semiconductor storage device according to a third embodiment will be described. The semiconductor storage devices according to the first embodiment and the second embodiment execute the tracking operation in units of pages. In contrast, the semiconductor storage device according to the third embodiment executes the tracking operation in units of clusters. In the following, components like those in the second embodiment are denoted by like reference numerals and will not be described, and differences from the second embodiment will be described.

3.1 Cluster

First, an outline of a cluster in the semiconductor storage device according to the third embodiment will be described. FIG. 49 is a schematic diagram illustrating a conceptual configuration of a cluster in the semiconductor storage device according to the third embodiment.

As illustrated in FIG. 49, data for one page to be read from the semiconductor storage device 20 is divided into, for example, four clusters (cluster [0], cluster [1], cluster [2], and cluster [3]). Each cluster may include data and parity, and may be a minimum unit for which the ECC process performed by the ECC circuit 13 is executed. Note that FIG. 49 only shows that read data for one page is divided into four clusters, and may not indicate that data in one cluster is data from continuous columns.

The controller 10 stores in advance which of the clusters each bit in the read data for one page belongs to. That is, in a case of executing the ECC process on read data for one page, the ECC circuit 13 divides the read data into clusters based on the correspondence between each bit in the data and any of the clusters, and executes the ECC process for each cluster. Then, the ECC circuit 13 determines for each cluster whether the ECC process is passed or failed.

3.2 Tracking Operation

Next, the tracking operation of the semiconductor storage device according to the third embodiment will be described. FIG. 50 is a flowchart the tracking operation of the semiconductor storage device according to the third embodiment.

As illustrated in FIG. 50, in step ST201, the controller 10 issues to the semiconductor storage device 20 a normal reading command which applies a predetermined read voltage VCGRVdef.

In step ST202, the semiconductor storage device 20 executes the normal reading and transmits read data to the controller 10.

In step ST203, the ECC circuit 13 executes the ECC for each cluster based on data read in the normal reading. In a case where the read data in the normal reading passes the ECC (step ST203; pass) in all the clusters, the controller 10 proceeds to step ST214. In a case where the read data fails the ECC in at least one of the clusters (step ST203; fail), the controller 10 proceeds to step ST204.

In step ST204, the controller 10 and the semiconductor storage device 20 execute the tracking operation. The tracking operation in step ST204 includes the fine tracking. Specifically, for example, in step ST204, the controller 10 may perform the fine tracking based on the bit count tracking described in the first embodiment, or may perform the fine tracking based on the syndrome tracking described in the second embodiment. Note that the tracking operation in step ST204 is not limited to the above examples, and any tracking operation may be applied. In any case, for read data of one page, the controller 10 and the semiconductor storage device 20 execute an operation for generating parameters for enabling detection of optimal valley positions, such as the amounts of bit count changes or the number of syndrome NGs.

In step ST205, the controller 10 processes the parameters obtained in step ST205 for each cluster. Then, the controller 10 detects the optimal valley positions for each cluster.

In step ST206, the controller 10 initializes loop processes to be executed in the following steps ST207 to ST213 (k=0, where k may be an integer of 0<k 3).

In step ST207, the controller 10 issues a shift reading command for the cluster [k] to the semiconductor storage device 20. Here, the shift reading command for the cluster [k] includes a value ΔDAC[k] for shifting the read voltages to the optimal valley positions for the cluster[k] detected in step ST205.

In step ST208, the semiconductor storage device 20 executes the shift reading for the cluster [k] and reads data R[k] optimized for the cluster [k].

In step ST209, the ECC circuit 13 executes the ECC on the cluster [k] in the read data R[k]. In a case where the cluster [k] of the read data R[k] passes the ECC (step ST209; pass), the controller 10 proceeds to step ST211. In a case where the cluster [k] fails the ECC (step ST209; fail), the controller 10 proceeds to step ST210.

In step ST210, the controller 10 determines that the data of the cluster [k] cannot be corrected. In step ST211, the controller 10 determines that the data of the cluster [k] has been corrected.

In step ST212, the controller 10 determines whether or not to continue the loop processes. Specifically, in a case where the value k is not equal to 3 (step ST221; No), the process proceeds to step ST213 where the loop count is incremented, and then returns to step ST207. In addition, in a case where the value k is equal to 3 (step ST221; Yes), the operation ends.

Note that in a case where same values are detected as read voltages corresponding to optimal valley positions for different clusters in step ST205, steps ST207 to ST213 may be omitted. Specifically, for example, in a case where same valley positions are detected for the cluster [0] and the cluster [1], steps ST207 and ST208 for the cluster [0] and the cluster [1] may be executed once rather than twice. In steps ST209 to ST211, the ECC circuit 13 executes the ECC for each of the clusters [0] and [1].

Consequently, the tracking operation ends.

3.3 Effect According to Third Embodiment

Data is read in units of pages. Therefore, in general, the tracking operation is also performed for every page. However, the optimal read voltages obtained for each page are average values of the optimal read voltages for all the memory cell transistors MT in that page, and the optimal read voltages may not necessarily be optimal read voltages for all the memory cell transistors MT. Specifically, for example, in a case where threshold voltages fluctuate depending on each cluster, data can be, read more accurately at the optimal read voltages obtained for each of the clusters than at the optimal read voltages obtained for one page.

According to the third embodiment, the controller 10 processes the results of the tracking operation for every cluster. As a result of the processes, the controller 10 detects optimal valley positions for every cluster. The semiconductor storage device 20 executes the shift reading to which read voltages optimized for each cluster are applied, and reads the data R[k]. The controller 10 sequentially executes the ECC processes on optimized portions of the read data R[k] for each cluster. Therefore, data may be read based on the read voltages optimized for each cluster. Therefore, data may be read more accurately.

3.4 Modification of Third Embodiment

Note that the semiconductor storage device according to the third embodiment is not limited to the example described above, and various modifications are available. For example, to a cluster which failed in the ECC process, the detection result of the optimal valley positions in another cluster which passed the ECC process may be applied.

Figure 51:
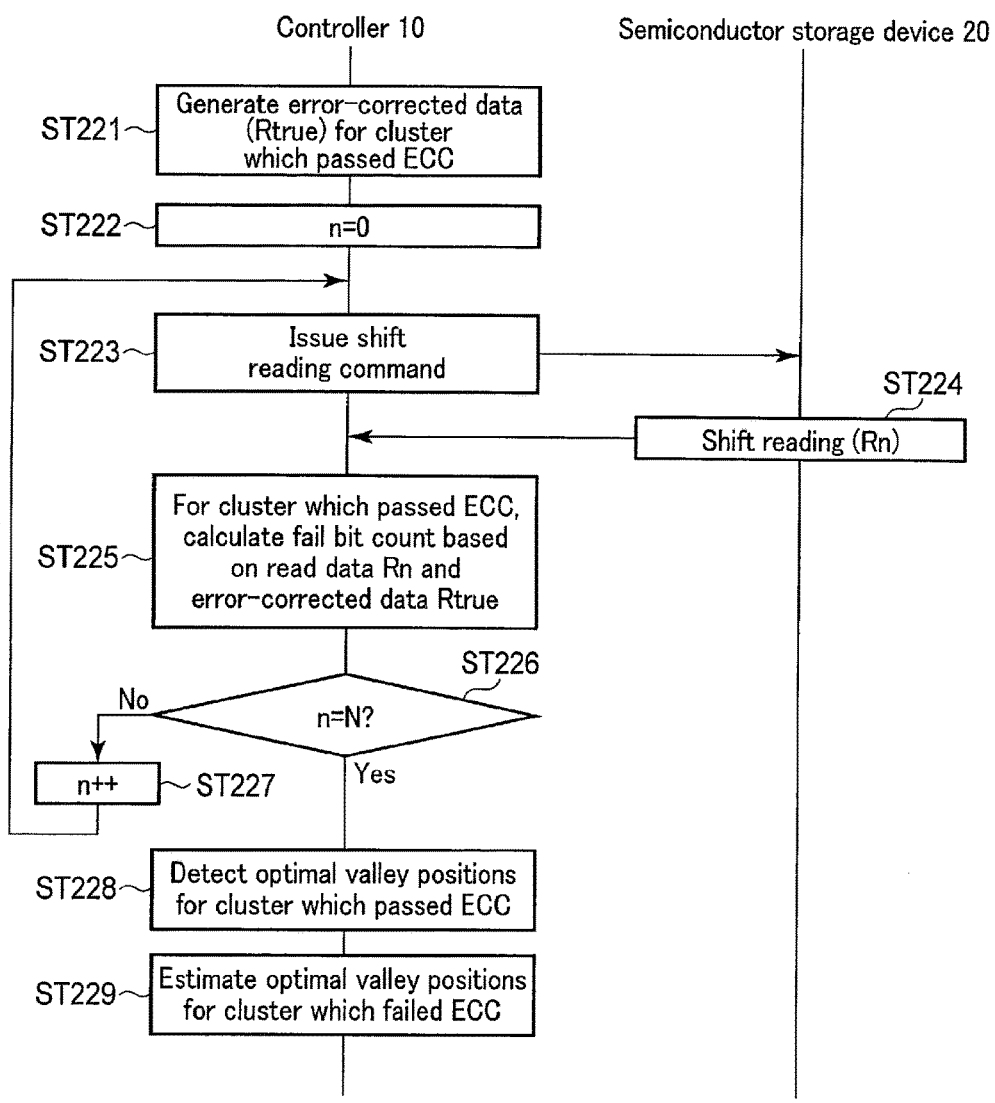
FIG. 51 is a flowchart of a tracking operation of a semiconductor storage device according to a modification example of the third embodiment.

FIG. 51 is a flowchart the details of the tracking operation of the semiconductor storage device according to a modification example of the third embodiment. FIG. 51 is part of FIG. 50 and corresponds to steps ST204 and ST205 in FIG. 50. That is, while the tracking operation of this modification of the third embodiment is shown in FIGS. 50 and 51, FIG. 50 will not be described here since the portion illustrated in FIG. 50 is similar to the corresponding portion in the third embodiment. Only FIG. 51 will be described. Note that in FIG. 51, as an example, a case is illustrated where a certain cluster failed in the ECC process and the other clusters passed the ECC process in step ST203.

As illustrated in FIG. 51, in step ST221, the controller 10 recognizes that a certain cluster failed in the ECC process and the other clusters passed the ECC process via the result of step ST203 in FIG. 50. The controller 10 may perform error correction on clusters which passed ECC process and generate error-corrected data Rtrue. That is, the error-corrected data Rtrue is not generated for the cluster which failed in the ECC process.

In step ST222, the controller 10 initializes loop processes to be executed in the following steps ST223 to ST228 (n=0).

In step ST223, the controller 10 issues a shift reading command in a (n+1)th loop to the semiconductor storage device 20.

In step ST224, the semiconductor storage device 20 executes the shift reading in the (n+1)th loop and reads data Rn in the (n+1)th loop. The semiconductor storage device 20 transmits the read data Rn to the controller 10.

In step ST225, the controller 10 calculates a fail bit count based on the read data Rn and the error-corrected data Rtrue for each cluster which passed the ECC process. Specifically, for example, the controller 10 calculates the fail bit count by performing an exclusive-or operation (XOR) on the error-corrected data Rtrue and the read data Rn.

In step ST226, the controller 10 determines whether or not to continue the loop processes. Specifically, in a case where the value n is not equal to a value N (step ST226; No), the process proceeds to step ST227 where the loop count is incremented, and then the process returns to step ST223. In addition, in a case where the value n is equal to the value N (step ST226; Yes), the process proceeds to step ST228.

In step ST228, the controller 10 detects optimal valley positions for each cluster which passed the ECC process, based on the fail bit count obtained in each loop for each cluster which passed the ECC process. For example, at two consecutive points where fail bit counts are smallest, the controller 10 may detect the fail bit counts, and detect the median value of the voltages corresponding to the two points as an optimal valley position.

In step ST229, the controller 10 estimates the optimal valley positions for a cluster which failed in the ECC process, based on the optimal valley positions detected for the clusters that passed the ECC process. Specifically, for example, the controller 10 estimates that the average values of the optimal valley positions in the clusters that passed the ECC process are the optimal valley positions in the cluster which failed in the ECC. In addition, the present invention is not limited to the above example. For example, the controller 10 may estimate that a most accurate value from among the optimal valley positions of the clusters that passed the ECC process may be the optimal valley positions of the cluster which failed in the ECC process.

In the subsequent operations, a read operation is performed by applying the read voltages corresponding to the optimal valley positions to the cluster which failed in the ECC process.

According to the modification example of the third embodiment, it is possible to estimate the optimal valley positions more accurately for the cluster which failed in the ECC process. This effect will be described below.

In the semiconductor storage device according to the third embodiment, as an example, a case where the optimal valley positions for each cluster may be detected by the bit count tracking has been described. However, in the bit count tracking, in a case where detection accuracy of the valley positions may be low, data may not be read correctly. In addition, in the semiconductor storage device according to the third embodiment, the tracking is performed even for a single cluster which failed in the ECC process. Therefore, in terms of accuracy, it is likely not to detect the optimal valley positions for a cluster which failed in the ECC process.

FIG. 52 illustrates a change in the fail bit counts for each read voltage in a case where a BCH code having a fixed number of correctable bits is used in the ECC process. A graph at the top of FIG. 52 shows a change in the fail bit counts at the read voltages for a cluster which passed ECC in normal reading. A graph at the bottom of FIG. 52 shows a change in the fail bit counts for the read voltages for a cluster which failed in the ECC in normal reading.

As illustrated in the graph at the top of FIG. 52, the fail bit count which allows the ECC process to correct an error is limited. Therefore, when the ECC process is performed on read data at a read voltage lower than a voltage V6 or a read voltage higher than a voltage V10, the ECC process is ineffective and the fail bit count may not be calculated. However, for example, for a cluster which passes ECC in the normal reading, when a voltage V7 is applied as a read voltage, the cluster passes that ECC and a fail bit count M7 is obtained. At read voltages V6 to V10 in a case where read voltages are shifted by a certain shift amount in a certain range around the voltage V7, fail bit counts M6 to M10 are also obtained based on comparison between read data and error-corrected data.

In contrast, as illustrated in the graph at the bottom of FIG. 52, in a certain cluster, a range of read voltages at which clusters may pass the ECC may be significantly limited. In this case, when the voltage V7 is applied as the read voltage in the normal reading, the ECC is inefficient and the fail bit count cannot be obtained. In addition, in a case where the range of read voltages at which ECC is passed is smaller than the above-described certain shift amount, even when the read voltage is shifted by the certain shift amount in a range around the voltage V7, the ECC process is inefficient and the fail bit count cannot be obtained.

Here, for example, in a cluster for which fail bit counts can be obtained, an intermediate value between the voltage V8 and the voltage V9 is set as an optimal read voltage V11 based on the fail bit counts M8 and M9. Then, even in a cluster for which a fail bit count may not have been obtained, a fail bit count M11 may be obtained in the ECC process using the BCH code.

Note that if the searchable range in the graph at the bottom of FIG. 52 includes the voltages V8 and V9, a read voltage at which the ECC is passed may be detected by executing the ECC process every time the shift reading is performed. However, in terms of reduction of load on the controller 10, executing the ECC process every time the shift reading is performed is not so preferable.

In the modification example of the third embodiment, the semiconductor storage device 20 executes loop processes for the shift reading in a case where there is a cluster which failed in the ECC in the normal reading. The controller 10 calculates a fail bit count in each loop for clusters other than a cluster which failed in the ECC in the normal reading. A fail bit count may be obtained without executing the ECC process for each loop. Based on the obtained fail bit counts, the controller 10 detects optimal valley positions for clusters other than the cluster which failed in the ECC in the normal reading. The controller 10 applies, to the cluster which failed in the ECC in the normal reading, the optimum valley positions detected for the cluster other than the cluster which failed in the ECC in the normal reading. Therefore, even in the event of ECC failure, valley positions, which are more accurate than valley positions detected using bit count tracking, may be detected using fail bit counts. Therefore, data may be read more accurately.

4. Fourth Embodiment

Next, a semiconductor storage device according to a fourth embodiment will be described. The semiconductor storage devices according to the first embodiment and the second embodiment execute the tracking operation in units of pages and the semiconductor storage device according to the third embodiment executes the tracking operation in units of clusters. In contrast, the semiconductor storage device according to the fourth embodiment executes the tracking operation in units of I/O groups. In the following, components like those in the third embodiment are denoted by like reference numerals and will not be described, and only differences from the third embodiment will be described.

4.1 Configuration of Memory Cell Array

The configuration of the memory cell array in the semiconductor storage device according to the fourth embodiment will be described. FIG. 53 is a top view illustrating the configuration of the memory cell array in the semiconductor storage device according to the fourth embodiment. FIG. 53 corresponds to the configuration of the memory cell array illustrated in FIG. 4.

As illustrated in FIG. 53, string units SU0 and SU1, an insulating region 46, and slit regions 47 extend along the X direction, for example. The string units SU0 and SU1 interpose the insulating region 46 in the Y direction, and the slit regions 47 interpose the string units SU0 and SU1 and the insulating region 46 in the Y direction.

In each of the string unit SU0 and SU1, a laminated structure in which wiring layers 31, 32, and 33 and insulating films are alternately provided extends on the XY plane, and a plurality of NAND strings NS are provided in the laminated structure. The NAND strings NS are provided in, for example, four rows in a staggered manner on the XY plane. One bit line BL is connected to one NAND string NS. Specifically, bit lines BL0 to BL7 are connected to NAND strings NS0 to NS7 via contact plugs 38, respectively.

Each bit line BL extends in the Y direction, for example. In the example of FIG. 53, since the NAND strings NS are arranged in four rows in a staggered manner, for example, two bit lines BL pass over each NAND string NS. The contact plug 38 is provided so that a NAND string NS is connected to one bit line BL of the two bit lines BL that corresponds to the NAND string NS. Note that the number of bit lines BL passing over a NAND string NS is not limited to two, and may be any number.

As described above, the NAND string NS connected to a certain bit line BL is associated with any one of the signals I/O <7:0>. In FIG. 53, for example, the NAND strings NS0, NS4, NS8, and NS12 communicate a specific signal I/O of the signals I/O <7:0> via a certain set of signal lines. That is, the NAND strings NS0, NS4, NS8, and NS12, . . . are grouped into an I/O group [0]. Similarly, NAND strings NS2, NS6, NS10, and NS14, . . . are grouped into an I/O group [1], NAND strings NS1, NS5, NS9, and NS13, . . . are grouped into an I/O group [2], and NAND strings NS3, NS7, NS11, and NS15, . . . are grouped into an I/O group [3]. Each I/O group is associated with, for example, two of signals I/O <7:0>.

In the example of FIG. 53, the I/O group [0] includes a set of NAND strings NS closest to the slit region 47. The I/O groups [1] and [2] include sets of NAND strings NSs second and third closest to the slit region 47, respectively. The I/O group [3] includes a set of NAND strings NS farthest from the slit region 47 and closest to the insulating region 46.

In addition, in the example illustrated in FIG. 53, each of the I/O group [0] to the I/O group [3] constitutes one row of NAND strings NS arranged in four rows in a staggered manner. That is, the NAND strings NS of the I/O group [0] are arranged in a row along the X direction, and the NAND strings NS of the I/O group [1] are arranged along the X direction in a row different from the row of the I/O group [0]. The same applies to the I/O group [2] and the I/O group [3].

4.2 Tracking Operation

Next, the tracking operation of the semiconductor storage device according to the fourth embodiment will be described. FIG. 54 is a flowchart of the tracking operation of the semiconductor storage device according to the fourth embodiment.

As illustrated in FIG. 54, in step ST241, a controller 10 issues to the semiconductor storage device 20 a normal reading command which applies a predetermined read voltage VCGRVdef.

In step ST242, the semiconductor storage device 20 executes the normal reading and transmits read data to the controller 10.

In step ST243, the ECC circuit 13 executes the ECC based on the read data obtained in the normal reading. When the read data in the normal reading passes the ECC (step ST243; pass), the controller 10 proceeds to step ST253, and if the read data fails in the ECC (step ST243; fail), the controller 10 proceeds to step ST244.

In step ST244, the controller 10 and the semiconductor storage device 20 execute that tracking operation. Specifically, for example, in step ST244, the controller 10 may execute the fine tracking based on the bit count tracking described in the first embodiment. Note that the tracking operation in step ST244 is not limited to the above example, and any tracking operation may be applied. In any case, the controller 10 and the semiconductor storage device 20 execute an operation for generating parameters for enabling detection of optimal valley positions, such as the amounts of bit count changes, for the read data for one page.

In step ST245, the controller 10 processes the parameters obtained in step ST245 for each I/O group. Then, the controller 10 detects optimal valley positions for each I/O group.

In step ST246, the controller 10 initializes loop processes to be executed in the following steps ST247 to ST250 (j=0, where j may be an integer of 0≤j≤3).

In step ST247, the controller 10 issues a shift reading command for the I/O group [j] to the semiconductor storage device 20. Here, the shift reading command for the I/O group [j] includes a value ΔDAC[j] for shifting the read voltages to optimal valley positions detected in step ST245 for the I/O group [j].

In step ST248, the semiconductor storage device 20 executes the shift reading for the I/O group [j] and reads data R[j] optimized for the I/O group [j].

In step ST249, it is determined whether or not to continue the loop processes. Specifically, in a case where a value j is not equal to 3 (step ST249; No), the process proceeds to step ST250 where the loop count is incremented, and then returns to step ST247. If the value j is equal to 3 (step ST249; Yes), the process proceeds to step ST251.

Note that in a case where same values are detected as read voltages corresponding to optimal valley positions for different I/O groups in step ST245, steps ST247 to ST250 may be omitted. Specifically, for example, in a case where same valley positions are detected for the I/O groups [0] and [1], steps ST247 to ST250 for the I/O groups [0] and [1] may be executed once rather than twice.

In step ST251, the controller 10 integrates read data R[0] to R[3] optimized respectively for the I/O groups [0] to [3]. Specifically, in the read data R[0] to R[3], the controller 10 extracts only optimized portions, and integrates the optimized portions. More specifically, the controller 10 extracts data in the portion corresponding to the I/O group [0] in the read data R[0], in the portion corresponding to the I/O group [1] in the read data R[1], in the portion corresponding to the I/O group [2] in the read data R[2], and in the portion corresponding to the I/O group [3] in the read data R[3]. Then, the controller 10 integrates the extracted data in those portions corresponding to the respective I/O groups and integrates them into data for one page.

In step ST252, the ECC circuit 13 executes the ECC based on the integrated data. In a case where the integrated data passes the ECC (step ST252; pass), the controller 10 proceeds to step ST253. In a case where the integrated data fails in the ECC (step ST252; fail), the controller 10 proceeds to step ST254.

In step ST253, the controller 10 acquires a "pass in ECC" status and ends the operation. In step ST254, the controller 10 determines that the data is not corrected based on the ECC result, and ends the operation.

Consequently, the tracking operation ends.

4.3 Effect of Fourth Embodiment

Read data is transmitted to the controller 10 as one of the signals I/O <7:0>. In contrast, the NAND strings NS belonging to one of signal I/O groups may be arranged at particular locations. The NAND strings NS arranged at the particular location may have threshold-voltage properties depending on the particular arrangement locations. Therefore, NAND strings NS belonging to a certain I/O group may have a particular threshold-voltage property. That is, the threshold voltages may vary depending on the I/O groups.

In such a case, the optimal read voltages obtained in units of pages are not always optimal read voltages for all the memory cell transistors MT. Specifically, data may be read more accurately at the optimal read voltages obtained in units of I/O groups than at the optimal read voltages obtained in units of pages.

According to the fourth embodiment, the controller 10 processes the tracking-operation result for every I/O group. As the results of the process, the controller 10 detects optimum valley positions for each I/O group. The semiconductor storage device 20 executes the shift reading which applies the read voltages optimized for each I/O group, and reads the data R[j]. The controller 10 integrates portions of the read data R[j] optimized for each I/O group, and executes the ECC process on the integrated data. Therefore, read data may be generated based on the read voltages optimized for each I/O group. Therefore, data may be read more accurately.

5. Other Modifications and the Like

The embodiments are not limited to the embodiments described in the first to fourth embodiments, and various modifications may be applied. In the above-described first and second embodiments, the semiconductor storage device 20 generates the separated data by an operation; however, the present invention is not limited to this, and the controller 10 may generate the separated data. In addition, in the second embodiment, the controller 10 generates the integrated data; however, the present invention is not limited to this, and the semiconductor storage device 20 may generate the integrated data.

In addition, for each of the above-described embodiments, a case where 3 bits may be held in one memory cell transistor MT (triple level cell: TLC) is described herein; however, the present invention is not limited to this. For example, the memory cell transistor MT may hold 2 bits (multi level cell: MLC), or may hold 4 bits or more.

In addition, the following matters are applicable in each of the embodiments and modifications.

In a multi-level read operation (read), a voltage applied to a word line selected in a read operation of A-level is, for example, 0 V to 0.55 V. The voltage is not limited to this, and may be 0.1 V to 0.24 V, 0.21 V to 0.31 V, 0.31 V to 0.4 V, 0.4 V to 0.5 V, or 0.5 V to 0.55 V.

A voltage applied to a word line selected in a read operation of B-level is, for example, 1.5 V to 2.3 V. The voltage is not limited to this, and may be 1.75 V to 1.8 V, 1.8 V to 1.95 V, 1.95 V to 2.1 V, or 2.1 V to 2.3 V.

A voltage applied to a word line selected in a read operation of C-level is, for example, 3.0 V to 4.0 V. The voltage is not limited to this, and may be 3.0 V to 3.2 V, 3.2 V to 3.4 V, 3.4 V to 3.5 V, 3.5 V to 3.7 V, or 3.7 V to 4.0 V.

The time (tR) of the read operation can be, for example, 25 μs to 38 μs, 38 μs to 70 μs, or 70 μs to 80 μs.

A write operation includes a program operation and a verify operation. In the write operation, a voltage first applied to a selected word line at the time of the program operation is, for example, 13.7 V to 14.3 V. The voltage is not limited to this, and may be, for example, 13.7 V to 14.0 V or 14.0 V to 14.7 V.

A voltage first applied to a selected word line when writing to an odd-numbered word line and a voltage first applied to a selected word line when writing to an even-numbered word line may be different.

When the program operation is performed by the ISPP (Incremental Step Pulse Program) method, a step-up voltage is, for example, about 0.5 V.

The voltage applied to an unselected word line may be, for example, 7.0 V to 7.3 V. The voltage is not limited to this, and may be, for example, 7.3 V to 8.4 V, or 7.0 V or less.

The pass voltage to be applied may be changed depending on whether the unselected word line is an odd-numbered word line or an even-numbered word line.

The time (tProg) of the write operation can be, for example, 1,700 μs to 1,800 μs, 1,800 μs to 1,900 μs, or 1,900 μs to 2,000 μs.

In an erase operation, a voltage first applied to a well formed in the upper portion of the semiconductor substrate and having a memory cell arranged above is, for example, 12 V to 13.7 V. The voltage is not limited to this, and may be, for example, 13.7 V to 14.8 V, 14.8 V to 19.0 V, 19.0 V to 19.8 V, 19.8 V to 21 V.

The time (tErase) of the erase operation can be, for example, 3,000 μs to 4,000 μs, 4,000 μs to 5,000 μs, or 4,000 μs to 9,000 μs.

A memory cell includes a charge accumulation layer arranged on a 4 to 10 nm thick tunnel insulating film on the semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material to adjust the work function of the insulating film. The material for work function adjustment is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

Note that some or all of the above embodiments may also be described as the following supplementary notes, but are not limited to the following.

[Supplementary Note 1]

A semiconductor storage device including:

a first memory cell and a second memory cell;

a first transistor which is located between the first memory cell and a first bit line, a second transistor which is located between the second memory cell and a second bit line and includes a gate that is coupled to a gate of the first transistor;

a word line which is coupled to the gate of the first memory cell and the gate of the second memory cell; and a control unit which performs:

a first operation of reading data from the first memory cell and the second memory cell as a voltage applied to the word line is changed by a first shift amount within a first range, a second operation of applying a first voltage within the first range to the word line and reading data from the first memory cell, and a third operation of applying a second voltage different from the first voltage within the first range to the word line and reading data from the second memory cell, wherein the first and second voltages are applied to the word line in the second operation and the third operation immediately after the voltage is applied in the first operation.

[Supplementary Note 2]

A memory system including:

the semiconductor storage device according to supplementary note 1; and a controller which instructs the semiconductor storage device to perform the first operation, the second operation, and the third operation, wherein the semiconductor storage device further includes a cell unit that includes a first set of memory cells including the first memory cell and a second set of memory cells including the second memory cell, wherein the control unit reads data from the cell unit in the first operation, the second operation, and the third operation, and wherein the controller:

determines the first voltage based on data read from the first set of memory cells in the first operation, and determines the second voltage based on data read from the second set of memory cells in the first operation, and gives an instruction to perform the second operation for which the first voltage that is determined is specified, and gives an instruction to perform the third operation for which the second voltage that is determined is specified.

[Supplementary Note 3]

A memory system including:

a semiconductor storage device according to supplementary note 2; and a controller which instructs the semiconductor storage device to perform the first operation, the second operation, and the third operation, wherein the controller is capable of performing an error correction process separately on data corresponding to the first set of memory cells and data corresponding to the second set of memory cells, included in data read from the first set of memory cells and data read from the second set of memory cells, and when an error correction process is passed, the error correction process being performed on data corresponding to the first set of memory cells, included in data read from the first set of memory cells and the second set of memory cells before the first operation, and an error correction process is failed, the error correction process being performed on data corresponding to the second set of memory cells, included in the data read from the first set of memory cells and the second set of memory cells before the first operation, the controller determines the first voltage and the second voltage based on data read from the first set of memory cells in the first operation.

[Supplementary Note 4]

The memory system according to supplementary note 2, wherein the first set of memory cells is arranged in a first row along a first direction, and the second set of memory cells is arranged in a second row different from the first row along the first direction.

[Supplementary Note 5]

The memory system according to supplementary note 2, wherein the first set of memory cells are connected to the controller via a set of first signal lines, and the second set of memory cells are connected to the controller via a set of second signal lines different from the set of first signal lines.

What is claimed is:

1. A semiconductor storage device comprising:
a memory cell;
a word line which is coupled to the memory cell; and
a control circuitry, the control circuitry performing:
a first operation of reading data out of the memory cell with a first voltage applied to the word line while changing the first voltage by a first shift amount within a first range, and
a second operation of reading data out of the memory cell with a second voltage applied to the word line while changing the second voltage by a second shift amount within a second range,
wherein the second shift amount is smaller than the first shift amount, and
wherein the control circuitry performs the second operation to apply the second voltage to the word line subsequently to application of the first voltage to the word line in the first operation.

2. The device of claim 1, wherein the second range is included in the first range and is narrower than the first range.

3. The device of claim 2, wherein
the memory cell stores data including a first bit and a second bit, and
the control circuitry reads the first bit from among the first bit and the second bit from the memory cell in the first operation.

4. The device of claim 2, wherein
the memory cell stores data including a first bit and a second bit, and
the control circuitry reads the first bit and the second bit from the memory cell in the first operation.

5. The device of claim 2, wherein
the memory cell stores data including a first bit and a second bit, and
the control circuitry reads the first bit and the second bit from the memory cell in the second operation.

6. The device of claim 2, wherein
the first range includes a third range and a fourth range which are discontinuous to each other,
the control circuitry applies the first voltage within the third range and the second voltage within the fourth range to the word line and reads data from the memory cell in a first read operation of the first operation, and
the control circuitry repeatedly executes the first read operation, while changing each of the first voltage and the second voltage by the first shift amount as the first read operation is performed.

7. The device of claim 6, wherein the control circuitry applies a third voltage, which is a voltage between the third range and the fourth range, to the word line and reads data from the memory cell in a second read operation further included in the first operation.

8. The device of claim 7, wherein the first range further includes a fifth range and a sixth range which are different from the third range and the fourth range and are discontinuous to each other,
the control circuitry applies a fourth voltage within the fifth range and a fifth voltage within the sixth range to the word line and reads data from the memory cell in a third operation further included in the first operation, and
the control circuitry repeatedly executes the third read operation, while changing each of the fourth voltage and the fifth voltage by the first shift amount as the third read operation is performed.

9. The device of claim 8, wherein the control circuitry applies a sixth voltage, which is a voltage between the fifth range and the sixth range, to the word line and reads data from the memory cell in a fourth read operation further included in the first operation.

10. The device of claim 2, wherein
the first range includes a third range, a fourth range, and a fifth range which are discontinuous to one another,
the control circuitry applies the first voltage within the third range, the second voltage within the fourth range, and a third voltage within the fifth range to the word line and reads data from the memory cell in a first read operation included in the first operation, and
the control circuitry repeatedly executes the first read operation, while changing each of the first voltage, the second voltage, and the third voltage by the first shift amount as the first read operation is performed.

11. The device of claim 10, wherein the control circuitry applies a fourth voltage, which is a voltage between the third range and the fourth range, to the word line and reads data from the memory cell in a second read operation included in the first operation; and
the control circuitry applies a fifth voltage, which is a voltage between the fourth range and the fifth range, to the word line and reads data from the memory cell in a third read operation included in the first operation.

12. The device of claim 7 further comprising a cell unit that includes the memory cell, and
wherein the control circuitry:
reads data from the cell unit in the first operation, the first read operation, and the second read operation, and
outputs a first result of an operation based on data read in the first read operation and the second read operation.

13. A memory system comprising:
the device of claim 12; and
a controller which instructs the semiconductor storage device to perform the first operation and the second operation, and
wherein the controller determines the second range based on the first result of the operation, and instructs the semiconductor storage device to perform the second operation for which the determined second range is specified.

14. The system of claim 13, wherein
the second range includes a fifth range and a sixth range which are discontinuous to each other,
the semiconductor storage device applies a fourth voltage within the fifth range and a fifth voltage within the sixth range to the word line and reads data from the memory cell in a third operation included in the second operation, and
the control circuitry repeatedly executes the third read operation, while changing each of the fourth voltage and the fifth voltage by the second shift amount as the third read operation is performed.

15. The system of claim 14, wherein the semiconductor storage device applies a sixth voltage, which is a voltage between the fifth range and the sixth range, to the word line and reads data from the memory cell in a fourth read operation further included in the second operation.

16. The system of claim 15, wherein
the control circuitry reads data from the cell unit in the second operation, the third read operation, and the fourth read operation, and output a second result of an operation based on the data read in the third read operation and the fourth read operation.

17. The system of claim 15, wherein the semiconductor storage device applies a seventh voltage within the fifth range and an eighth voltage within the sixth range to the word line and reads data from the memory cell in a fifth read operation further included in the second operation, and
the control circuitry reads data from the cell unit in the second operation, the third read operation, the fourth read operation and the fifth read operation, and output a second result of an operation based on the data read in the third read operation, the fourth read operation, and the fifth read operation.

18. The system of claim 17, wherein the controller determines the eighth voltage based on the first result of the operation, and instructs the semiconductor storage device to perform the fifth read operation for which the determined eighth voltage is specified.

19. The system of claim 17, wherein
the semiconductor storage device applies the fourth voltage and a ninth voltage within the sixth range to the word line and reads data from the memory cell in a sixth read operation further included in the second operation, and
the control circuitry reads data from the cell unit in the sixth read operation, and repeatedly execute the sixth read operation, while simultaneously fixing the ninth voltage and changing the fourth voltage by the second shift amount, and
the controller determines the ninth voltage based on the second result of the operation, and instructs the semiconductor storage device to perform the sixth read operation for which the determined ninth voltage is specified.

* * * * *